(12) United States Patent
Yamauchi

(10) Patent No.: US 12,543,469 B2
(45) Date of Patent: Feb. 3, 2026

(54) LENS-CONTAINING COLOR FILTER FOR DISPLAY DEVICES

(71) Applicant: TOPPAN Inc., Taito-ku (JP)

(72) Inventor: Atsushi Yamauchi, Taito-ku (JP)

(73) Assignee: TOPPAN Inc., Taito-ku (JP)

( * ) Notice: Subject to any disclaimer, the term of this patent is extended or adjusted under 35 U.S.C. 154(b) by 424 days.

(21) Appl. No.: 18/090,620

(22) Filed: Dec. 29, 2022

(65) Prior Publication Data
US 2023/0135035 A1    May 4, 2023

Related U.S. Application Data

(63) Continuation of application No. PCT/JP2021/024348, filed on Jun. 28, 2021.

(30) Foreign Application Priority Data

Jun. 29, 2020   (JP) .................................. 2020-111962
Jun. 29, 2020   (JP) .................................. 2020-111963

(51) Int. Cl.
*H10K 59/38*    (2023.01)
*H10K 59/35*    (2023.01)
*H10K 59/80*    (2023.01)

(52) U.S. Cl.
CPC ........... *H10K 59/38* (2023.02); *H10K 59/353* (2023.02); *H10K 59/879* (2023.02); *H10K 59/8791* (2023.02); *H10K 59/873* (2023.02)

(58) Field of Classification Search
CPC .... H10K 59/38; H10K 59/353; H10K 59/879; H10K 59/8791
See application file for complete search history.

(56) References Cited

U.S. PATENT DOCUMENTS

| 9,112,183 B2 * | 8/2015 | Ohta ..................... H10K 59/879 |
| 11,769,773 B2 * | 9/2023 | Matsusaki .............. H10D 86/40 257/40 |

(Continued)

FOREIGN PATENT DOCUMENTS

| CN | 108665862 A | 10/2018 |
| JP | 11-74072 | 3/1999 |

(Continued)

OTHER PUBLICATIONS

Search Report issued Aug. 10, 2021 in International Application No. PCT/JP2021/024348 filed Jun. 28, 2021, 7 pages (with English Translation).

(Continued)

*Primary Examiner* — Nduka E Ojeh
(74) *Attorney, Agent, or Firm* — Oblon, McClelland, Maier & Neustadt, L.L.P.

(57) ABSTRACT

A color filter including sub-pixels having transmission wavelength ranges different from each other in a region forming a unit pixel for color display, and lenses facing respective ones of the sub-pixels and configured to condense light passing through the sub-pixels. At least one of the sub-pixels is an elongated pixel whose ratio of a length in a longitudinal direction to a length in a lateral direction is larger than 1 when viewed in a thickness direction in which the light passes through the sub-pixels, and at least two of the lenses that condense the light passing through the elongated pixel are positioned in the longitudinal direction.

13 Claims, 27 Drawing Sheets

(56) References Cited

U.S. PATENT DOCUMENTS

| | | | |
|---|---|---|---|
| 2008/0157247 A1* | 7/2008 | Yun | H10F 39/024 |
| | | | 257/E31.127 |
| 2008/0309224 A1 | 12/2008 | Kwak et al. | |
| 2011/0057210 A1 | 3/2011 | Sonoda et al. | |
| 2012/0217521 A1* | 8/2012 | Ohta | H10K 59/879 |
| | | | 257/89 |
| 2013/0224897 A1 | 8/2013 | Ishioka | |
| 2014/0027725 A1 | 1/2014 | Lim et al. | |
| 2016/0043145 A1 | 2/2016 | Choi et al. | |
| 2019/0273122 A1* | 9/2019 | Iwasaki | H10K 50/841 |
| 2019/0363107 A1* | 11/2019 | Matsusaki | G02B 5/20 |
| 2021/0057678 A1 | 2/2021 | Motoyama et al. | |
| 2021/0211564 A1 | 7/2021 | Liu et al. | |
| 2021/0398264 A1 | 12/2021 | Daisuke et al. | |
| 2021/0399264 A1* | 12/2021 | Ueda | H10K 59/879 |
| 2023/0189543 A1* | 6/2023 | Sudo | H10K 50/131 |
| | | | 257/40 |
| 2023/0269993 A1* | 8/2023 | Sekine | H10K 50/858 |
| | | | 257/40 |

FOREIGN PATENT DOCUMENTS

| | | |
|---|---|---|
| JP | 11-142835 | 6/1999 |
| JP | 2004-127862 A | 4/2004 |
| JP | 2010-231010 A | 10/2010 |
| JP | 2011-060611 A | 3/2011 |
| JP | 2014-002880 A | 1/2014 |
| JP | 2019-133816 A | 8/2019 |
| JP | 2020-013695 A | 1/2020 |
| KR | 10-2016-0017397 A | 2/2016 |
| WO | WO 2020/080022 A1 | 4/2020 |

OTHER PUBLICATIONS

European Partial Search Report issued Dec. 7, 2023 in European Application No. 21832912.6, 14 pgs.

European Search Report issued Mar. 11, 2024 in European Application No. 21832912.6, 15 pgs.

* cited by examiner

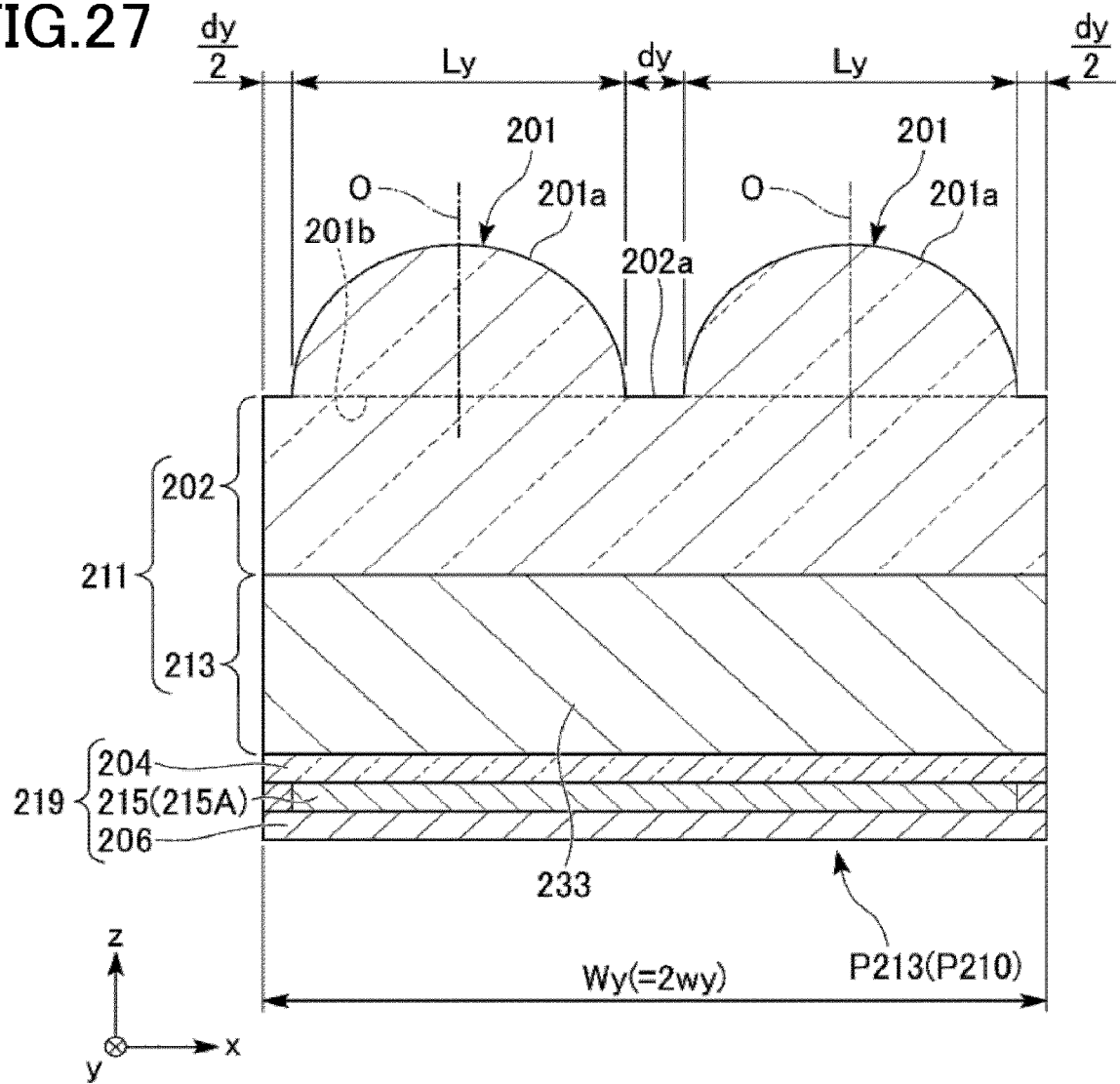

LENS-CONTAINING COLOR FILTER FOR DISPLAY DEVICES

CROSS-REFERENCE TO RELATED APPLICATIONS

The present application is a continuation of International Application No. PCT/JP2021/024348, filed Jun. 28, 2021, which is based upon and claims the benefits of priority to Japanese Application No. 2020-111962, filed Jun. 29, 2020, and Japanese Application No. 2020-111963, filed Jun. 29, 2020. The entire contents of all of the above applications are incorporated herein by reference.

BACKGROUND OF THE INVENTION

Field of the Invention

The present invention relates to color filters and display devices.

Discussion of the Background

In a display device such as an organic electroluminescent (EL) display device, for example, a configuration is known in which a plurality of organic EL elements that generate white light are disposed in each pixel region which performs a color display, and color filters and lenses are disposed above the respective organic EL elements.

For example, PTL 1 discloses an organic EL display device in which three organic EL elements that generate white light are disposed in each pixel region, and color filters respectively transmitting red (R) light, green (G) light and blue (B) light are disposed on the respective organic EL elements, and lenses are disposed on the respective color filters.

For example, PTL 2 discloses a display device in which light emitting elements are disposed in each pixel region, the light emitting elements including a concave-shaped organic layer that generates white light, and color filters respectively transmitting R, G and B light are disposed on the respective light emitting elements, and lenses are disposed on the respective color filters.

PTL 1: JP 2014-2880 A
PTL 2: JP 2019-133816 A

SUMMARY OF THE INVENTION

According to an aspect of the present invention, a color filter including sub-pixels having transmission wavelength ranges different from each other in a region forming a unit pixel for color display, and lenses facing respective ones of the sub-pixels and configured to condense light passing through the sub-pixels. At least one of the sub-pixels is an elongated pixel whose ratio of a length in a longitudinal direction to a length in a lateral direction is larger than 1 when viewed in a thickness direction in which the light passes through the sub-pixels, and at least two of the lenses configured to condense the light passing through the elongated pixel are positioned in the longitudinal direction.

According to another aspect of the present invention, a color filter including a first sub-pixel included in a plurality of sub-pixels forming a first unit pixel in a color display, the first sub-pixel having a first transmission wavelength range, a first lens facing the first sub-pixel in a thickness direction of the first sub-pixel, a second sub-pixel included in a plurality of sub-pixels forming the first unit pixel or a second unit pixel adjacent to the first unit pixel, the second sub-pixel having a thickness which is the same as a thickness of the first sub-pixel and a second transmission wavelength range different from the first transmission wavelength range, and being positioned adjacent to the first sub-pixel, a second lens facing the second sub-pixel in a thickness direction of the second sub-pixel, the second lens being positioned adjacent to the first lens in an adjacent direction in which the second sub-pixel is adjacent to the first sub-pixel, and a planarization layer formed between the first and second sub-pixels and the first and second lenses. Formulas (1) to (5) are satisfied:

$$T = t1 + t2 \tag{1}$$

$$w > T \tag{2}$$

$$d = 2 \times (w - T) \tag{3}$$

$$0.8 \times w \leq L < w \tag{4}$$

$$L = w - d \tag{5}$$

where t1 is a thickness of each of the first sub-pixel and the second sub-pixel, t2 is a thickness of the planarization layer, w is a width of each of the first sub-pixel and the second sub-pixel in the adjacent direction, L is a width of each of the first lens and the second lens in the adjacent direction, and d is a distance between the first lens and the second lens in the adjacent direction.

BRIEF DESCRIPTION OF THE DRAWINGS

A more complete appreciation of the invention and many of the attendant advantages thereof will be readily obtained as the same becomes better understood by reference to the following detailed description when considered in connection with the accompanying drawings, wherein:

FIG. 27 is a cross-sectional view taken along the line F210-F210 in FIG. 24.

DESCRIPTION OF THE EMBODIMENTS

Figure 1:
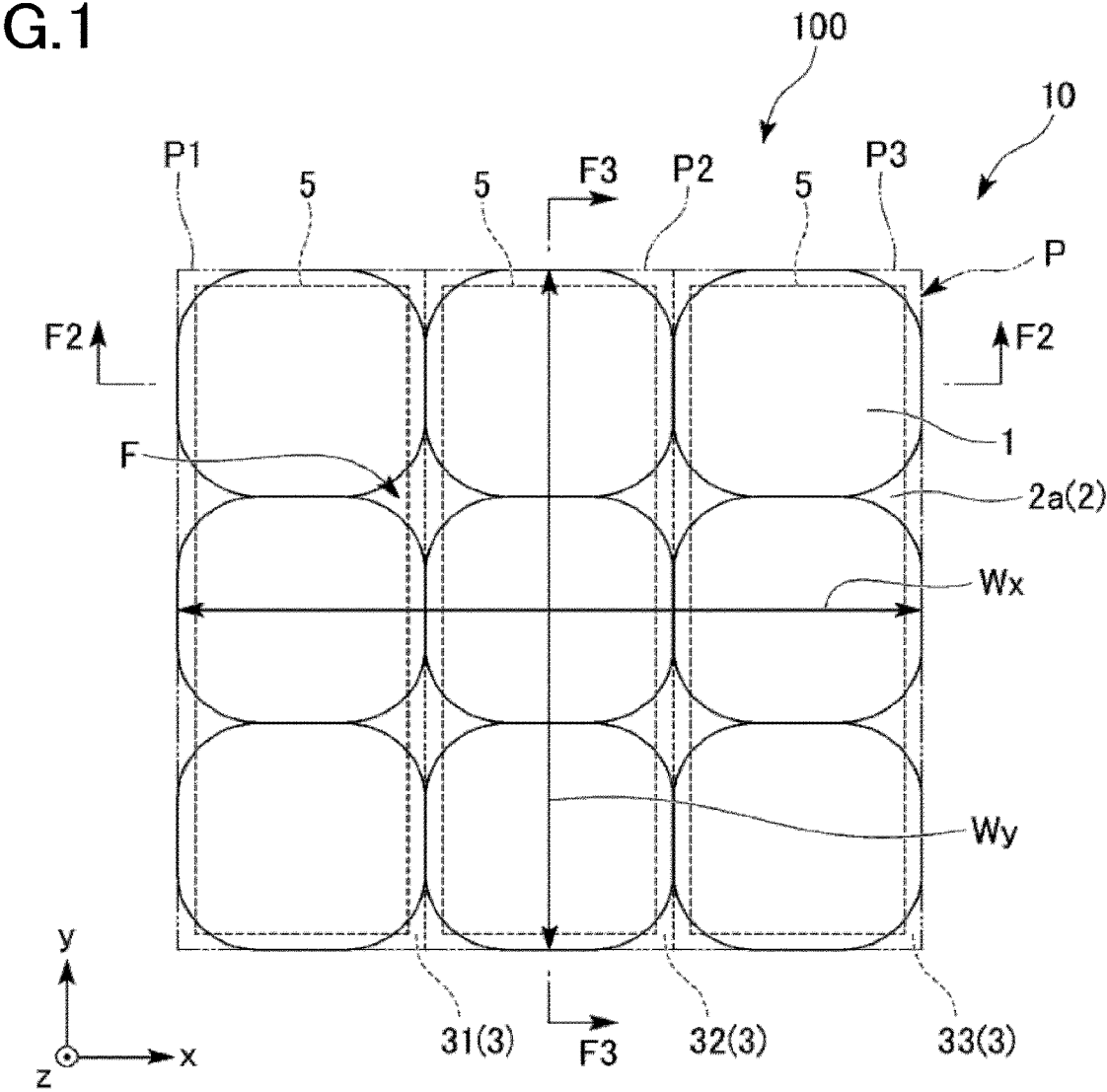
FIG. 1 is a schematic plan view illustrating an example of a display device according to a first embodiment of the present invention.

The embodiments will now be described with reference to the accompanying drawings, wherein like reference numerals designate corresponding or identical elements throughout the various drawings.

With reference to the drawings, some embodiments of the present invention will be described.

In the drawings used for the following description, the scale of the respective components is appropriately changed so that they are readily recognizable. The dimensions and proportions of the respective components are modified as appropriate. Throughout the drawings, the same reference signs are given to the same or corresponding components between different embodiments to omit duplicate description.

First Embodiment

A color filter and a display device according to a first embodiment of the present invention will be described.

FIG. 1 is a schematic plan view illustrating an example of a display device according to a first embodiment of the present invention.

Figure 2:
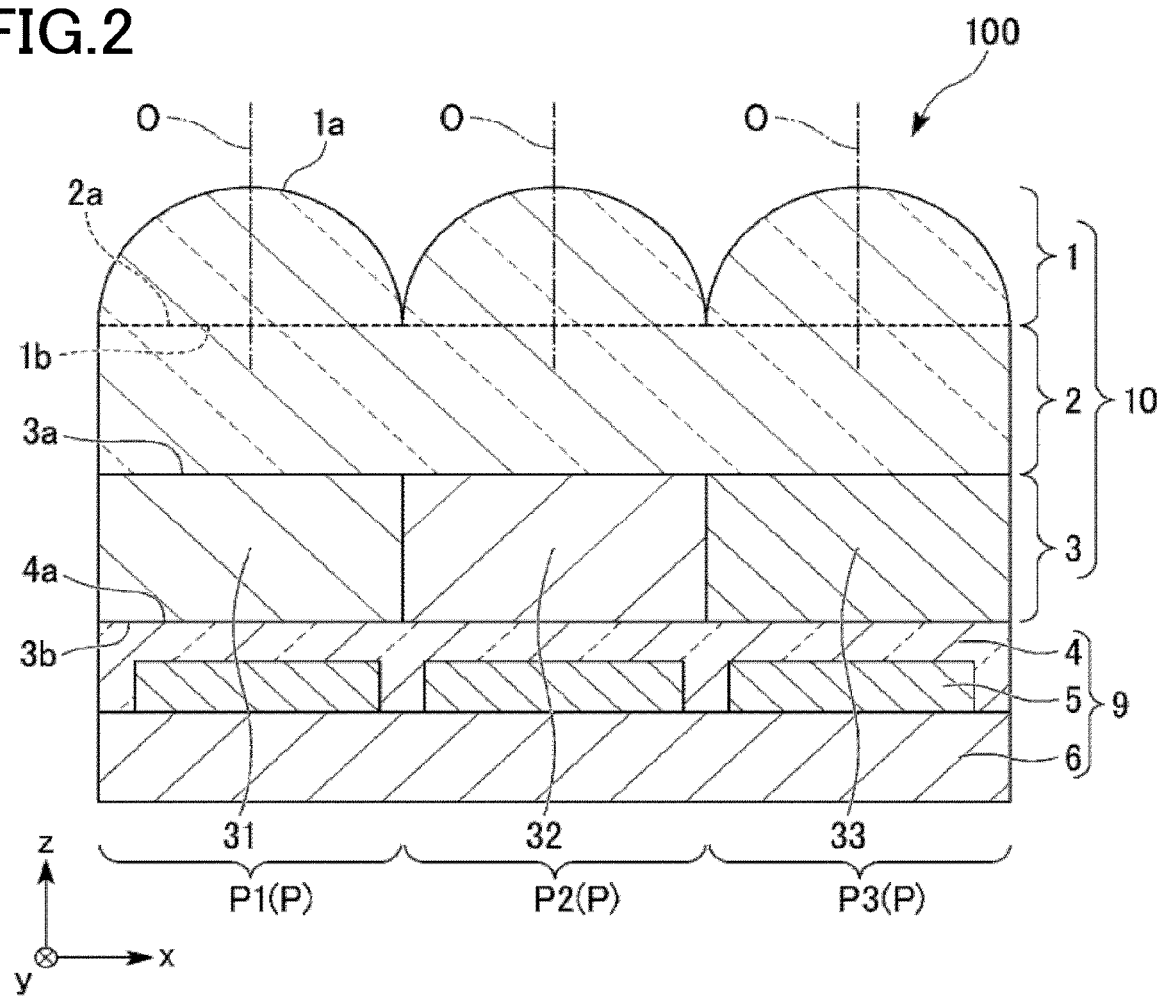
FIG. 2 is a cross-sectional view taken along the line F2-F2 in FIG. 1.
Figure 3:
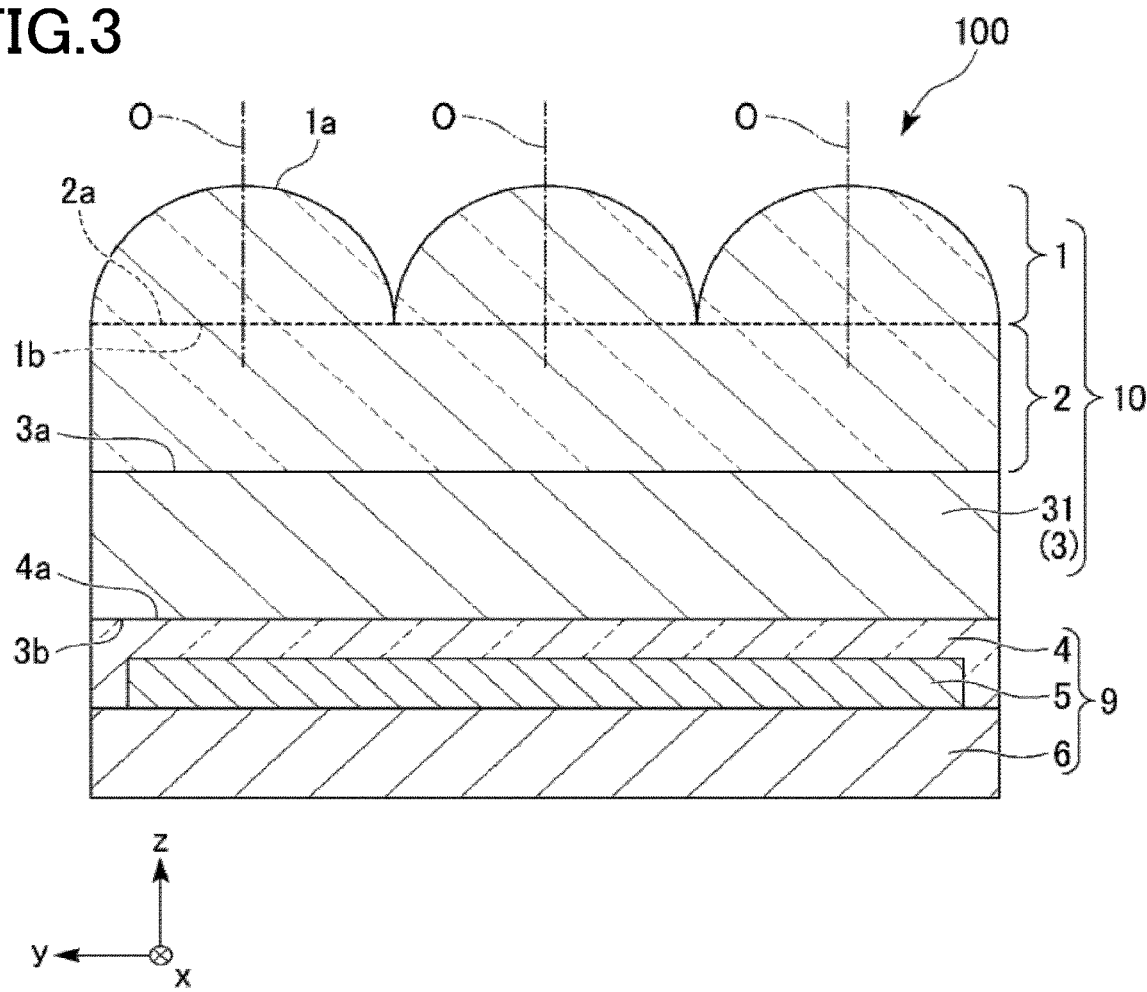
FIG. 3 is a cross-sectional view taken along the line F3-F3 in FIG. 1.

FIG. 2 is a cross-sectional view taken along the line F2-F2 in FIG. 1. FIG. 3 is a cross-sectional view taken along the line F3-F3 in FIG. 1.

An organic EL display device 100 (display device) shown in FIG. 1 displays a color image according to image signals. The application of the organic EL display device 100 is not specifically limited. For example, the organic EL display device 100 can be used as a display device for electronic devices such as smart glasses, head-mounted displays and electronic viewfinders.

FIG. 1 illustrates a configuration of a unit pixel P in plan view of the organic EL display device 100 of the first embodiment. The plan view herein refers to a view from a display screen of the organic EL display device 100 toward light emitting elements. The plan view also refers to a view in a thickness direction of a filter portion 3 (described later).

The unit pixel P is a minimum region that performs color display. For example, in the organic EL display device 100, a large number of unit pixels P shown in FIG. 1 are arranged side by side in the x direction from left to right and the y direction from bottom to top of the drawing. The z direction is a direction perpendicular to the x direction and the y direction and extends from the back to the front of the drawing. The z direction and the plan view direction are opposite directions.

The outer shape of the display screen formed of all the unit pixels P of the organic EL display device 100 is a rectangle having sides in the x and y directions. Each unit pixel P has a width Wx in the x direction and a width Wy in the y direction. Wx and Wy may be equal to or different from each other.

For simplicity of the description, the width in the x direction and the width of the y direction of a region, a member, or the like may be hereinafter referred to as an x width and a y width, respectively.

The unit pixel P includes a first sub-pixel region P1, a second sub-pixel region P2 and a third sub-pixel region P3. The first sub-pixel region P1, the second sub-pixel region P2 and the third sub-pixel region P3 are arranged in this order in the x direction. The first sub-pixel region P1, the second sub-pixel region P2 and the third sub-pixel region P3 trisect the unit pixel P in the x direction.

Since all the unit pixels P in the organic EL display device 100 have the same configuration, the following description will be given of a single unit pixel P as an example.

The first sub-pixel region P1 has a rectangular shape in plan view with an x width of Wx/3 and y width of Wy. The first sub-pixel region P1 may display red, for example.

The second sub-pixel region P2 has a rectangular shape in plan view with an x width of Wx/3 and y width of Wy. The second sub-pixel region P2 may display green, for example.

The third sub-pixel region P3 has a rectangular shape in plan view with an x width of Wx/3 and y width of Wy. The third sub-pixel region P3 may display blue, for example.

As shown in FIG. 2, the organic EL display device 100 includes a main body 9 and a color filter 10.

The main body 9 includes a substrate 6, light emitting elements 5 and a planarization film 4.

The shape of the substrate 6 in plan view is larger than the display screen of the organic EL display device 100. The substrate 6 may be made of, for example, a silicon substrate.

The light emitting elements 5 emit white light. For example, an organic EL element may be used as the light emitting element 5. When a DC voltage is applied across the anode and cathode of the organic EL element, electrons and holes are injected into a light-emitting layer and recombine to generate excitons. By using light emission caused by decay of the excitons, the organic EL element emits light.

The light emitting element 5 is provided in each of the first sub-pixel region P1, the second sub-pixel region P2 and the third sub-pixel region P3.

As shown in FIG. 1, each light emitting element 5 has a rectangular shape in plan view slightly smaller than the outer shape of each of the first sub-pixel region P1, the second sub-pixel region P2 and the third sub-pixel region P3 in which the light emitting element 5 is located.

In the example shown in FIG. 1, each light emitting element 5 has an x width slightly smaller than Wx/3 and a y width slightly smaller than Wy.

The light emitting element 5 is formed on a silicon substrate using, for example, a semiconductor manufacturing process.

The electrodes in each light emitting element 5 are connected to a drive circuit (not shown) through wiring formed on the substrate 6. The drive circuit controls turning on and off of the light emitting elements 5 according to image signals.

As shown in FIG. 2, the planarization film 4 covers at least the substrate 6 and the light emitting elements 5 of each unit pixel P to form a flat surface 4a on their surfaces in the z direction. The flat surface 4a is a plane extending over the entire display region of the organic EL display device 100.

The planarization film 4 covers the light emitting elements 5 to protect the light emitting elements 5. For example, the planarization film 4 prevents moisture, oxygen, and the like from coming into contact with the light emitting elements 5 to thereby prevent deterioration of the light emitting elements 5.

The planarization film 4 is made of a transparent resin material having good transmittance to visible light. The material of the planarization film 4 preferably has high barrier properties against at least one of moisture and oxygen.

The film thickness of the planarization film 4 on the light emitting elements 5 may be, for example, 0.1 μm.

The color filter 10 includes the filter portion 3, the planarization layer 2 and the lens 1 disposed in this order in the z direction.

The filter portion 3 is a layer-like portion with a constant thickness and has an upper surface 3a and a lower surface 3b. The thickness of the filter portion 3 is not specifically limited. For example, the thickness of the filter portion 3 may be 1.2 μm.

The filter portion 3 covers the planarization film 4 with the lower surface 3b being in close contact with the flat surface 4a.

The filter portion 3 regulates transmission wavelength of light incident thereon from the respective light emitting elements 5 via the planarization film 4.

The filter portion 3 includes a first color layer 31 (sub-pixel, elongated pixel), a second color layer 32 (sub-pixel, elongated pixel) and a third color layer 33 (sub-pixel, elongated pixel).

The first color layer 31 overlaps with the first sub-pixel region P1. The first color layer 31 may constitute, for example, a sub-pixel having a transmission wavelength range of red.

The second color layer 32 is disposed adjacent to the first color layer 31 in the x direction. The second color layer 32 overlaps with the second sub-pixel region P2. The second color layer 32 may constitute, for example, a sub-pixel having a transmission wavelength range of green.

The third color layer 33 is disposed adjacent to the second color layer 32 in the x direction. The third color layer 33 overlaps with the third sub-pixel region P3. The third color layer 33 may constitute, for example, a sub-pixel having a transmission wavelength range of blue.

In the first embodiment, the shapes of the first color layer 31, the second color layer 32 and the third color layer 33 in plan view in the thickness direction are rectangles elongated in the y direction, and are the same as those of the first sub-pixel region P1, the second sub-pixel region P2 and the third sub-pixel region P3, respectively. Therefore, the first color layer 31, the second color layer 32 and the third color layer 33 constituting the three sub-pixels trisect the unit pixel P in the x direction.

The ratio of a length in the longitudinal direction to a length in the lateral direction of the rectangle is referred to as an aspect ratio. When the rectangle is a square, the aspect ratio is 1.

In the first embodiment, since each sub-pixel has a length of Wx/3 in the lateral direction and a length of Wy in the longitudinal direction, the aspect ratio of each sub-pixel is 3×Wy/Wx. In particular, when each unit pixel P is a square (Wx=Wy), the aspect ratio of each sub-pixel is 3.

When a sub-pixel having an aspect ratio greater than 1 is specifically referred to as an elongated pixel, the first color layer 31, the second color layer 32 and the third color layer 33 in the first embodiment are all correspond to elongated pixels.

The filter portion 3 is formed by solidifying a resin composition in which coloring materials corresponding to the respective transmission wavelength ranges are dispersed in a transparent resin.

The planarization layer 2 is a layer-like portion with a constant thickness laminated on the upper surface 3a of the filter portion 3. An upper surface 2a of the planarization layer 2 is a plane parallel to the lower surface 3b of the filter portion 3.

The planarization layer 2 is made of a transparent resin material having good transmittance to visible light.

The lenses 1 are disposed facing the first color layer 31, the second color layer 32 and the third color layer 33 with the planarization layer 2 interposed therebetween in the thickness direction (z direction), and condense light that has passed through the first color layer 31, the second color layer 32 and the third color layer 33. The condensed light is externally emitted from the color filter 10 around the optical axes of the lenses 1 extending in the z direction.

As shown in FIG. 1, in the first embodiment, three lenses 1 are arranged side by side in the longitudinal direction of each of the first sub-pixel region P1, the second sub-pixel region P2 and the third sub-pixel region P3.

In the first embodiment, some parts of the outer edges of each lens 1 in plan view have no gaps in the x direction and y direction. Accordingly, the lenses 1 are densely arranged in the longitudinal direction of each of the first sub-pixel region P1, the second sub-pixel region P2 and the third sub-pixel region P3. Further, in the first embodiment, the lenses 1 are densely arranged also in the lateral direction of each of the first sub-pixel region P1, the second sub-pixel region P2 and the third sub-pixel region P3.

However, as long as a required light extraction efficiency is obtained, a gap may be formed between the outer edges of the lenses 1. In order to improve the light extraction efficiency, it is more preferred that the lenses 1 are densely arranged. For example, a preferred dense arrangement is one in which the minimum value of the gap becomes 20% or less of the size of the lens in the width direction of the gap. For example, when a gap is provided between the lenses 1 in the y direction, the width of the gap in the y direction is preferably 0.20×Dy or less, where Dy is the outer diameter of the lens in the y direction.

Each lens 1 in the first sub-pixel region P1 has a width in the x direction which is the same as the lateral width of the first sub-pixel region P1, and a width in the y direction which is one-third of the longitudinal width of the first sub-pixel region P1. The shape of each lens 1 in plan view is a rectangle with four rounded corners, in which the length in the x direction is Wx/3 and the length in the y direction is Wy/3. In particular, when Wx=Wy, the shape of each lens 1 in plan view may be a circle.

The shape of each lens 1 in plan view in the second sub-pixel region P2 and the third sub-pixel region P3 is the same as that in the first sub-pixel region P1.

In plan view, gaps are formed between the lenses 1 at diagonal positions. Through the gaps between the lenses 1 at diagonal positions, a flat portion F formed of the upper surface 2a of the planarization layer 2 is exposed. Each lens 1 covers the planarization layer 2 except for the flat portion F.

The lenses 1 are made of a transparent resin material having good transmittance to visible light. The material of the lenses 1 may be the same or different from that of the planarization layer 2. When the material of the lenses 1 is different from that of the planarization layer 2, their refractive indices may be different from each other.

In the example shown in FIGS. 2 and 3, each lens 1 has a flat surface 1b and a convex lens surface 1a in this order in the z direction. The flat surface 1b is an interface with the planarization layer 2. However, when the lens 1 and the planarization layer 2 are made of the same material, the flat surface 1b is a virtual plane since no interface is formed between the lens 1 and the planarization layer 2. When the lens 1 and the planarization layer 2 have the same refractive index, the flat surface 1b does not function as a refracting surface or a reflecting surface even if the flat surface 1b is formed.

Unless otherwise specified, in the example described below, the lens 1 and the planarization layer 2 are made of the same material and have the same refractive index.

Each lens 1 is a convex lens in which the convex lens surface 1a has a positive refractive power.

The shape of the convex lens surface 1a is appropriately determined in consideration of the light condensing performance and light extraction efficiency of the lens 1. For example, each convex lens surface 1a may have a hemispherical shape convex in the z direction.

The term "hemispherical shape" as used herein includes a hemispherical surface, a spherical segment surface of a spherical segment whose height is smaller than a radius, and an aspherical surface close to the hemispherical surface or the spherical segment surface.

Due to such a shape, each lens 1 can condense light emitted from the light emitting element 5. Each lens 1 has an optical axis O extending in the z direction through the center of each lens 1.

As shown in FIG. 2, each optical axis O is located at the center of the width (lateral width) of the light emitting element 5 in the x direction.

The organic EL display device 100 can be manufactured by forming light emitting elements 5 on a substrate 6 using a semiconductor manufacturing process, laminating a planarization film 4 on the substrate 6 and the light emitting elements 5 to form a main body 9, and forming a filter portion 3, a planarization layer 2 and lenses 1 on the flat surface 4a.

The filter portion 3 can be formed by, for example, preparing resin compositions in which each coloring material for forming the first color layer 31, the second color layer 32 and the third color layer 33 is dispersed in a photosensitive resin, and exposing and developing the resin compositions through a pattern mask by photolithography to form a cured layer of the resin compositions on the flat surface 4a.

The lenses 1 can be formed by, for example, forming a resin layer for forming a planarization layer 2 and lenses 1 on the filter portion 3, and then etching the surface of the resin layer into the shapes of a convex lens surface 1a of the lenses 1 and a flat portion F by an etch-back method. The planarization layer 2 is formed by a non-etched portion of the layer-like portion of the resin layer.

The following description will be given of the effects of the organic EL display device 100, focusing on the effects of the color filter 10.

Figure 4:
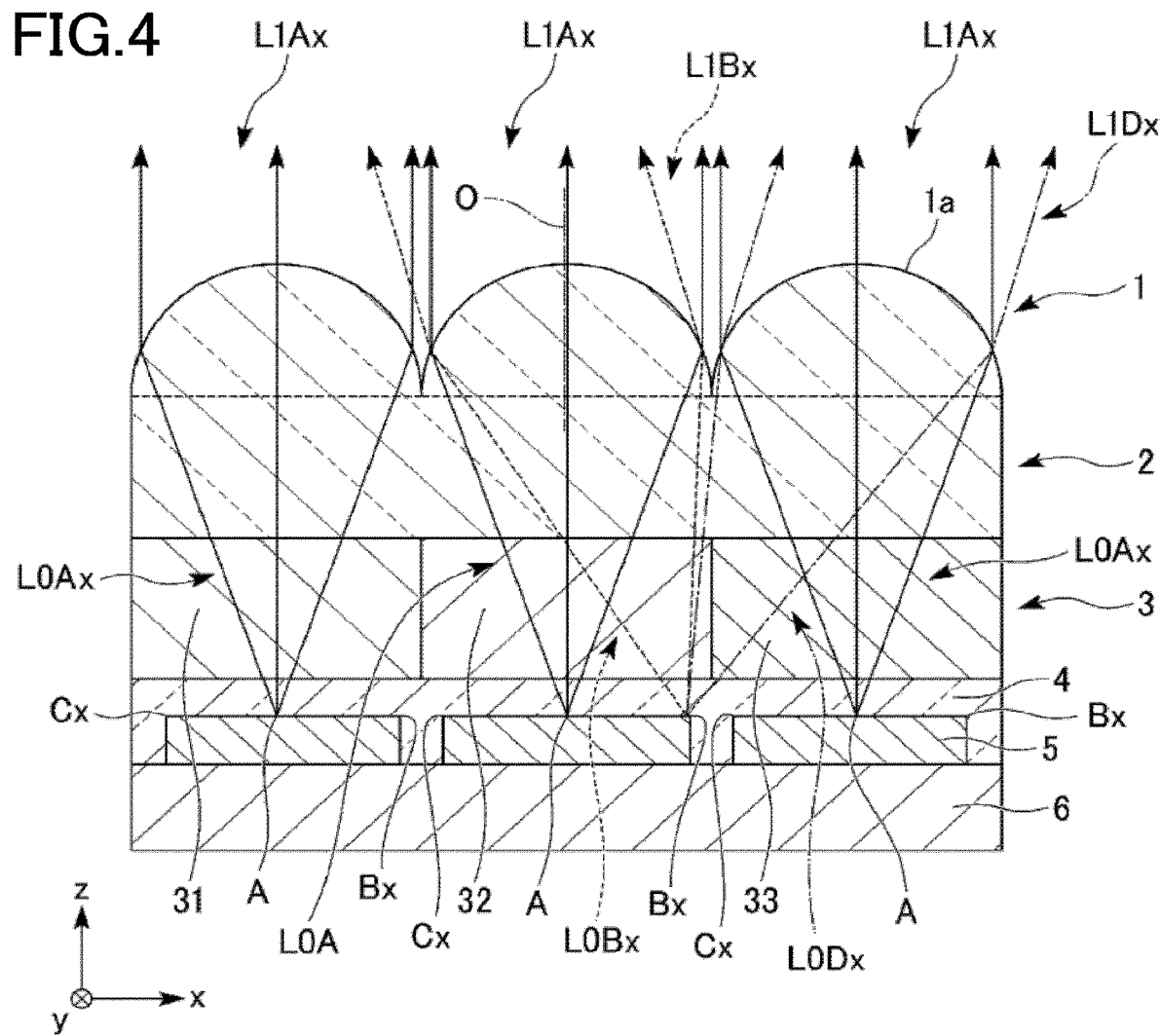
FIG. 4 is a schematic view illustrating an effect of a color filter according to the first embodiment of the present invention.
Figure 5:
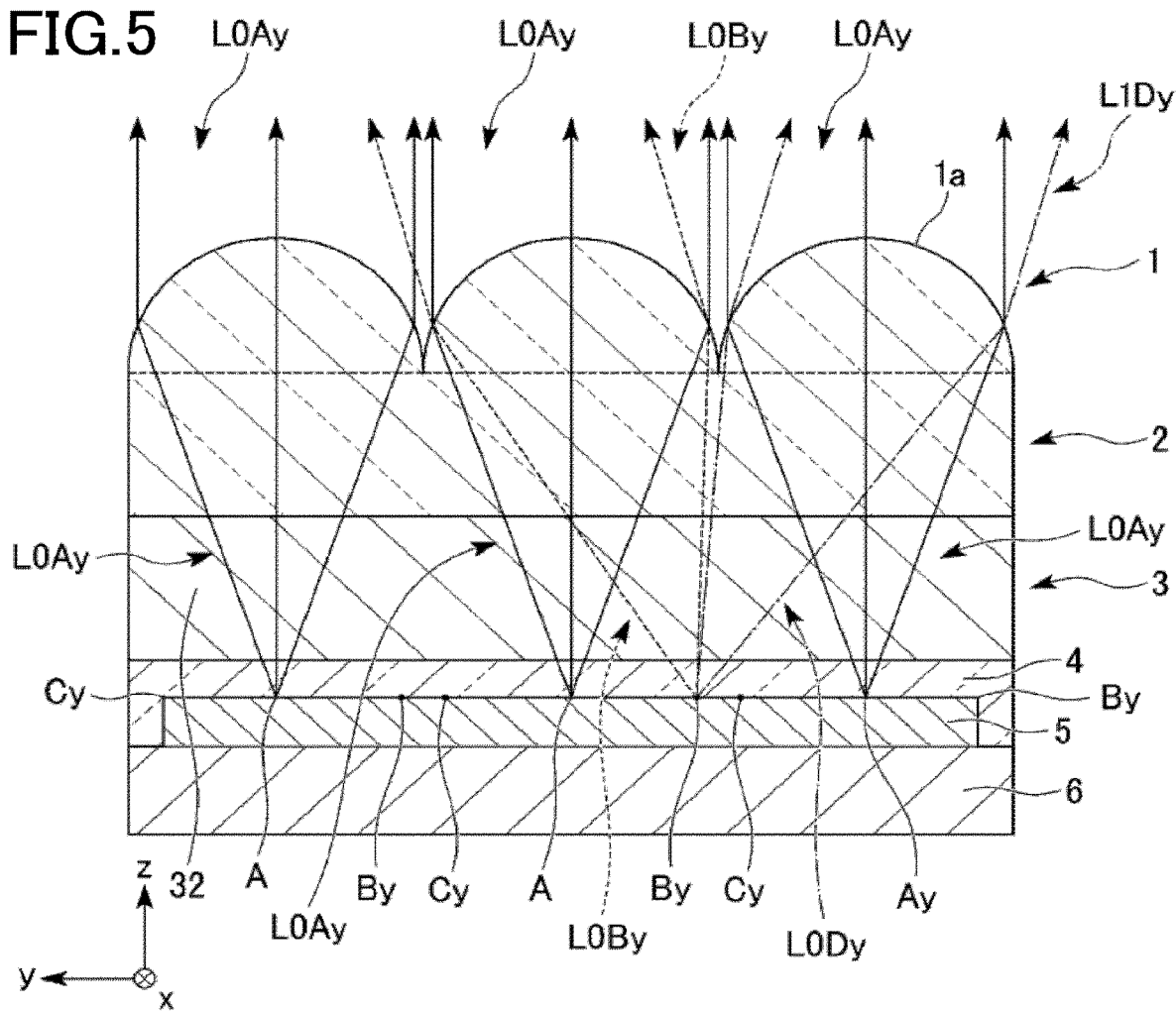
FIG. 5 is a schematic view illustrating an effect of a color filter according to the first embodiment of the present invention.

FIGS. 4 and 5 are schematic views illustrating an effect of a color filter according to the first embodiment of the present invention. FIG. 5 is a schematic view illustrating an effect of a color filter according to the first embodiment of the present invention.

In the organic EL display device 100, the light emitting element 5 facing the first color layer 31 is controlled to emit light in response to an image signal of a red component (hereinafter, referred to as an R signal). Similarly, the light emitting element 5 facing the second color layer 32 and the light emitting element 5 facing the third color layer 33 are controlled to emit light in response to an image signal of a green component (hereinafter, referred to as a G signal) and an image signal of a blue component (hereinafter, referred to as a B signal), respectively.

In the unit pixel P, light from the light emitting element 5 driven by the R signal, light from the light emitting element 5 driven by the G signal and light from the light emitting element 5 driven by the B signal are externally emitted through the first color layer 31, the second color layer 32 and the third color layer 33, respectively, whereby colors faithful to the image signals are displayed.

Depending on the numerical aperture of the lenses 1, for example, red light from the light emitting element 5 driven by the R signal may leak out from the second sub-pixel region P2 or the third sub-pixel region P3. Since such red leakage light is condensed to the front side by the lenses 1, it does not cause a change in color in the unit pixel P.

On the other hand, red light from the light emitting element 5 driven by the R signal may pass through the second color layer 32 and leak out from the second sub-pixel region P2. In this case, as the leakage light caused by the R signal passes through the second color layer 32, green light component in the leakage light leaks to the outside. As a result, a color of the unit pixel P changes due to an increase in the green light component caused by the R signal. Although depending on the light condensing performance of the lenses 1, leakage light also tends to be largely inclined relative to the optical axis O. Accordingly, there is a possibility that a change in color increases especially when the unit pixel P is viewed in an oblique direction.

FIG. 4 schematically illustrates a light flux in a cross-section perpendicular to the y direction.

When the light emitting elements 5 are turned on, light fluxes L0Ax (see solid line arrows) are emitted from the points A, which intersect the respective optical axes O of the lenses 1 that face the light emitting elements 5, toward the convex lens surfaces 1a that face the light emitting elements 5 in the z direction while spreading radially around the optical axes O.

Since the planarization film 4, the filter portion 3 and the planarization layer 2 do not have refractive power, the light fluxes L0Ax spread inside thereof and reach the convex lens surfaces 1a that face the light emitting elements 5 in the z direction. The light fluxes L0Ax are condensed according to the refractive power at the respective convex lens surfaces 1a and externally emitted from the lenses 1 as light fluxes L1Ax which are close to parallel light fluxes.

Similarly, when the light fluxes L0Bx (see dotted line arrows) emitted from points Bx at the ends of the light emitting elements 5 in the x direction reach the convex lens surfaces 1a, the light fluxes L0Bx are condensed according to the refractive power of the respective convex lens surfaces 1a and externally emitted from the lenses 1 as light fluxes L1Bx which are close to parallel light fluxes. Depending on the light condensing performance of the convex lens surfaces 1a, the light fluxes L1Bx are emitted in an oblique direction according to the distance from the point Bx to the optical axis O. Compared with the case where no convex lens surface 1a is provided, the light fluxes L1Bx are emitted in a direction toward the optical axis O according to the refractive power of the convex lens surface 1a.

Although FIG. 4 shows an example of light from the point Bx in the second color layer 32, similar light fluxes (not shown) are emitted from the first color layer 31 and the third color layer 33.

For example, light from the point Bx in the second color layer 32 is also emitted, as a light flux L0Dx indicated by the dot-dash line, in a direction toward the convex lens surface 1a that faces the third color layer 33 in the z direction. Most of the light flux L0Dx passes through the second color layer 32 and the third color layer 33, and is different from green light. However, since the second color layer 32 and the third color layer 33 have different transmission wavelength ranges, the intensity of transmitted light is smaller than the light flux L0Bx. The light flux L0Dx reaching the convex lens surface 1a that faces the third color layer 33 in the z direction is emitted to the outside the lens 1 as a light flux L1Dx close to a parallel light flux in an oblique direction toward the x direction.

However, since the light fluxes L0Bx and L0Dx are emitted from the outer edges of the light emitting elements 5, the light intensity itself is lower than that from the center part. Most of the light flux L1Dx passing through the third color layer 33 is bluish, but the influence of color mixing is small due to the low light intensity.

Although not shown for clarity of illustration, light flux from a point Cx at the end of the light emitting element 5 in the direction opposite to the x direction is emitted from the convex lens surface 1a as a light flux symmetrical to the light flux L0Bx, L0Dx, L1Bx or L0Dx about the optical axis O.

In a cross-section perpendicular to the y direction, a light flux from the lens 1 is emitted around the optical axis O of the convex lens surface 1a that faces the light emitting element 5 in the z direction, and has a divergence angle smaller than that of a light flux emitted from the light emitting element 5. The color of light flux emitted from the respective convex lens surfaces 1a corresponds to the transmission wavelength range of the filter portion 3 that the convex lens surface 1a faces.

Therefore, most of the white light from the light emitting element 5 that faces the first color layer 31 passes through the first color layer 31 and is emitted from the lens 1 that faces the first color layer 31 to the front of the lens 1 (upper side in the drawing) as red light having a red wavelength component.

Similarly, most of the white light from the light emitting element 5 that faces the second color layer 32 passes through the second color layer 32 and is emitted from the lens 1 that faces the second color layer 32 to the front of the lens 1 as green light having a green wavelength component.

Similarly, most of the white light from the light emitting element 5 that faces the third color layer 33 passes through the third color layer 33 and is emitted from the lens 1 that faces the third color layer 33 to the front of the lens 1 as blue light having a blue wavelength component.

FIG. 5 schematically illustrates a light flux passing through the point A on the light emitting element 5 that faces the second color layer 32 in a cross-section perpendicular to the x direction.

For ease of comparison with FIG. 4, points A, By and Cy are indicated at positions similar to the points A, Bx and Cx in FIG. 4. The light fluxes L0Ay, L1Ay, L0By, L1By, L0Dy and L1Dy are the same as the light fluxes L0Ax, L1Ax, L0Bx, L1Bx, L0Dx and L1Dx in FIG. 4 except that the light flux is emitted from the points A and By.

In a cross-section perpendicular to the x direction, a light flux from the lens 1 is emitted around the optical axis O of the convex lens surface 1a that faces the light emitting element 5 in the z direction, and has a divergence angle smaller than that of a light flux emitted from the light emitting element 5. The color of light flux emitted from the respective convex lens surfaces 1a corresponds to the transmission wavelength range of the filter portion 3 that the light emitting element 5 faces. In the example of FIG. 4, it corresponds to the transmission wavelength range of the second color layer 32.

In FIG. 5, for example, since the light fluxes L0Dy and L1Dy only passes through the second color layer 32, they are emitted as green light without decreasing the light intensity. Therefore, the light flux L1Dy does not cause color mixing.

Thus, since a plurality of lenses 1 of the first embodiment are disposed above the sub-pixels elongated in the y direction, the lenses 1 have an effect of preventing light fluxes from being spread in the y direction as well as in the x direction. Therefore, the front luminance of the unit pixel P is improved.

This will be described in comparison with Conventional Example 1 shown in FIGS. 6 and 7.

Figure 6:
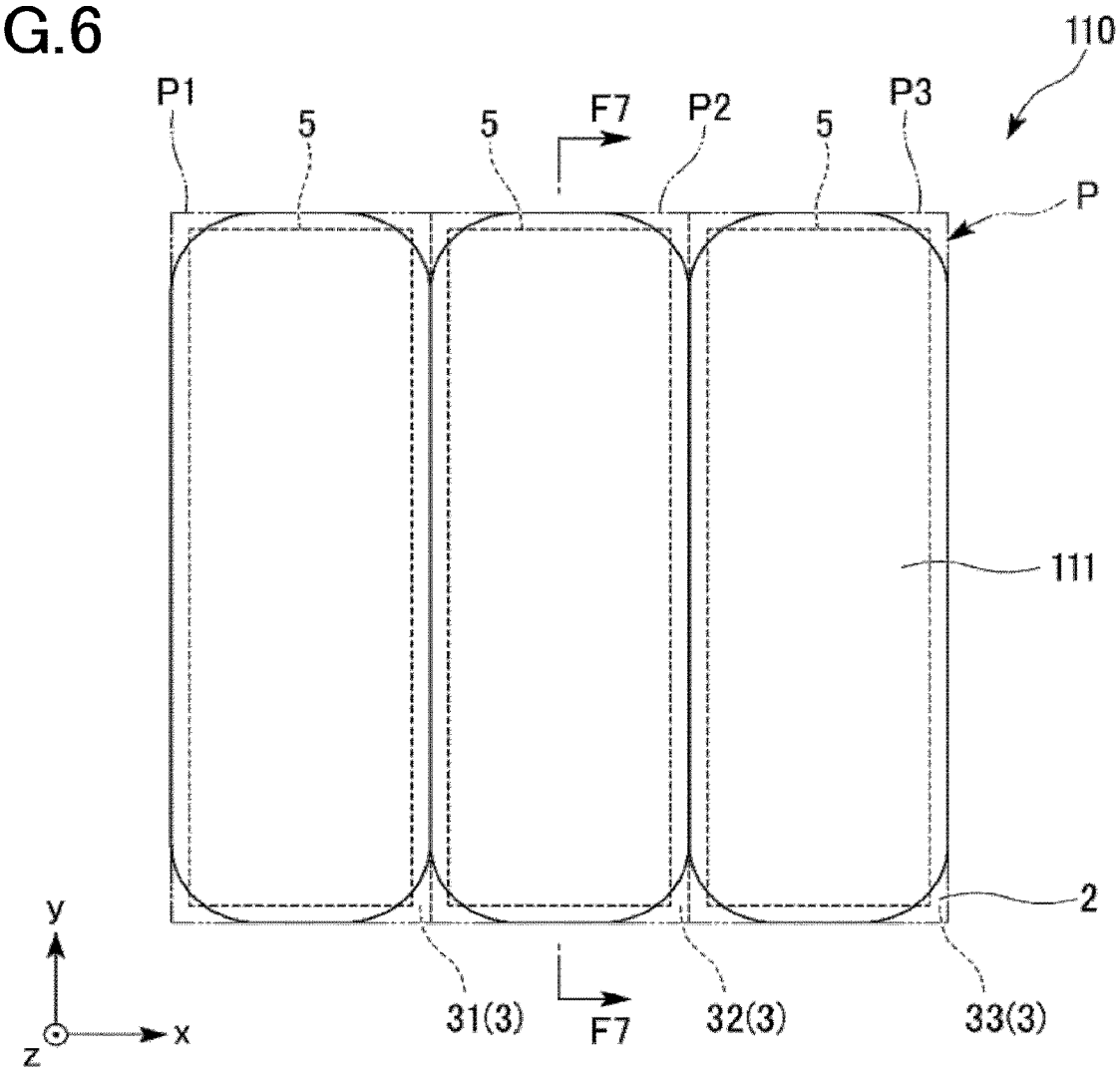
FIG. 6 is a schematic plan view illustrating an example of a display device of Conventional Example 1.

FIG. 6 is a schematic plan view illustrating an example of a display device of Conventional Example 1. FIG. 7 is a cross-sectional view taken along the line F7-F7 in FIG. 6.

Figure 7:
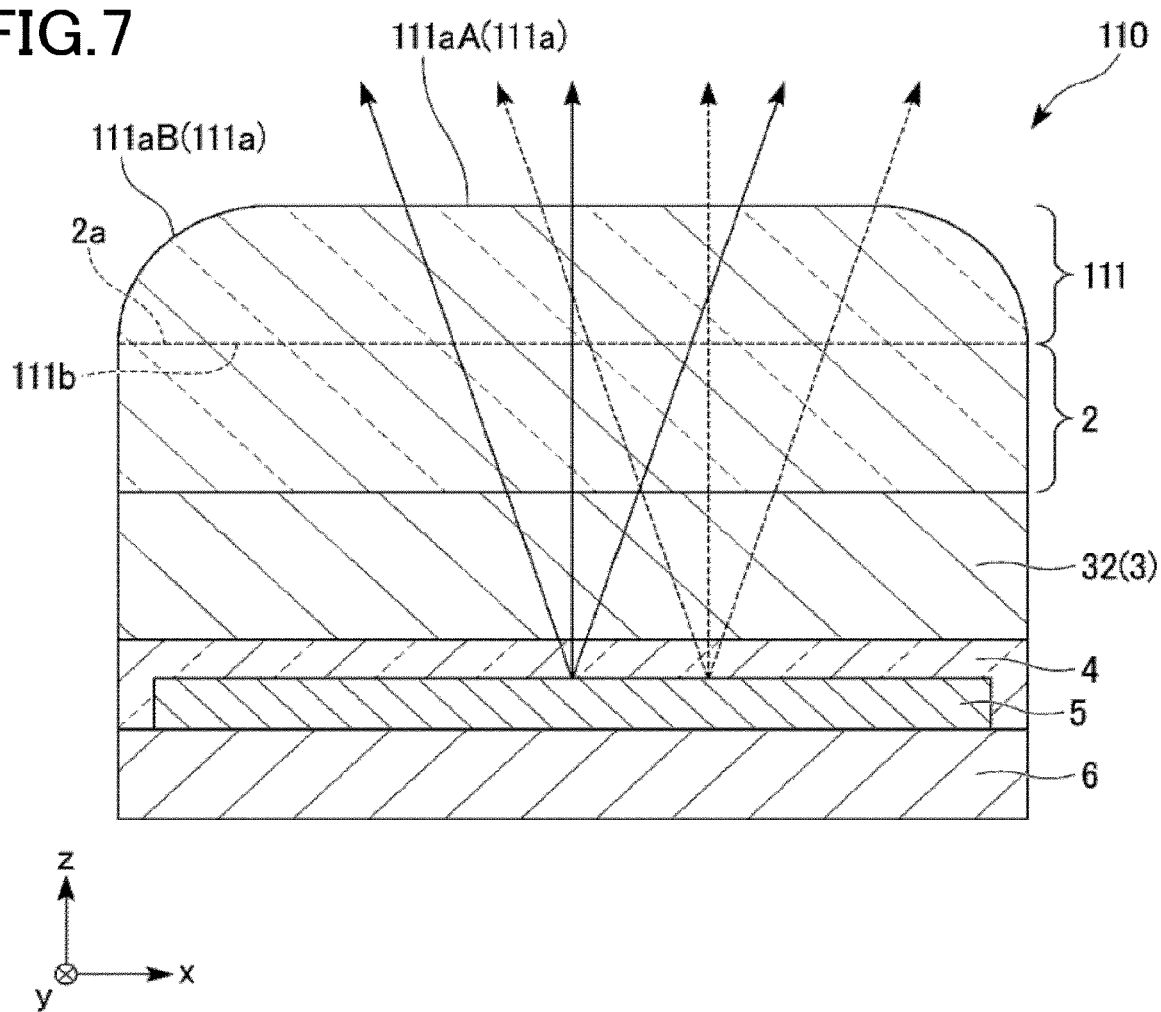
FIG. 7 is a cross-sectional view taken along the line F7-F7 in FIG. 6.

As shown in FIGS. 6 and 7, an organic EL display device 110 of Conventional Example 1 has the same configuration as that of the organic EL display device 100 except that it has lenses 111 instead of the lenses 1 of the organic EL display device 100. The following description will be given focusing on the differences from the first embodiment.

As shown in FIG. 7, the lenses 111 are disposed facing the first color layer 31, the second color layer 32 and the third color layer 33 with the planarization layer 2 therebetween, and condense light that has passed through the first color layer 31, the second color layer 32 and the third color layer 33.

As shown in FIG. 6, one lens 111 is disposed in the longitudinal direction of each of the first sub-pixel region P1, the second sub-pixel region P2 and the third sub-pixel region P3.

The lens 111 in the first sub-pixel region P1 has a width in the x direction which is the same as the lateral width of the first sub-pixel region P1, and a width in the y direction which is the same as the longitudinal width of the first sub-pixel region P1. The shape of the lens 111 in plan view is a rectangle with four rounded corners.

The shape of each lens 111 in plan view in the second sub-pixel region P2 and the third sub-pixel region P3 is the same as that in the first sub-pixel region P1.

The shape of the lens 111 in a cross-section perpendicular to they direction is the same as the shape of the convex lens surface 1a in the same cross-section.

As shown in FIG. 7, the shape of the lens 111 in a cross-section perpendicular to the x direction has a flat surface 111b and a lens surface 111a in this order in the z direction.

The flat surface 111b is formed by an interface with the planarization layer 2.

The lens surface 111a includes convex surfaces 111aB formed on both ends in the longitudinal direction of the lens 111, and a cylindrical surface 111aA extending in the x direction between the convex surfaces 11aB.

The cylindrical surface 111aA has a shape in which a cross-sectional shape of the convex lens surface 1a in a direction perpendicular to the x direction is extended in the x direction.

The convex surface 111aB has a quarter spherical shape smoothly connected to the cylindrical surface 111aA.

The lens surface 111a has the same refractive power as that of the convex lens surface 1a in a cross-section perpendicular to the y direction, but has no refractive power except for the convex surface 111aB in a cross-section perpendicular to the x direction.

Therefore, as indicated by the solid line and the dotted line in FIG. 7, the light flux emitted from the light emitting element 5 and passing through the cylindrical surface 111aA is emitted from the lens 111 without being condensed in the x direction.

As a result, the viewing angle in a cross-section perpendicular to the y direction is widened due to the spread of the light flux compared with that in the first embodiment, but the luminance in each observation direction in the same cross-section is lower than that in the first embodiment.

That is, in the organic EL display device 110 of Conventional Example 1, the front luminance decreases, and the luminance according to the observation angle when viewed obliquely in the cross-section perpendicular to the y direction also decreases. As a result, the image becomes darker, reducing the visibility.

On the other hand, since the organic EL display device 100 of the first embodiment has the color filter 10 in which a plurality of lenses 1 are disposed in the longitudinal direction of the respective sub-pixels, the front luminance and visibility are improved.

Second Embodiment

A color filter and a display device according to a second embodiment of the present invention will be described.

Figure 8:
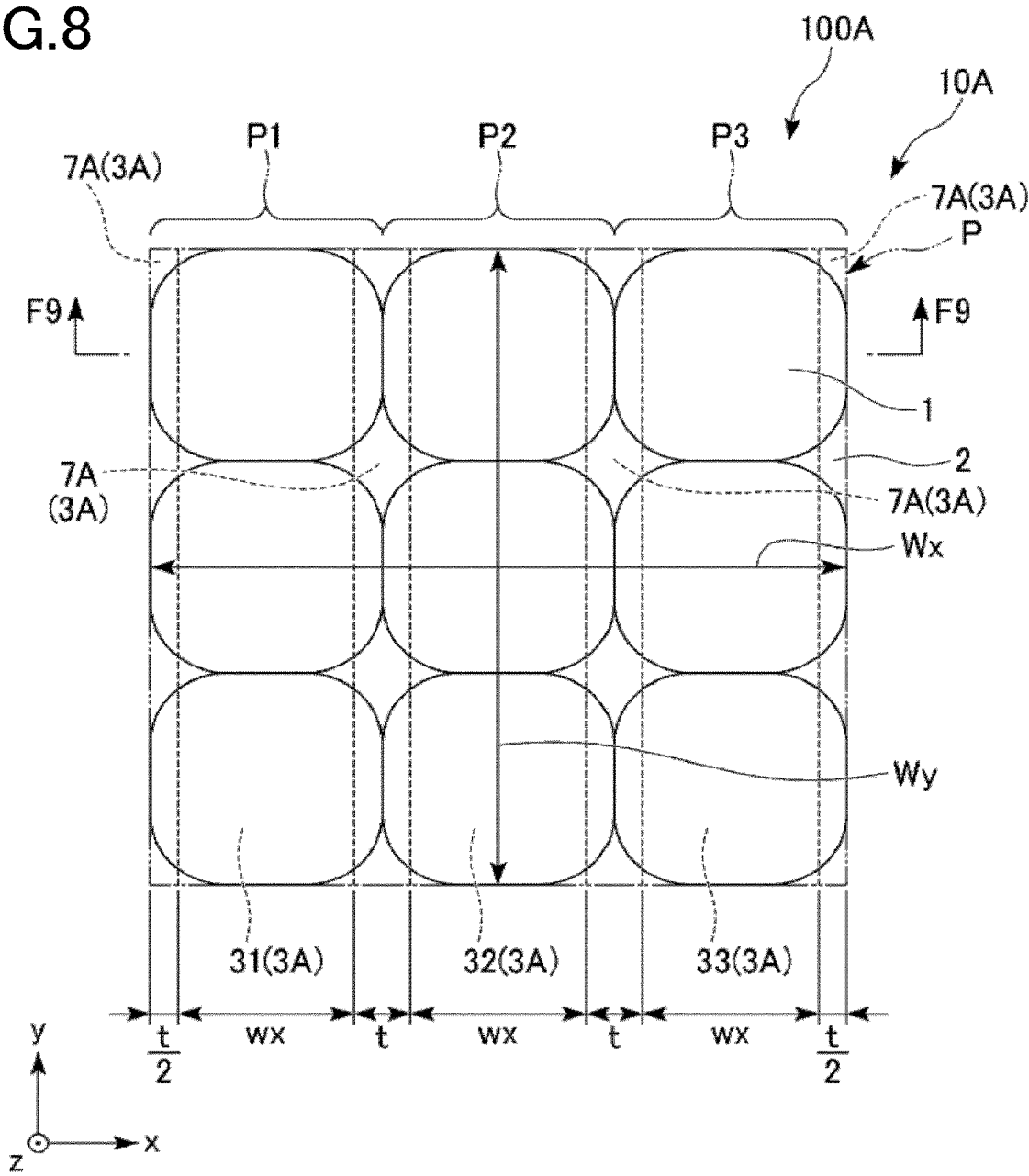
FIG. 8 is a schematic plan view illustrating an example of a display device according to a second embodiment of the present invention.

FIG. 8 is a schematic plan view illustrating an example of a display device according to the second embodiment of the present invention.

Figure 9:
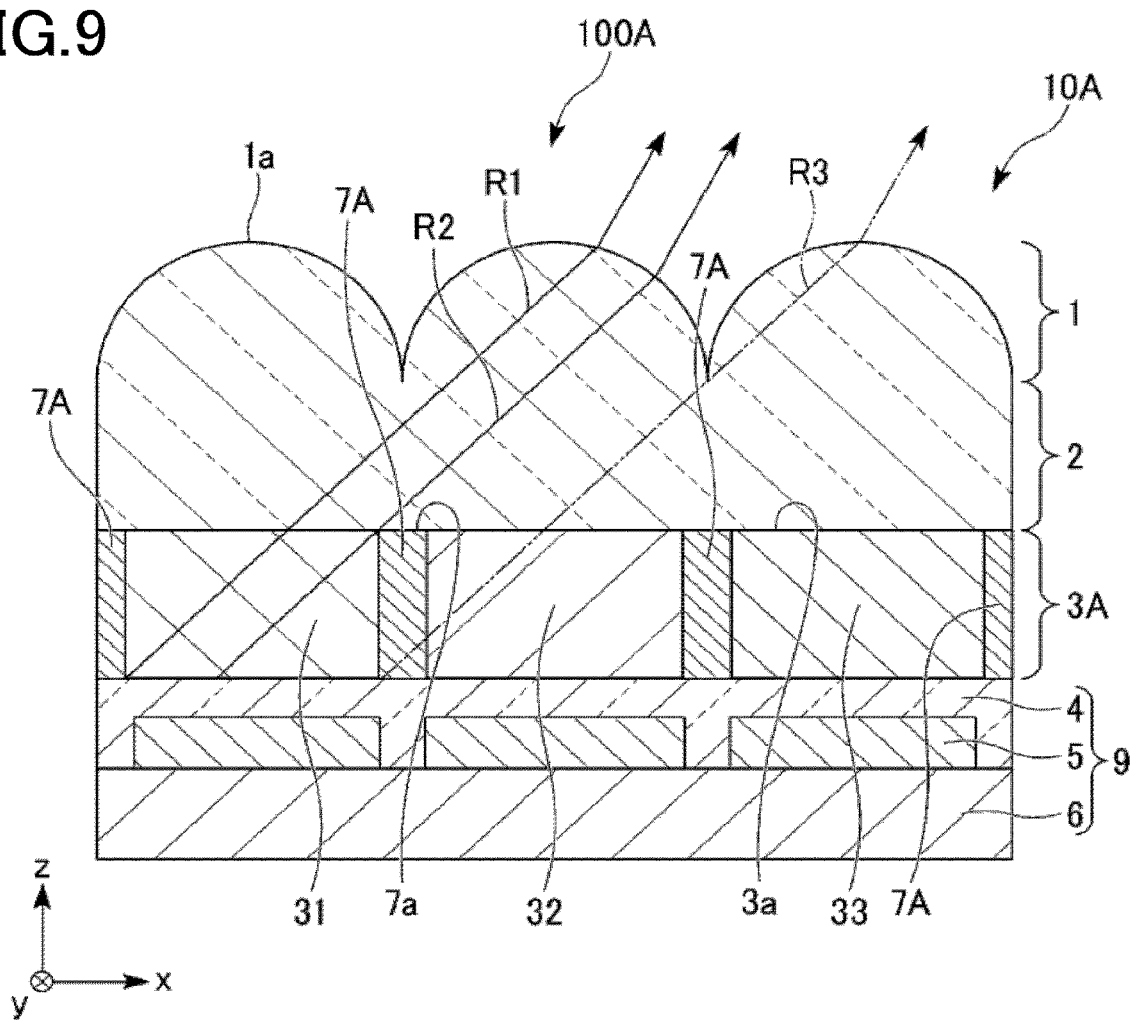
FIG. 9 is a cross-sectional view taken along the line F9-F9 in FIG. 8.

FIG. 9 is a cross-sectional view taken along the line F9-F9 in FIG. 8.

As shown in FIGS. 8 and 9, an organic EL display device 100A (display device) of the second embodiment includes a color filter 10A of the second embodiment instead of the color filter 10 of the first embodiment. The color filter 10A includes a filter portion 3A instead of the filter portion 3.

The following description will be given focusing on the differences from the first embodiment.

The filter portion 3A further includes light shielding walls 7A that shield the visible light in the filter portion 3.

The light shielding walls 7A are respectively disposed between sub-pixels adjacent in the x direction of the unit pixels P adjacent in the x direction and between sub-pixels adjacent in the x direction within the unit pixel P.

The shape of the light shielding wall 7A is not specifically limited as long as it can block at least part of light passing through the sub-pixels adjacent in the x direction.

For example, in the example shown in FIGS. 8 and 9, each light shielding wall 7A has an x width of t and a length in they direction of Wy. The height of each light shielding wall 7A in the z direction is equal to the thickness of each sub-pixel. An upper surface 7a of the light shielding wall 7A is flush with the upper surface 3a of the filter portion 3A.

The x width t of the light shielding wall 7A is an appropriate size for obtaining required light shielding properties. However, smaller t is more preferred. For example, t may be 30% or more and 40% or less of Wx/3.

The material of the light shielding wall 7A is not specifically limited as long as it can block visible light. For example, the light shielding wall 7A may be made of a material having a visible light transmittance of 0% or more and 20% or less. The light shielding wall 7A may be made of, for example, a resin material in which a black colorant such as carbon is dispersed.

The first color layer 31, the second color layer 32 and the third color layer 33 in the second embodiment are the same as those of the sub-pixels in the first embodiment except that the x width is wx. Wx is (Wx/3−t). Therefore, the aspect ratio of each sub-pixel in the second embodiment is Wy/wx.

For example, when Wy=Wx, the aspect ratio is greater than 3. In particular, when the width t of the light shielding wall 7A is within the range described above, the aspect ratio is 4.2 or more and 5 or less.

The filter portion 3A can be produced by preparing a resin composition for forming a light shielding wall 7A, and patterning the resin composition by photolithography in the same manner as in the method for forming the first color layer 31, the second color layer 32 and the third color layer 33.

Since the organic EL display device 100A of the second embodiment has the color filter 10A in which a plurality of lenses 1 are disposed in the longitudinal direction of the respective sub-pixels, the front luminance and visibility are improved as in the first embodiment.

In particular, since the filter portions 3A in the color filter 10A include the light shielding walls 7A between the sub-pixels, light flux emitted from the lenses 1 via the boundaries between the sub-pixels can be blocked.

As an example, FIG. 9 illustrates light beams R1, R2 and R3 that enter the first color layer 31 and are deviated toward the z direction as they travel in the x direction.

The light beams R1 and R2 emitted from an end portion of the light emitting element 5 on a side opposite to the x direction pass through the planarization layer 2 located on the upper side of the light shielding wall 7A in the drawing, and are externally emitted from the lens 1 that faces the second color layer 32. On the other hand, as illustrated as the light beam R3, light that enters the first color layer 31 at a position on the x direction side relative to the light beam R2 is absorbed by the light shielding wall 7A and thus not externally emitted.

Therefore, changes in color due to color mixing can be further suppressed than in the first embodiment.

First Modified Example

A color filter and a display device according to a first modified example of the second embodiment of the present invention will be described.

Figure 10:
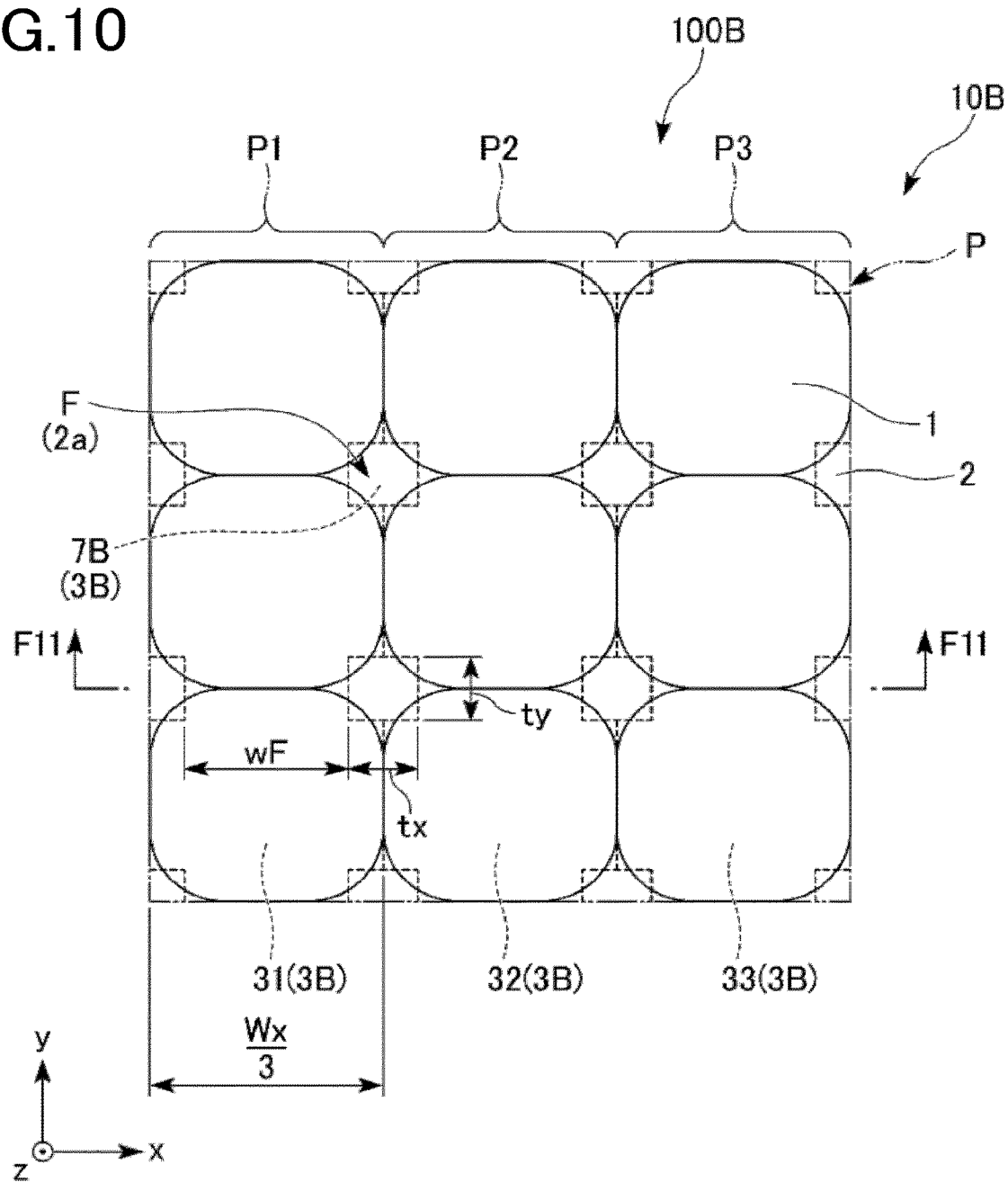
FIG. 10 is a schematic plan view illustrating an example of a display device according to a first modified example of the second embodiment of the present invention.
Figure 11:
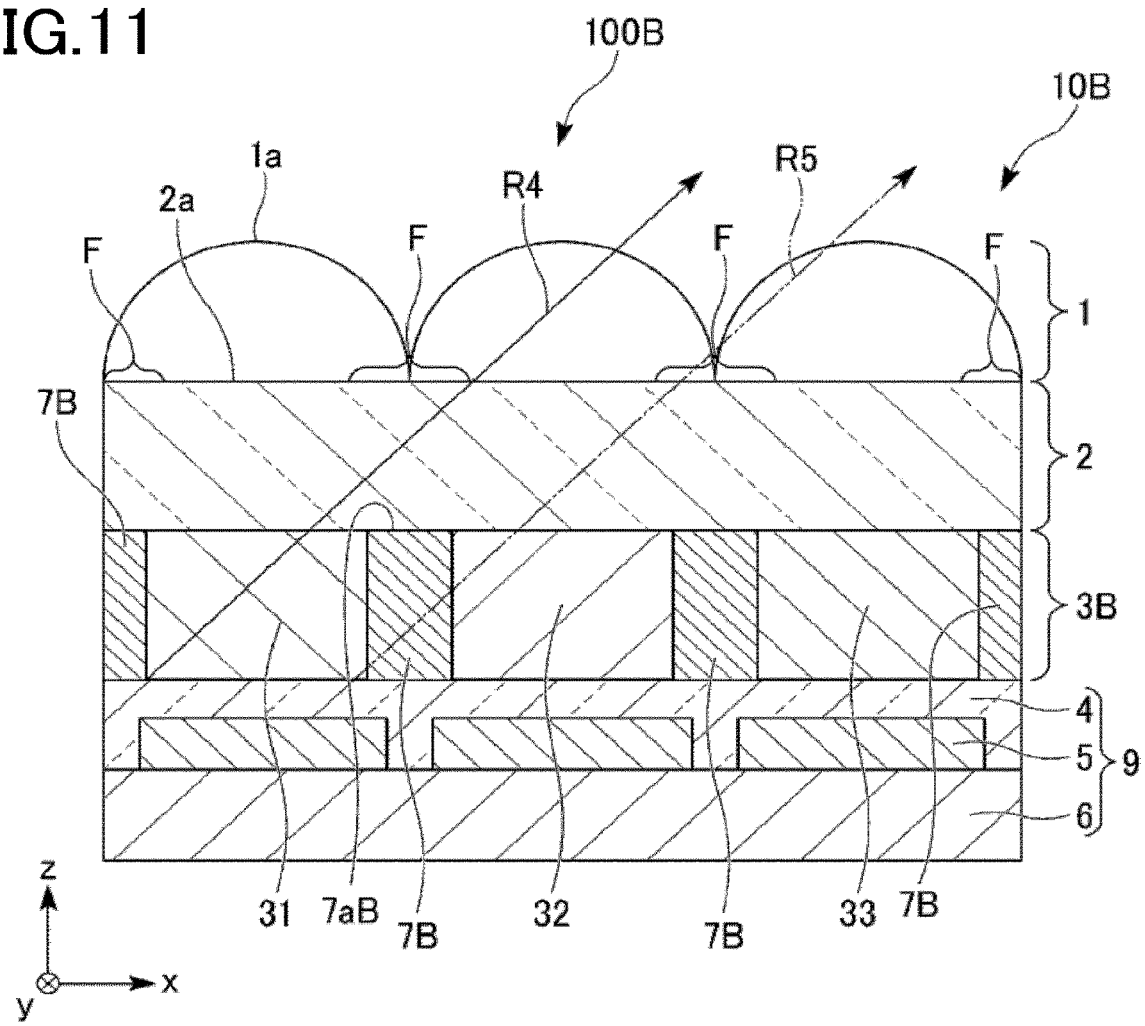
FIG. 11 is a cross-sectional view taken along the line F11-F11 in FIG. 10.

FIG. 10 is a schematic plan view illustrating an example of a display device according to a first modified example of the second embodiment of the present invention. FIG. 11 is a cross-sectional view taken along the line F11-F11 in FIG. 10.

As shown in FIG. 10, an organic EL display device 100B (display device) of the first modified example includes a color filter 10B of the second embodiment instead of the color filter 10A of the second embodiment.

The color filter 10B includes a filter portion 3B instead of the filter portion 3A.

The following description will be given focusing on the differences from the second embodiment.

The filter portion 3B includes light shielding walls 7B instead of the light shielding walls 7A of the filter portion 3A.

Each light shielding wall 7B is formed in a columnar shape extending in the z direction, and has an upper surface 7aB (see FIG. 11) in the extending direction located facing the flat portion F.

Thus, the light shielding walls 7B, which are arranged in a lattice pattern at positions separated from each other in the x direction and the y direction, are disposed between sub-pixels adjacent in the x direction of the unit pixels P adjacent in the x direction and between sub-pixels adjacent in the x direction within the unit pixel P.

The shape of the light shielding wall 7B is not specifically limited as long as it can block at least part of light emitted from the light emitting elements 5 toward the flat portions F.

For example, in the example shown in FIGS. 10 and 11, each light shielding wall 7B has an x width of tx and a y width of ty.

The height of each light shielding wall 7B in the z direction is equal to the thickness of each sub-pixel. An upper surface 7aB of the light shielding wall 7B is flush with the upper surface 3a of the filter portion 3B.

The x width tx and the y width of ty of the light shielding wall 7B are appropriate sizes for obtaining required light shielding properties. For example, tx and ty may be sizes that can cover 70% or more and 100% or less of the flat portion F in plan view.

The light shielding wall 7B may be made of the same material as that of the light shielding wall 7A.

The first color layer 31, the second color layer 32 and the third color layer 33 in the second embodiment are the same as those of the sub-pixels in the first embodiment except that an x width wF of a portion sandwiched between the light shielding walls 7B adjacent in the x direction is reduced to (Wx/3−tx).

As in the second embodiment, when the shape of the sub-pixels is different from a rectangle, the ratio of a maximum length in the longitudinal direction to a maximum length in the lateral direction of the sub-pixel is defined as the aspect ratio. Therefore, the aspect ratio of each sub-pixel in the second embodiment is the same as that in the first embodiment.

The color filter 10B can be manufactured in the same manner as the color filter 10A of the second embodiment except that the regions for forming the light shielding walls 7B in plan view are different from those of the light shielding walls 7A.

Since the organic EL display device 100B of the second embodiment has the color filter 10B in which a plurality of lenses 1 are disposed in the longitudinal direction of the respective sub-pixels, the front luminance and visibility are improved as in the first embodiment.

In particular, since the filter portions 3B in the color filter 10B include the light shielding walls 7B between the sub-pixels, light flux emitted from the flat portions F via the boundaries between the sub-pixels can be blocked.

As an example, FIG. 11 illustrates light beams R4 and R5 that enter the first color layer 31 and are deviated toward the z direction as they travel in the x direction.

The light beam R4 emitted from an end portion of the light emitting element 5 on a side opposite to the x direction passes through the planarization layer 2 located on the upper side of the light shielding wall 7B in the drawing, and is externally emitted from the flat portion F.

On the other hand, the light beam R5 emitted from an end portion of the light emitting element 5 on the x direction side is absorbed by the light shielding wall 7B and thus not externally emitted.

When leakage light from the flat portion F occurs, the light is not condensed by the lenses 1, causing the leakage light to be emitted in a direction with a large inclination relative to the optical axis O. This causes changes in color when the unit pixel P is viewed obliquely.

Since the first modified example can reduce leakage light from the flat portions F, changes in color due to color mixing can be further suppressed than in the first embodiment.

Second Modified Example

A color filter and a display device according to a second modified example of the second embodiment of the present invention will be described.

Figure 12:
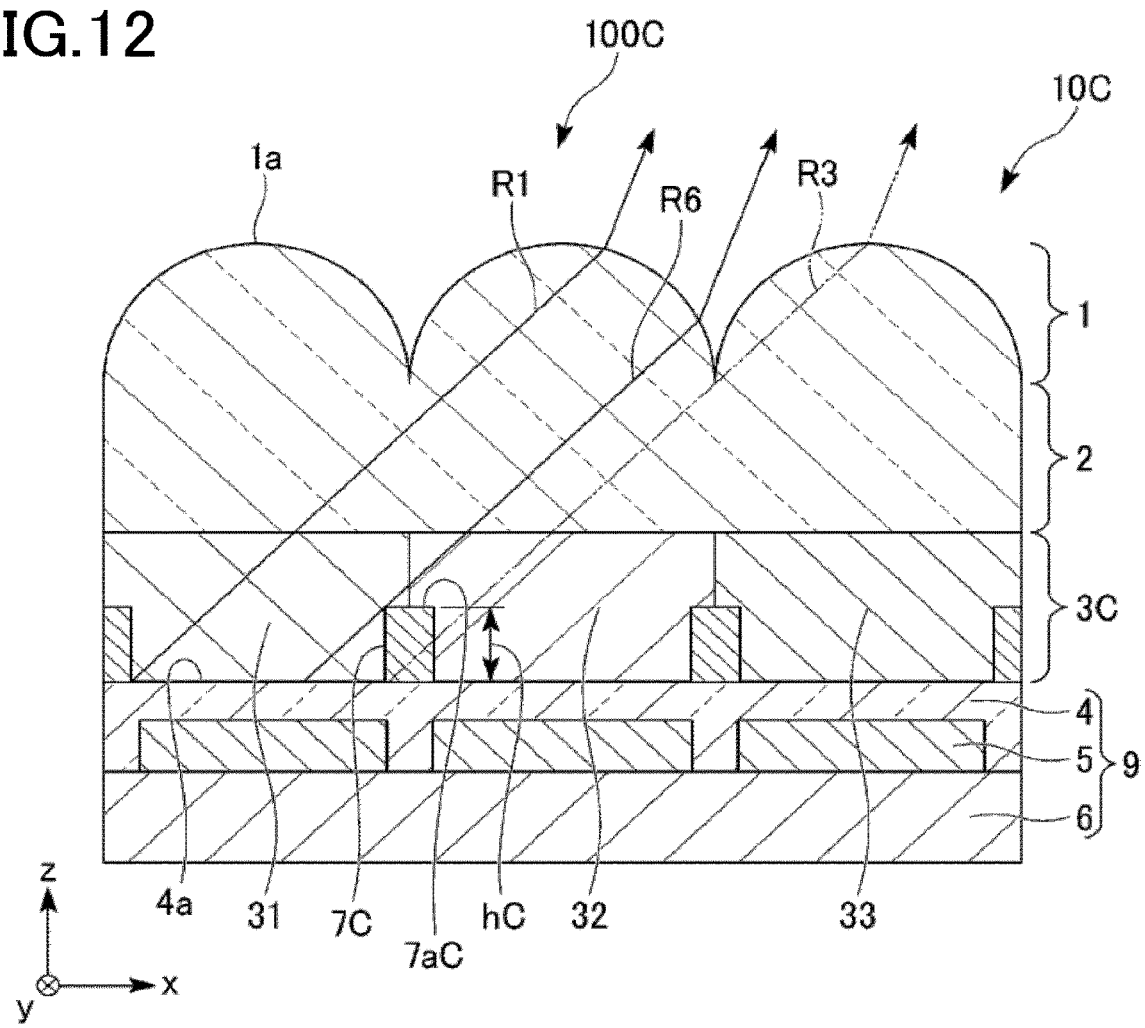
FIG. 12 is a schematic cross-sectional view illustrating an example of a display device according to a second modified example of the second embodiment of the present invention.

FIG. 12 is a schematic plan view illustrating an example of a display device according to a second modified example of the second embodiment of the present invention.

As shown in FIG. 12, an organic EL display device 100C (display device) of the second modified example includes a color filter 10C of the second embodiment instead of the color filter 10A of the second embodiment.

The color filter 10C includes a filter portion 3C instead of the filter portion 3A.

The following description will be given focusing on the differences from the second embodiment.

The filter portion 3C includes light shielding walls 7C instead of the light shielding walls 7A of the filter portion 3A.

The light shielding walls 7C are the same as the light shielding walls 7A of the second embodiment except that a height hC from the flat surface 4a to an upper surface 7aC is smaller than the thickness of each sub-pixel.

The height hC can be appropriately sized according to the required light shielding range. For example, hC is preferably larger than half the thickness of each sub-pixel.

The color filter 10C can be manufactured in the same manner as the color filter 10A of the second embodiment except that the height of the light shielding walls 7C is different from that of the light shielding walls 7A. However, in the second modified example, the first color layer 31, the second color layer 32 and the third color layer 33 are formed after the light shielding walls 7C are formed.

The organic EL display device 100C of the second embodiment has the same effect as that of the second embodiment except that the light shielding range of the light shielding walls 7C is smaller than that in the second embodiment.

According to the second modified example, as illustrated as a light beam R6 in FIG. 12, light passing through the boundary between the first color layer 31 and the second color layer 32 at a position on the upper side of the light shielding wall 7C in the drawing is not blocked by the light shielding wall 7C. Therefore, the light beam R6 passes through the planarization layer 2 and is externally emitted from the lens 1 that faces the second color layer 32.

However, when the height hC of the light shielding wall 7C is greater than or equal to half the thickness of the sub-pixel and inclination of the light beam R6 relative to the optical axis O is 45° or less, for example, the length of the optical path of the light beam R6 passing through the first color layer 32 is shorter than the optical path passing through the second color layer 31. In this case, the light beam R6 is reddish, so changes in color due to color mixing are small compared with the case where the light beam R6 is converted into green light.

Third Modified Example

A color filter and a display device according to a third modified example of the second embodiment of the present invention will be described.

Figure 13:
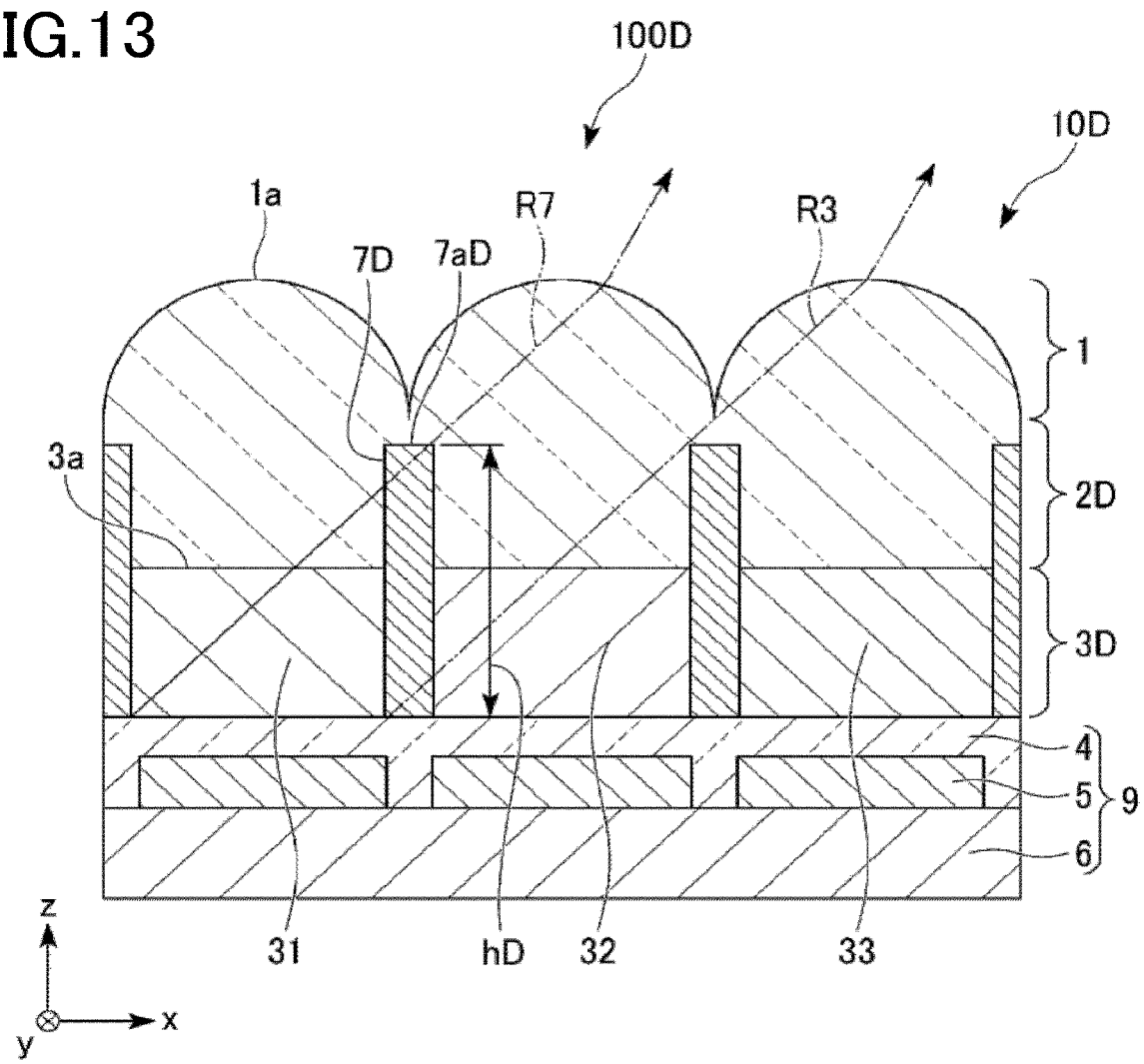
FIG. 13 is a schematic cross-sectional view illustrating an example of a display device according to a third modified example of the second embodiment of the present invention.

FIG. 13 is a schematic plan view illustrating an example of a display device according to a third modified example of the second embodiment of the present invention.

As shown in FIG. 13, an organic EL display device 100D (display device) of the third modified example includes a color filter 10D of the second embodiment instead of the color filter 10A of the second embodiment.

The color filter 10D includes a planarization layer 2D and a filter portion 3D instead of the planarization layer 2 and the filter portion 3A.

The following description will be given focusing on the differences from the second embodiment.

The third modified example is an example in which the light shielding walls 7A of the second embodiment are extended to the inside of the planarization layer 2.

The filter portion 3D includes light shielding walls 7D instead of the light shielding walls 7A of the filter portion 3A.

The light shielding walls 7D are the same as the light shielding walls 7A of the second embodiment except that a height hD from the flat surface 4a to an upper surface 7aD is larger than the thickness of each sub-pixel and not more than the sum of the thickness of each sub-pixel and the thickness of the planarization layer 2C.

The planarization layer 2D is the same as the planarization layer 2 of the second embodiment except that the light shielding walls 7D extend inside.

The color filter 10D can be manufactured in the same manner as the filter portion 3A of the second embodiment except that the height of the light shielding walls 7D is different from that of the light shielding walls 7A.

The organic EL display device 100D of the second embodiment has the same effect as that of the second embodiment except that the light shielding range of the light shielding walls 7C is larger than that in the second embodiment.

According to the third modified example, it is possible to block a light beam, such as the light beam R3, that passes through the boundary between the sub-pixels adjacent to each other, and at least part of light passing through the planarization layer 2D and emitted from the lens 1 that faces the adjacent sub-pixel.

For example, when the height hD is appropriately sized so that a light beam R7 shown in FIG. 9, which corresponds to the light beam R1, can also be blocked, it is possible to block all the light passing through the first color layer 31 and externally emitted from the convex lens surface 1a that faces the adjacent sub-pixel.

Fourth Modification

A color filter and a display device according to a fourth modified example of the second embodiment of the present invention will be described.

Figure 14:
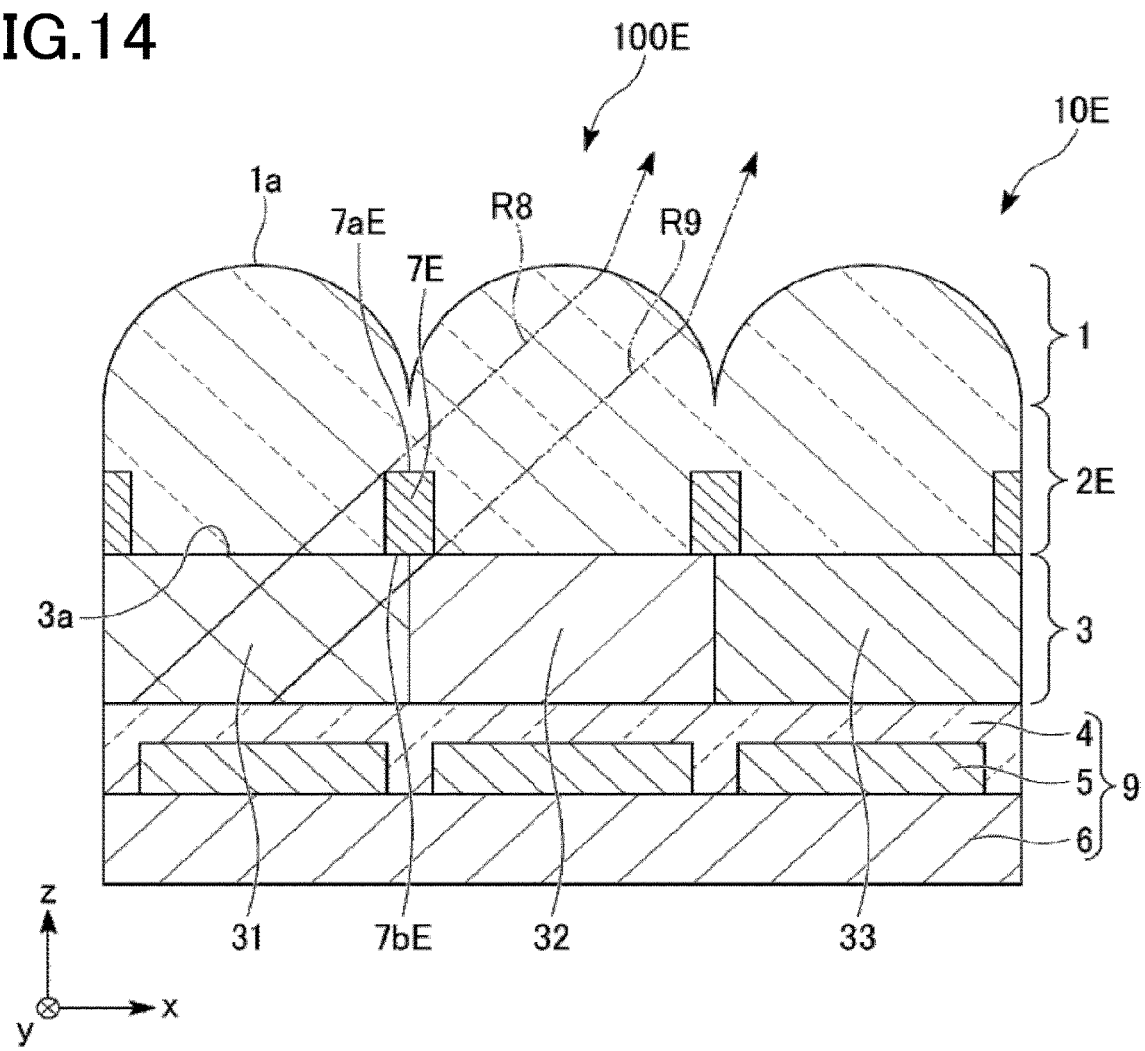
FIG. 14 is a schematic cross-sectional view illustrating an example of a display device according to a fourth modified example of the second embodiment of the present invention.

FIG. 14 is a schematic plan view illustrating an example of a display device according to a fourth modified example of the second embodiment of the present invention.

As shown in FIG. 14, an organic EL display device 100E (display device) of the fourth modified example includes a color filter 10E of the second embodiment instead of the color filter 10A of the second embodiment.

The color filter 10E includes a planarization layer 2E and the filter portion 3 instead of the planarization layer 2 and the filter portion 3A. The filter portion 3 is a layer-like portion which is the same as that in the first embodiment, and includes no light shielding wall.

The following description will be given focusing on the differences from the second embodiment.

The planarization layer 2E is the same as the planarization layer 2 of the second embodiment except that light shielding walls 7E are formed inside.

The light shielding walls 7E extend from the upper surface 3a at the boundary between the sub-pixels to the inside of the planarization layer 2E.

The color filter 10E can be manufactured by forming the filter portion 3 in the same manner as in the first embodiment, forming the light shielding walls 7E on the upper surface 3a in the same manner as in the second embodiment, and forming the planarization layer 2E and the lenses 1 on the upper surface 3a and the light shielding wall 7E.

The organic EL display device 100E of the second embodiment has the same effect as that of the second embodiment except that the light shielding walls 7E block light passing through part of the planarization layer 2E.

According to the fourth modified example, as illustrated as light beams R8 and R9, light passing above the boundary between the sub-pixels and emitted from the convex lens surfaces 1a that face the sub-pixels adjacent in the x direction can be blocked.

According to the fourth modified example, since the light shielding walls 7E are separately formed after the filter portion 3 is formed, the filter portion 3 can be easily manufactured compared with a case where the light shielding walls 7E are formed together with the filter portion 3.

Third Embodiment

A color filter and a display device according to a third embodiment of the present invention will be described.

Figure 15:
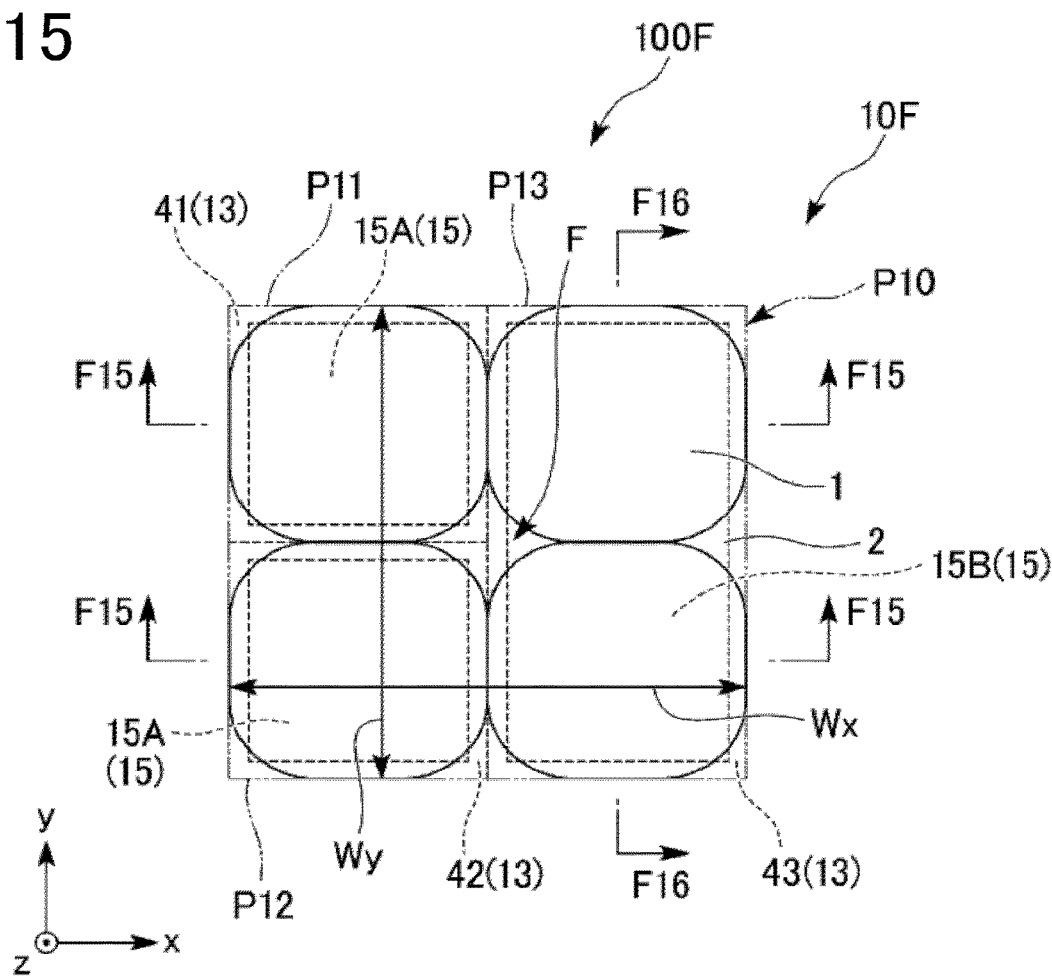
FIG. 15 is a schematic plan view illustrating an example of a display device according to a third embodiment of the present invention.
Figure 16:
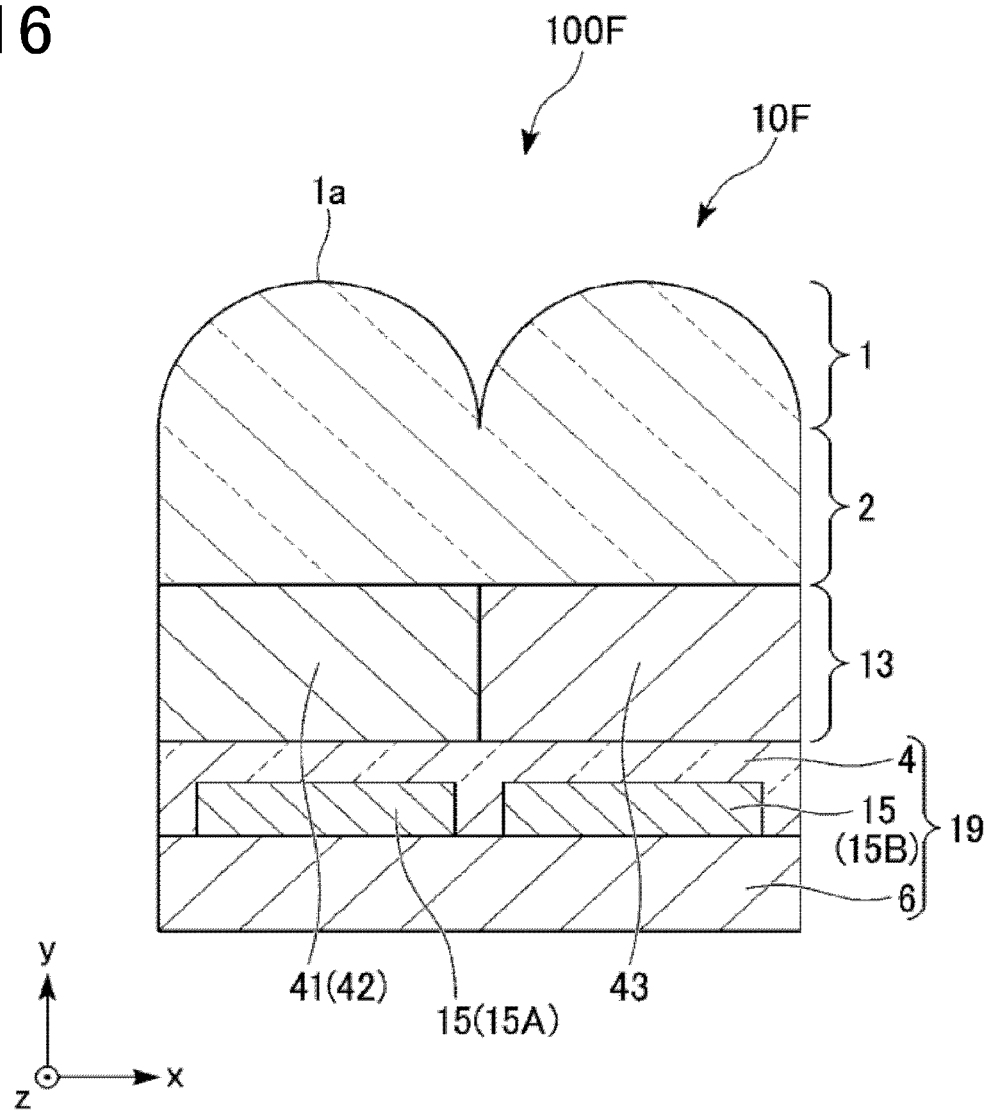
FIG. 16 is a cross-sectional view taken along the lines F15-F15 in FIG. 15.
Figure 17:
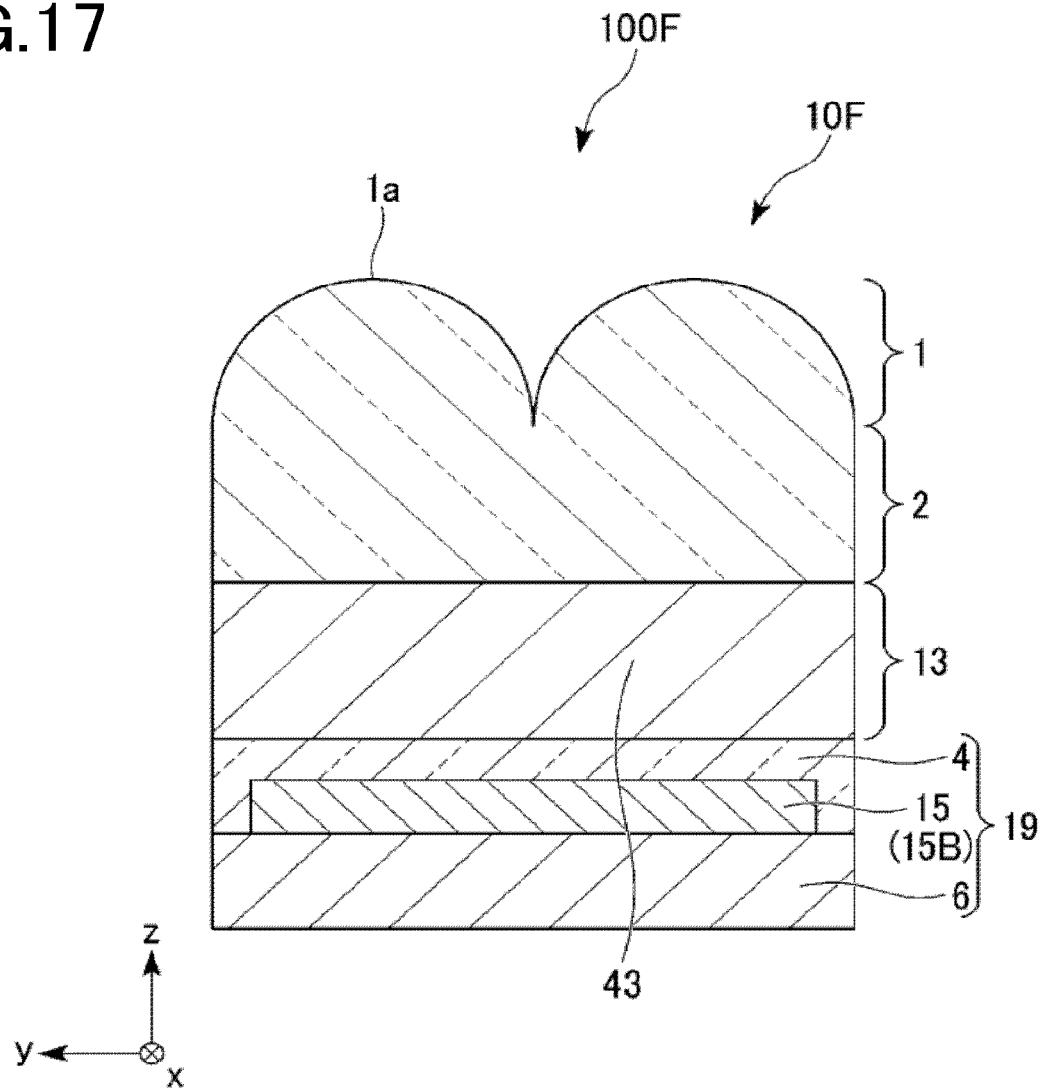
FIG. 17 is a cross-sectional view taken along the line F16-F16 in FIG. 15.

FIG. 15 is a schematic plan view illustrating an example of a display device according to the third embodiment of the present invention. FIG. 16 is a cross-sectional view taken along the lines F15-F15 in FIG. 15. FIG. 17 is a cross-sectional view taken along the line F16-F16 in FIG. 15.

As shown in FIG. 15, an organic EL display device 100F (display device) of the third embodiment includes unit pixels P10 having a rectangular shape in plan view instead of the respective unit pixels P of the organic EL display device 100 of the first embodiment. The application of the organic EL display device 100F is not specifically limited. For example, the organic EL display device 100F can be used as a display device for electronic devices such as smart glasses, head-mounted displays and electronic viewfinders, as with the organic EL display device 100.

The following description will be given focusing on the differences from the first embodiment.

Each unit pixel P10 has an x width of Wx and a y width of Wy. In particular, when Wx=Wy, the shape of the unit pixel P10 in plan view is a square.

The unit pixel P10 includes a first sub-pixel region P11, a second sub-pixel region P12 and a third sub-pixel region P13. The second sub-pixel region P12 and the first sub-pixel region P11 are arranged in this order in the y direction. The third sub-pixel region P13 is disposed adjacent to both the first sub-pixel region P11 and the second sub-pixel region P12 in the x direction.

The first sub-pixel region P11 has a rectangular shape in plan view with the x width of Wx/2 and the y width of Wy/2.

The first sub-pixel region P11 may display red, for example.

The second sub-pixel region P12 has a rectangular shape in plan view with the x width of Wx/2 and the y width of Wy/2.

The second sub-pixel region P12 may display green, for example.

The third sub-pixel region P13 has an elongated rectangular shape in plan view with the x width of Wx/2 and the y width of Wy. The third sub-pixel region P13 may display blue, for example.

As shown in FIG. 16, the organic EL display device 100F includes a main body 19 and a color filter 10F.

The main body 19 includes light emitting elements 15 instead of the light emitting elements 5 in the main body 9 of the first embodiment.

The light emitting elements 15 are the same as the light emitting elements 5 in the first embodiment except that the shape in plan view is different. Each light emitting element 15 includes light emitting elements 15A disposed in the first sub-pixel region P11 and the second sub-pixel region P12 and a light emitting element 15B disposed in the third sub-pixel region P13. For example, an organic EL element may be used as the light emitting element 15.

As shown in FIG. 16, each light emitting element 15A has a rectangular shape in plan view slightly smaller than the outer shape of each of the first sub-pixel region P11 and the second sub-pixel region P12 in which the light emitting element 15A is located. The light emitting element 15B has a rectangular shape in plan view slightly smaller than the outer shape of the third sub-pixel region P13 in which the light emitting element 15B is located.

The color filter 10F includes a filter portion 13 instead of the filter portion 3 in the color filter 10 of the first embodiment.

The filter portion 13 includes a first color layer 41 (sub-pixel, second sub-pixel), a second color layer 42 (sub-pixel, second sub-pixel) and a third color layer 43 (sub-pixel, elongated pixel, first sub-pixel) instead of the first color layer 31, the second color layer 32 and the third color layer 33 in the filter portion 3.

The first color layer 41 overlaps with the first sub-pixel region P11. The first color layer 41 may constitute, for example, a sub-pixel having a transmission wavelength range of red.

As shown in FIG. 15, the second color layer 42 is disposed adjacent to the first color layer 41 in the y direction. The second color layer 42 overlaps with the second sub-pixel region P12. The second color layer 42 may constitute, for example, a sub-pixel having a transmission wavelength range of green.

The first color layer 41 and the second color layer 42 have a rectangular shape in plan view with the x width of Wx/2 and they width of Wy/2.

The third color layer 43 overlaps with the third sub-pixel region P13. The third color layer 43 may constitute, for example, a sub-pixel having a transmission wavelength range of blue.

The first color layer 41 and the second color layer 42 are adjacent to one side of the third color layer 43 in the longitudinal direction. The third color layer 43 has a rectangular shape elongated in the y direction in plan view having the x width of Wx/2 and the y width of Wy. Therefore, the aspect ratio of the third color layer 43 is 2×Wy/Wx, which is larger than 1. The third color layer 43 is an elongated pixel. For example, when each unit pixel P is a square (Wx=Wy), the aspect ratio of the third color layer 43 is 2.

On the other hand, each aspect ratio of the first color layer 41 and the second color layer 42 adjacent to the third color layer 43 is half the aspect ratio of the third color layer 43, and smaller than the third color layer 43.

Thus, among the three sub-pixels in the filter portion 13, the first color layer 41 and the second color layer 42 constitute a first sub-pixel and a second sub-pixel, respectively. The first sub-pixel and the second sub-pixel are rectangular sub-pixels having a first transmission wavelength range and a second transmission wavelength range, respectively, corresponding to two of red, green and blue.

The third color layer 43 forms the third sub-pixel. The third sub-pixel is an elongated pixel having an aspect ratio larger than each aspect ratio of the first sub-pixel and the second sub-pixel, and has a third wavelength range different from the first transmission wavelength range and the second wavelength range among red, green and blue.

The filter portion 13 is manufactured in the same manner as the filter portion 3 except that the shape and arrangement of the sub-pixels in plan view are different.

The lenses 1 in the third embodiment are the same as the lenses 1 in the first embodiment except that four lenses are disposed in the unit pixel P10.

In the third embodiment, one lens 1 is disposed in each of the first sub-pixel region P11 and the second sub-pixel region P12, and two lenses 1 are disposed in the third sub-pixel region P13.

The lenses 1 are disposed facing the first color layer 41, the second color layer 42 and the third color layer 43 with the planarization layer 2 therebetween. Specifically, two lenses 1 facing the third color layer 43 are arranged side by side in the y direction, which is the longitudinal direction of the third color layer 43.

A gap may be formed between the adjacent lenses 1. However, as with the first embodiment, the lenses 1 in the third embodiment are densely arranged with the outer edges thereof partially in contact with each other.

As with the first embodiment, the flat portions F are formed between the lenses 1 at diagonal positions.

The color filter 10F of the third embodiment is an example in which two lenses are disposed facing the elongated pixel.

Since the organic EL display device 100F of the third embodiment has the color filter 10F in which a plurality of lenses 1 are disposed in the longitudinal direction of the third color layer 43, the front luminance and visibility are improved as in the first embodiment.

In the examples described in the above embodiments and modified examples, the aspect ratio of the elongated pixel is equal to or close to 3 or 2. However, the aspect ratio of the elongated pixel is not specifically limited as long as it is greater than 1.

The number of lenses facing the elongated pixel is not specifically limited as long as the lenses can be densely arranged in the longitudinal direction of the elongated pixel. However, when the aspect ratio of the elongated pixel is 1.5 or more, the number of lenses is preferably the number obtained by rounding the aspect ratio to the nearest whole number.

In this case, since the ratio of the length in the major axis direction to the length in the minor axis direction of the lens in plan view can be set to a value close to 1, anisotropy of the light condensing performance can be easily reduced.

In the examples described in the above embodiments and modified examples, the light emitting elements are organic EL elements. However, the type of the light emitting elements is not limited to the organic EL element. For example, the light emitting elements may be inorganic LED elements, or the like.

In the examples described in the above embodiments and modified examples, the red, green and blue sub-pixels are disposed in the first sub-pixel region, the second sub-pixel region and the third sub-pixel region, respectively. However, the colors and arrangement positions of the sub-pixels are not limited to the above as long as the unit pixels can perform color display.

Fourth Embodiment

A color filter and a display device according to a fourth embodiment of the present invention will be described.

Figure 18:
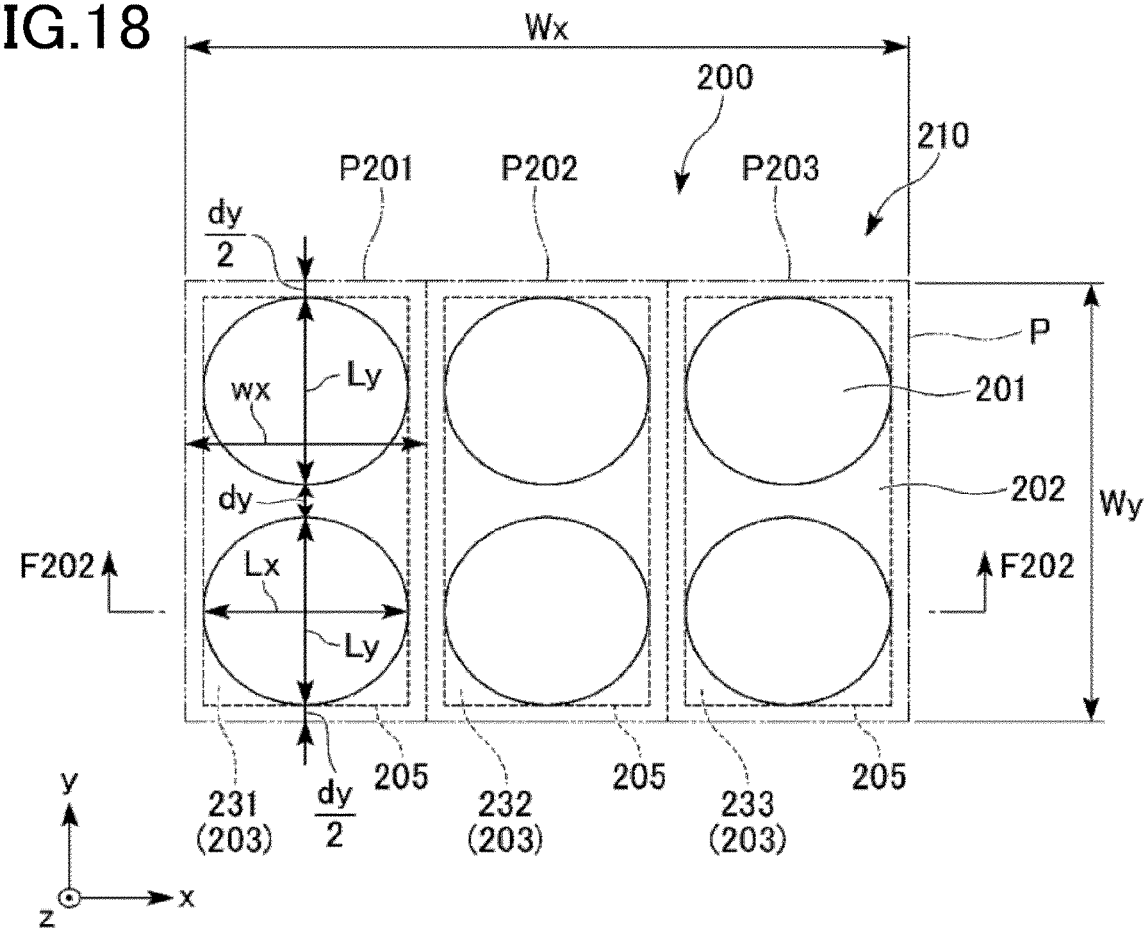
FIG. 18 is a schematic plan view illustrating an example of a display device according to a fourth embodiment of the present invention.

FIG. 18 is a schematic plan view illustrating an example of a display device according to the fourth embodiment of the present invention.

Figure 19:
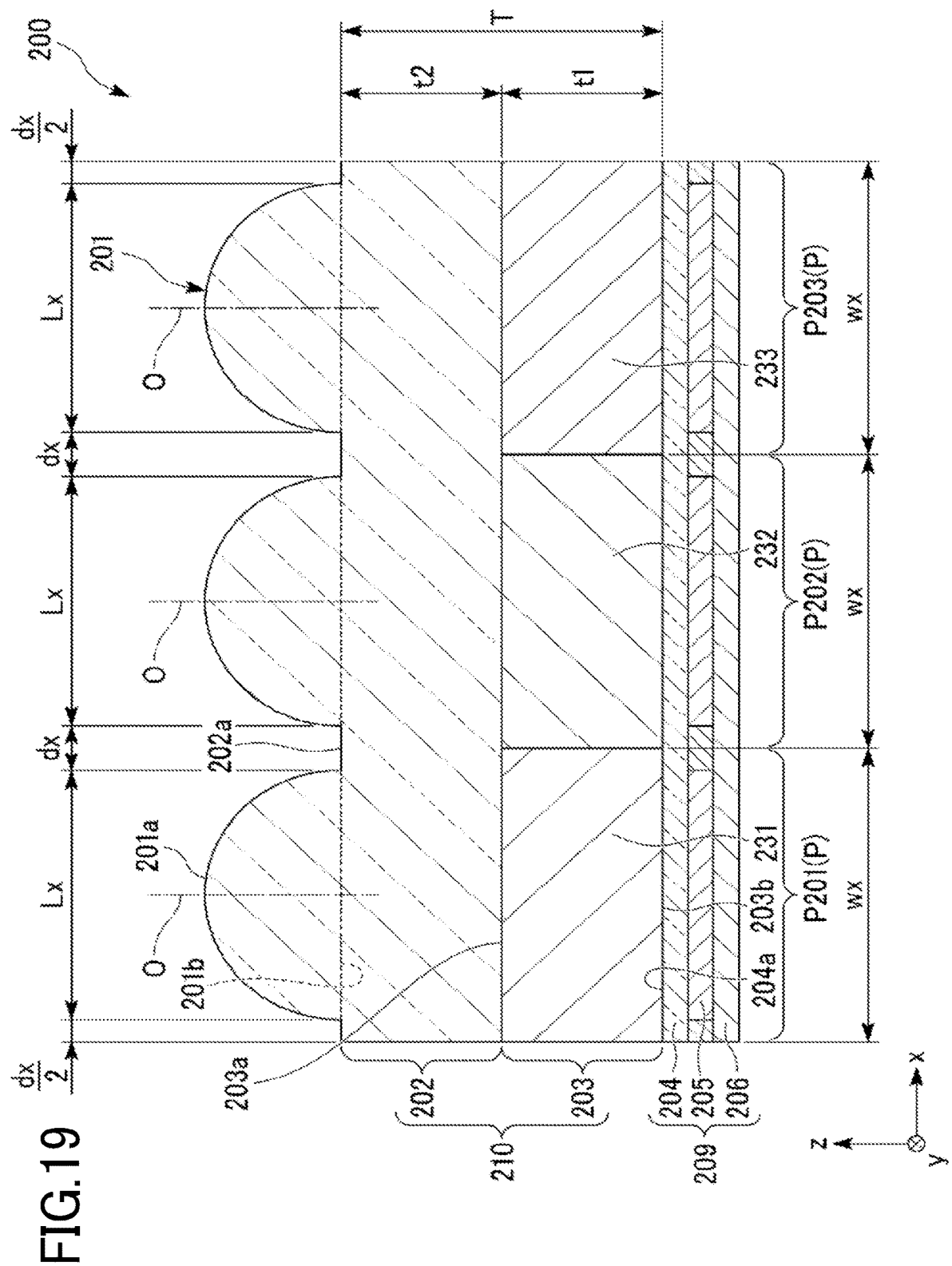
FIG. 19 is a cross-sectional view taken along the line F202-F202 in FIG. 18.

FIG. 19 is a cross-sectional view taken along the line F202-F202 in FIG. 18.

An organic EL display device 200 (display device) shown in FIG. 18 displays a color image according to image signals. The application of the organic EL display device 200 is not specifically limited. For example, the organic EL display device 200 can be used as a display device for electronic devices such as smart glasses, head-mounted displays and electronic viewfinders.

FIG. 18 illustrates a configuration of a unit pixel P in plan view of the organic EL display device 200 of the fourth embodiment. The plan view herein refers to a view from a display screen of the organic EL display device 200 toward light emitting elements. The plan view also refers to a view in a thickness direction of a filter portion 203 (described later).

The unit pixel P is a minimum region that performs color display. For example, in the organic EL display device 200, a large number of unit pixels P shown in FIG. 18 are arranged side by side in the x direction from left to right and the y direction from bottom to top of the drawing. The z direction is a direction perpendicular to the x direction and the y direction and extends from the back to the front of the drawing. The z direction and the plan view direction are opposite directions.

The outer shape of the display screen formed of all the unit pixels P of the organic EL display device 200 is a rectangle having sides in the x and y directions. Each unit pixel P has a width Wx in the x direction and a width Wy in the y direction. Wx and Wy may be equal to or different from each other.

For example, in the examples shown in FIG. 18, Wx is 1.5 times Wy.

For simplicity of the description, the width in the x direction and the width of the y direction of a region, a member, or the like may be hereinafter referred to as an x width and a y width, respectively.

The unit pixel P includes a first sub-pixel region P201, a second sub-pixel region P202 and a third sub-pixel region P203. The first sub-pixel region P201, the second sub-pixel region P202 and the third sub-pixel region P203 are arranged in this order in the x direction. The first sub-pixel region P201, the second sub-pixel region P202 and the third sub-pixel region P203 trisect the unit pixel P in the x direction.

Since all the unit pixels P in the organic EL display device 200 have the same configuration, the following description will be given of a single unit pixel P as an example.

The first sub-pixel region P201 has a rectangular shape in plan view with the x width of Wx/3 and the y width of Wy. The first sub-pixel region P201 may display red, for example.

The second sub-pixel region P202 has a rectangular shape in plan view with the x width of Wx/3 and the y width of Wy. The second sub-pixel region P202 may display green, for example.

The third sub-pixel region P203 has a rectangular shape in plan view with the x width of Wx/3 and the y width of Wy. The third sub-pixel region P203 may display blue, for example.

As shown in FIG. 19, the organic EL display device 200 includes a main body 209 and a color filter 210.

The main body 209 includes a substrate 206, light emitting elements 205 and a planarization film 204.

The shape of the substrate 206 in plan view is larger than the display screen of the organic EL display device 200. The substrate 206 may be made of, for example, a silicon substrate.

The light emitting elements 205 emit white light. For example, an organic EL element may be used as the light emitting element 205. When a DC voltage is applied across the anode and cathode of the organic EL element, electrons and holes are injected into a light-emitting layer and recombine to generate excitons. By using light emission caused by decay of the excitons, the organic EL element emits light.

The light emitting element 205 is provided in each of the first sub-pixel region P201, the second sub-pixel region P202 and the third sub-pixel region P203.

As shown in FIG. 18, each light emitting element 205 has a rectangular shape in plan view slightly smaller than the outer shape of each of the first sub-pixel region P201, the second sub-pixel region P202 and the third sub-pixel region P203 in which the light emitting element 205 is located.

In the example shown in FIG. 18, each light emitting element 205 has an x width slightly smaller than Wx/3 and a y width slightly smaller than Wy.

The light emitting element 205 is formed on a silicon substrate using, for example, a semiconductor manufacturing process.

The electrodes in each light emitting element 205 are connected to a drive circuit (not shown) through wiring formed on the substrate 206. The drive circuit controls turning on and off of the light emitting elements 205 according to image signals.

As shown in FIG. 19, the planarization film 204 covers at least the substrate 206 and the light emitting elements 205 of each unit pixel P to form a flat surface 204a on their surfaces in the z direction. The flat surface 204a is a plane extending over the entire display region of the organic EL display device 200.

The planarization film 204 covers the light emitting elements 205 to protect the light emitting elements 205. For example, the planarization film 204 prevents moisture, oxygen, and the like from coming into contact with the light emitting elements 205 to thereby prevent deterioration of the light emitting elements 205.

The planarization film 204 is made of a transparent resin material having good transmittance to visible light. The material of the planarization film 204 preferably has high barrier properties against at least one of moisture and oxygen.

The film thickness of the planarization film 204 on the light emitting elements 205 may be, for example, 0.1 μm.

The color filter 210 includes the filter portion 203, the planarization layer 202 and the lens 201 disposed in this order in the z direction.

The filter portion 203 is a layer-like portion with a thickness t1 and has an upper surface 203a and a lower surface 203b. Conditions that t1 satisfies will be described later.

The filter portion 203 covers the planarization film 204 with the lower surface 203b being in close contact with the flat surface 204a.

The filter portion 203 regulates transmission wavelength of light incident thereon from the respective light emitting elements 205 via the planarization film 204.

The filter portion 203 includes a first color layer 231 (sub-pixel), a second color layer 232 (sub-pixel) and a third color layer 233 (sub-pixel).

The first color layer 231 overlaps with the first sub-pixel region P201. The first color layer 231 may constitute, for example, a sub-pixel having a transmission wavelength range of red.

The second color layer 232 is disposed adjacent to the first color layer 231 in the x direction. The second color layer 232 overlaps with the second sub-pixel region P202. The second color layer 232 may constitute, for example, a sub-pixel having a transmission wavelength range of green.

The third color layer 233 is disposed adjacent to the second color layer 232 in the x direction. The third color layer 233 overlaps with the third sub-pixel region P203. The third color layer 233 may constitute, for example, a sub-pixel having a transmission wavelength range of blue.

In the fourth embodiment, the shapes of the first color layer 231, the second color layer 232 and the third color layer 233 in plan view in the thickness direction are rectangles elongated in the y direction, and are the same as those of the first sub-pixel region P201, the second sub-pixel region P202 and the third sub-pixel region P203, respectively. Therefore, the first color layer 231, the second color layer 232 and the third color layer 233 constituting the three sub-pixels trisect the unit pixel P in the x direction.

The first color layer 231, the second color layer 232 and the third color layer 233 each have the x width of wx (=Wx/3) and the y width of Wy.

The filter portion 203 is formed by solidifying a resin composition in which coloring materials corresponding to the respective transmission wavelength ranges are dispersed in a transparent resin.

The planarization layer 202 is a layer-like portion with a thickness t2 laminated on the upper surface 203a of the filter portion 203. Conditions that t2 satisfies will be described later.

An upper surface 202a of the planarization layer 202 is a plane parallel to the lower surface 203b of the filter portion 203.

The planarization layer 202 is made of a transparent resin material having good transmittance to visible light.

The lenses 201 are disposed facing the first color layer 231, the second color layer 232 and the third color layer 233 with the planarization layer 202 interposed therebetween in the thickness direction (z direction), and condense light that has passed through the first color layer 231, the second color layer 232 and the third color layer 233. The condensed light is externally emitted from the color filter 210 around the optical axes of the lenses 201 extending in the z direction.

As shown in FIG. 18, in the fourth embodiment, two lenses 201 are arranged side by side in the longitudinal direction (y direction) of each of the first sub-pixel region P201, the second sub-pixel region P202 and the third sub-pixel region P203. However, the number of the lenses 201 in the longitudinal direction of the first sub-pixel region P201, the second sub-pixel region P202 and the third sub-pixel region P203 may be appropriately modified depending on the length in the longitudinal direction.

They width of each lens 201 is Ly. The distance between the lenses 201 adjacent to each other in the y direction is dy. From the viewpoint of improving light extraction efficiency, smaller dy is more preferred. For example, dy may be 0.

In the example shown in FIG. 18, they width Ly of each lens is (Wy/2−dy).

The x width of each lens 201 is Lx. The distance between the lenses 201 adjacent to each other in the x direction is dx. Conditions that Lx and dx satisfy will be described later.

For example, the shape of each lens 201 in plan view is a rectangle with four rounded corners having the x width of Lx and the y width of Ly. In particular, when Lx=Ly, the shape of each lens 201 in plan view may be a circle.

In the fourth embodiment, gaps are formed at least in the x direction and between the lenses 201 at diagonal positions, and the upper surface 202a of the planarization layer 202 is exposed therethrough.

The lenses 201 are made of a transparent resin material having good transmittance to visible light. The material of the lenses 201 may be the same or different from that of the planarization layer 202. When the material of the lenses 201 is different from that of the planarization layer 202, their refractive indices may be different from each other.

In the example shown in FIG. 19, each lens 201 has a flat surface 201b and a convex lens surface 201a in this order in the z direction. The flat surface 201b is an interface with the planarization layer 202. However, when the lens 201 and the planarization layer 202 are made of the same material, the flat surface 201b is a virtual plane since no interface is formed between the lens 201 and the planarization layer 202. When the lens 201 and the planarization layer 202 have the same refractive index, the flat surface 201b does not function as a refracting surface and a reflecting surface even if the flat surface 201b is formed.

Unless otherwise specified, in the example described below, the lens 201 and the planarization layer 202 are made of the same material and have the same refractive index.

Each lens 201 is a convex lens in which the convex lens surface 201a has a positive refractive power.

The shape of the convex lens surface 201a is appropriately determined in consideration of the light condensing performance and light extraction efficiency of the lens 201. For example, each convex lens surface 201a may have a hemispherical shape convex in the z direction.

The term "hemispherical shape" as used herein includes a hemispherical surface, a spherical segment surface of a spherical segment whose height is smaller than a radius, and an aspherical surface close to the hemispherical surface or the spherical segment surface.

Due to such a shape, each lens 201 can condense light emitted from the light emitting element 205. Each lens 201 has an optical axis O extending in the z direction through the center of each lens 201.

As shown in FIG. 19, each optical axis O is located at the center of the width (lateral width) of the light emitting element 205 in the x direction.

In the color filter 210 of the fourth embodiment, when a specific sub-pixel having a first transmission wavelength range is referred to as a first sub-pixel, a sub-pixel adjacent to the first sub-pixel and having a second transmission wavelength range different from the first transmission wavelength range is referred to as a second sub-pixel, and the lenses 201 facing the first sub-pixel and second sub-pixel are referred to as a first lens and a second lens, respectively, they are formed in the shapes satisfying the following formulas (1) to (5)

<Math. 2>

$$T = t1 + t2 \quad (1)$$

$$w > T \quad (2)$$

$$d = 2 \times (w - T) \quad (3)$$

$$0.8 \times w \leq L < w \quad (4)$$

$$L = w - d \quad (5)$$

In the above formulas, t1 is the thickness of each of the first sub-pixel and the second sub-pixel, t2 is the thickness of the planarization layer 202, w is the width of each of the first sub-pixel and the second sub-pixel in the adjacent direction, L is the width of each of the first lens and the second lens in the adjacent direction, and d is the distance between the first lens and the second lens in the adjacent direction.

As indicated by formula (1), T represents the total thickness of the filter portion 203 and the planarization layer 202. In the filter portion 203 and the planarization layer 202, light emitted from the light emitting element 205 is refracted according to the refractive index difference between the filter portion 203 and the second lens, and travels substantially straight when the refractive index difference is small.

According to the condition of formula (2), the total thickness T of the filter portion 203 and the planarization layer 202 is less than the width w of each of the first sub-pixel and the second sub-pixel. When T is greater than or equal to w, the light condensing range of the first lens and the second lens for light emitted from the light emitting elements 205 is narrowed, resulting in a decrease in front luminance.

On the other hand, when light having a large emission angle is easily condensed, leakage light which is emitted from an end portion of the first sub-pixel and passes through the adjacent second sub-pixel becomes more likely to be emitted from the second lens toward the front. In this case, as the leakage light passes through the second sub-pixel, it has a tint different from the first transmission wavelength range of the first sub-pixel. When leakage light having a tint different from the first transmission wavelength range is mixed and observed, color reproducibility may be reduced depending on the intensity of leakage light.

In the fourth embodiment, in order to prevent leakage light from being emitted toward the front, a gap is formed between the lenses by providing a distance between the first lens and the second lens in the adjacent direction.

Formula (3) defines an appropriate gap size d. Formula (5) represents the width L of each of the first lens and the second lens when the distance between the lenses is d.

Formula (4) defines a range of the width L of each of the first lens and the second lens in which the front luminance is easily optimized.

When the first lens and the second lens have the width of w, a distance between the lenses becomes 0, forming no gap in the adjacent direction.

When the first lens and the second lens have the width less than 0.8×w, leakage light is less likely to be emitted toward the front, but the numerical apertures of the first lens and the second lens become too small. This results in a decrease in light extraction efficiency for display light having an appropriate transmission wavelength range and a decrease in front luminance.

In the fourth embodiment, the first color layer 231 and the second color layer and 232 adjacent to each other in the x direction within the unit pixel P, and the second color layer 232 and the third color layers 233 adjacent to each other in the x direction within the unit pixel P constitute a first sub-pixel and a second sub-pixel, respectively.

Since the first color layer 231 of the unit pixel P is adjacent to the third color layer 233 of another unit pixel P adjacent on a side opposite to the x direction, the first color layer 231 and the third color layer 233 adjacent thereto in another unit pixel P constitute a first sub-pixel and a second sub-pixel, respectively.

Since the third color layer 233 of the unit pixel P is adjacent to the first color layer 231 of another unit pixel P adjacent on the x direction side, the third color layer 233 and the first color layer 231 adjacent thereto constitute a first sub-pixel and a second sub-pixel, respectively.

In the fourth embodiment, the relationships of w=wx, d=dx, and L=Lx are satisfied in formulas (1) to (5) for any of the first sub-pixels and the second sub-pixels described above.

On the other hand, in the fourth embodiment, the sub-pixels having different transmission wavelength ranges are not adjacent to each other on the y direction side or a side opposite to the y direction within the unit pixel P or between adjacent unit pixels P. Therefore, there are no sub-pixels corresponding to the first sub-pixel and the second sub-pixel that should satisfy formulas (1) to (5) on the y direction side or the side opposite to the y direction. For example, dy is more preferably a value closer to 0 in the y direction and the direction opposite to the y direction.

The organic EL display device 200 can be manufactured by forming light emitting elements 205 on a substrate 206 using a semiconductor manufacturing process, laminating a planarization film 204 on the substrate 206 and the light emitting elements 205 to form a main body 209, and forming a filter portion 203, a planarization layer 202 and lenses 201 on the flat surface 204a.

The filter portion 203 can be formed by, for example, preparing resin compositions in which each coloring material for forming the first color layer 231, the second color layer 232 and the third color layer 233 is dispersed in a photosensitive resin, and exposing and developing the resin compositions through a pattern mask by photolithography to form a cured layer of the resin compositions on the flat surface 204a.

The lenses 201 can be formed by, for example, forming a resin layer for forming a planarization layer 202 and lenses 201 on the filter portion 203, and then etching the surface of the resin layer into the shapes of a convex lens surface 201a of the lenses 201 and a flat portion F by an etch-back method. The planarization layer 202 is formed by a non-etched portion of the layer-like portion of the resin layer.

The following description will be given of the effects of the organic EL display device 200, focusing on the effects of the color filter 210.

Figure 20:
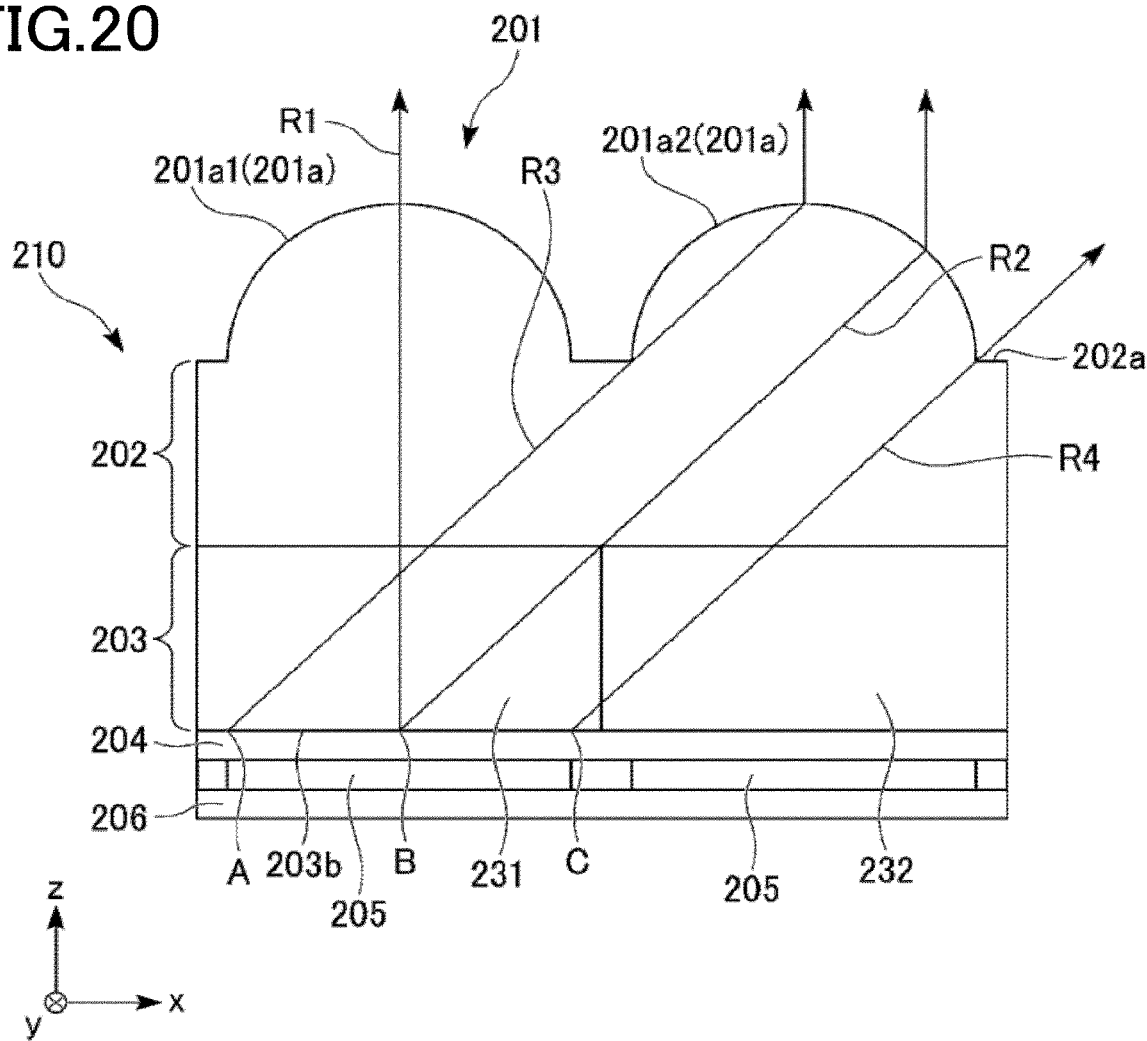
FIG. 20 is a schematic ray diagram illustrating an effect of a color filter according to the fourth embodiment of the present invention.

FIG. 20 is a schematic ray diagram illustrating an effect of a color filter according to the fourth embodiment of the present invention.

In the organic EL display device 200, the light emitting element 205 facing the first color layer 231 is controlled to emit light in response to an image signal of a red component (hereinafter, referred to as an R signal). Similarly, the light emitting element 205 facing the second color layer 232 and the light emitting element 205 facing the third color layer 233 are controlled to emit light in response to an image signal of a green component (hereinafter, referred to as a G signal) and an image signal of a blue component (hereinafter, referred to as a B signal), respectively.

In the unit pixel P, light from the light emitting element 205 driven by the R signal, light from the light emitting element 205 driven by the G signal and light from the light emitting element 205 driven by the B signal are externally emitted through the first color layer 231, the second color layer 232 and the third color layer 233, respectively, whereby colors faithful to the image signals are displayed.

FIG. 20 illustrates light beams that enter the lower surface 203b of the first color layer 231 at points A, B and C. The points A, B and C are points facing an end portion on a side opposite to the x direction, a center part in the x direction, and an end portion on the x direction side of the light emitting element 205 that faces the first color layer 231, respectively, in the z direction.

For example, the light beam R1 traveling in the z direction from the point B passes through, in sequence, the first color layer 231, the planarization layer 202, and the convex lens surface 201a1 that faces the first color layer 231, and is then emitted in the z direction.

For example, the light beam R2 enters the first color layer 231 at the point B and is deviated toward the x direction as it travels in the z direction. The angle of the light beam R2 relative to the z direction may be, for example, up to approximately 45° for obtaining appropriate light extraction efficiency.

In this case, since the color filter 210 in the fourth embodiment satisfies formulas (1) to (5), the light beam R2 passes through, in sequence, the first color layer 231, the planarization layer 202, and the convex lens surface 201a2 that faces the second color layer 232, and is then emitted in the z direction. It should be noted that the light beam R2 may be emitted in a direction inclined relative to the z direction depending on the light condensing performance of the convex lens surface 201a2. However, even when the light beam R2 deviates from the z direction, the deviation from the z direction does not become significantly large since the light beam R2 is refracted at the convex lens surface 201a2. In FIG. 20, the light beam R2 is schematically illustrated as traveling in the z direction. The same applies to other light beams emitted from the convex lens surface 201a.

In the following description, unless otherwise specified, the term "light beam travels in the z direction" includes the cases where the light beam travels strictly in the z direction, and substantially in the z direction.

The light beams R1 and R2 that enter the first color layer 231 at the point B, pass through the first color layer 231 and subsequently through the planarization layer 202, and are then emitted from the convex lens surface 201a1 that faces the first color layer 231 and the convex lens surface 201a2 adjacent thereto in the x direction, respectively, are both red light.

The light beam R3 emitted from the point A and traveling parallel with the light beam R2 passes through the first color layer 231 and subsequently through the planarization layer 202, and is then emitted from the convex lens surface 201a2 in the z direction without passing through the second color layer 232. Therefore, the light beam R3 is red light.

The light beams R1 and R2 form red light according to the R signal.

According to the fourth embodiment, the light beams R2 and R3 emitted obliquely from the light emitting element 205 are also emitted in the z direction via the convex lens surface 201a2 adjacent in the x direction. Therefore, the front luminance of the red light can be improved compared with the case where the light beams R2 and R3 travel substantially straight in an oblique direction.

The light beam R4 emitted from the point C and traveling parallel with the light beam R2 passes through the first color layer 231 and subsequently through the second color layer 232 and the planarization layer 202, and is then emitted from the upper surface 202a.

The color of the light beam R4 is close to green since the length passing through the second color layer 232 is longer than the length passing through the first color layer 231. Since the light beam R4 is close to green and emitted according to the R signal, it causes an error in green components in the unit pixel P when observed as mixed with the display light.

In the fourth embodiment, the light beam R4 is emitted from the upper surface 202a having no refractive power. Although the light beam R4 is refracted at the upper surface 202a according to Snell's law, it travels substantially straight compared with the case of passing through the convex lens surface 201a. Therefore, the light beam R4 travels in a direction inclined by substantially 45° relative to the z direction.

Since the light beam R4 travels in a direction inclined relative to the front by substantially 45° in the x direction, the light beam R4 is not mixed with the display light of the unit pixel P when observed mainly from the front, which reduces color mixing in an observation direction mainly from the front and improves color reproducibility.

The following description will be given of the effects of the fourth embodiment in comparison with conventional examples.

Figure 21:
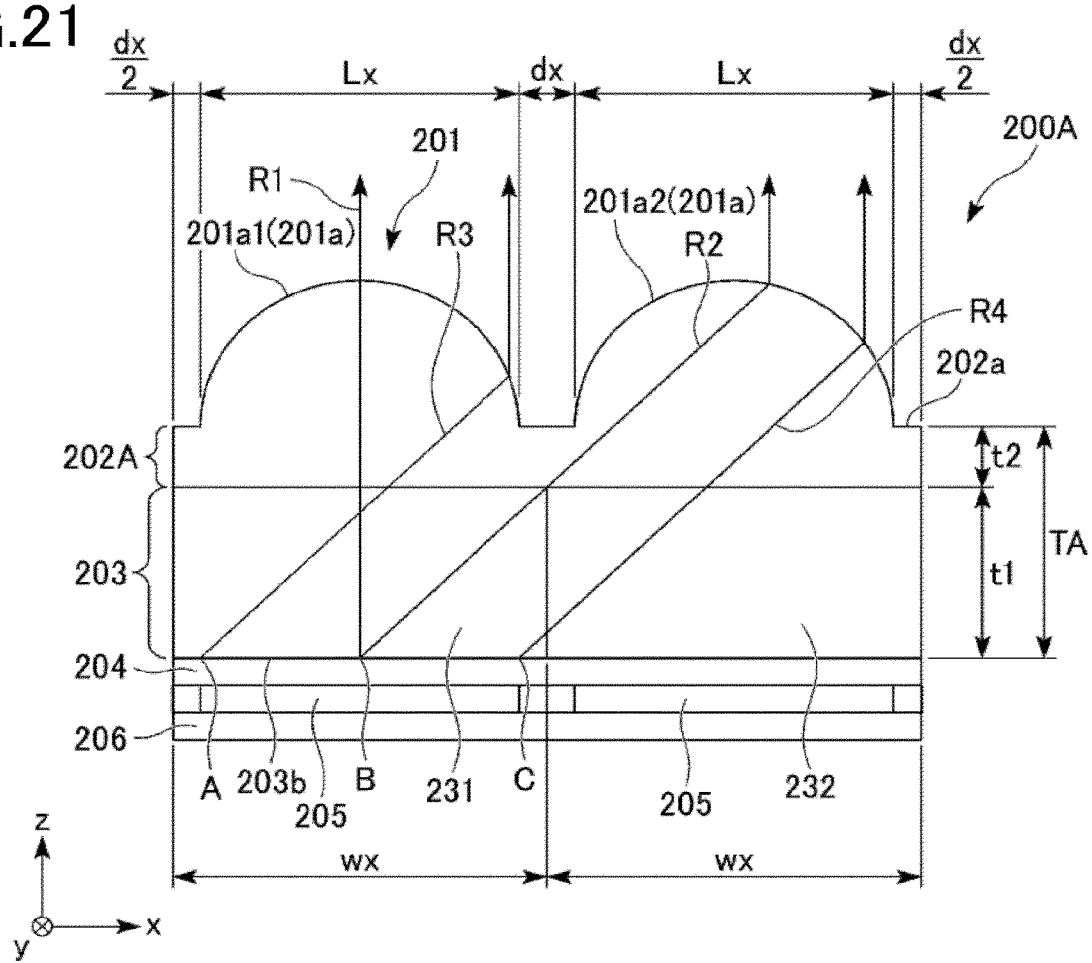
FIG. 21 is a schematic ray diagram illustrating an effect of a color filter of Conventional Example 2.
Figure 22:
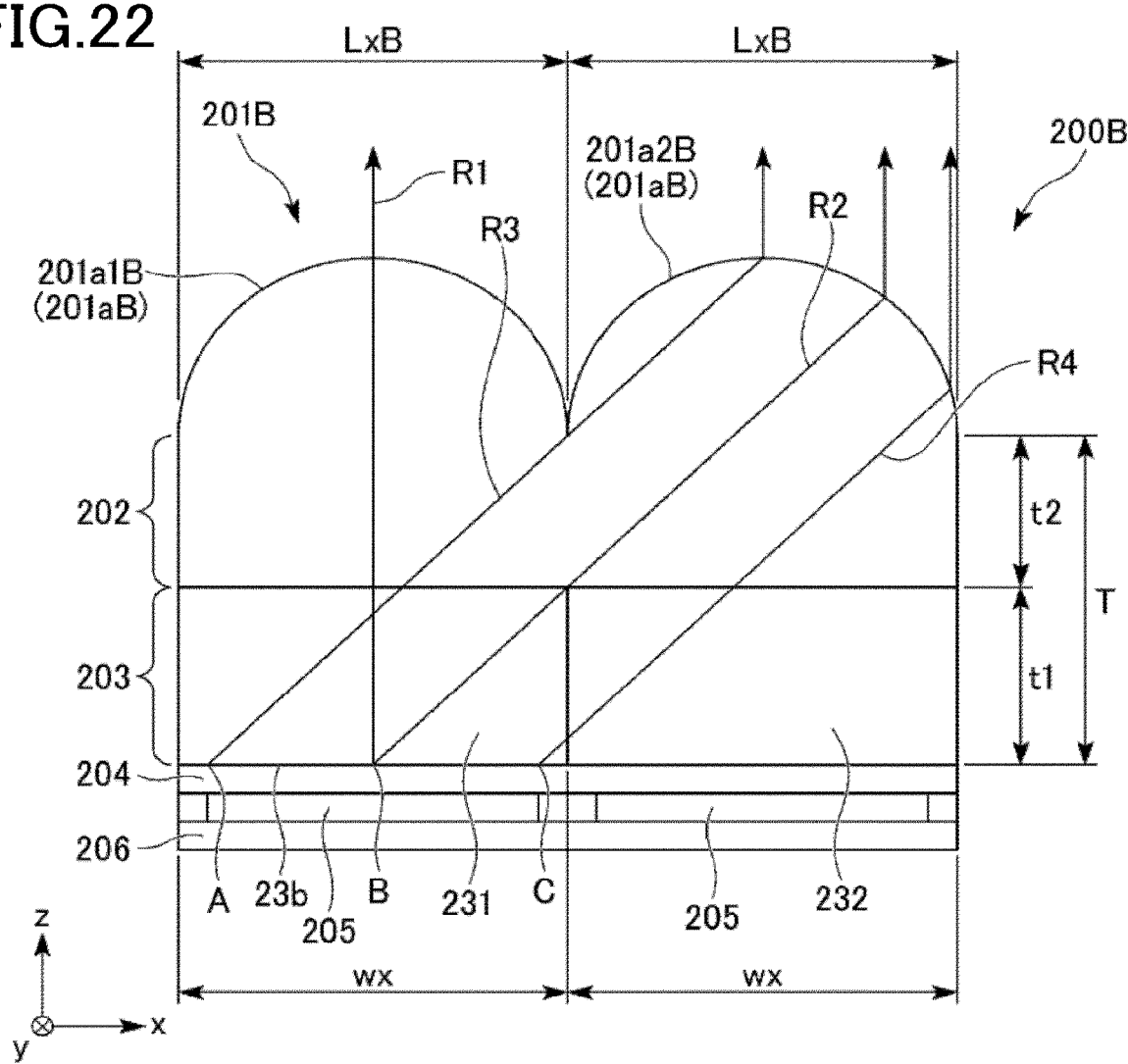
FIG. 22 is a schematic ray diagram illustrating an effect of a color filter of Conventional Example 3.
Figure 23:
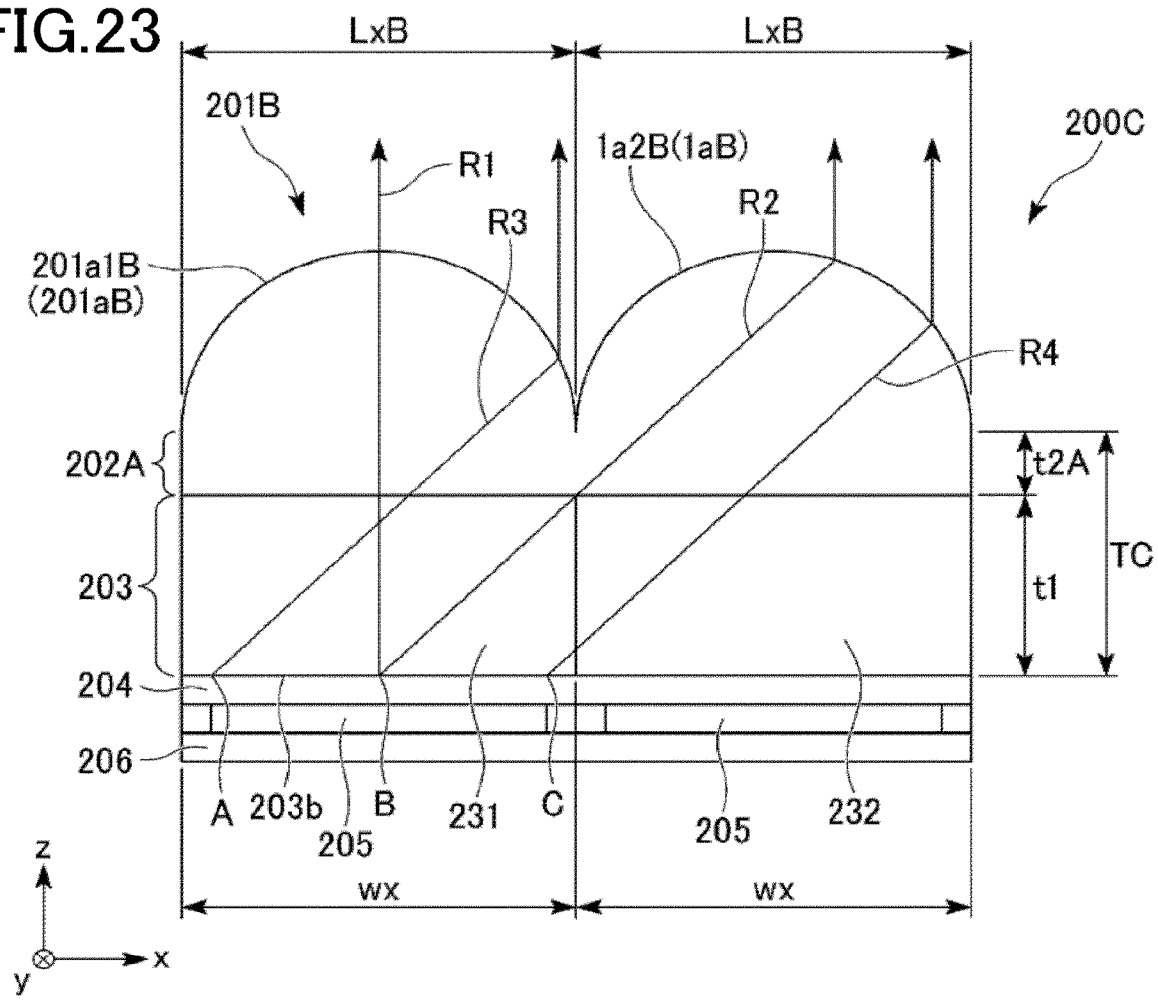
FIG. 23 is a schematic ray diagram illustrating an effect of a color filter of Conventional Example 4.

FIG. 21 is a schematic ray diagram illustrating an effect of a color filter of Conventional Example 2. FIG. 22 is a schematic ray diagram illustrating an effect of a color filter of Conventional Example 3. FIG. 23 is a schematic ray diagram illustrating an effect of a color filter of Conventional Example 4.

As shown in FIG. 21, an organic EL display device 200A of Conventional Example 2 has the same configuration as that of the organic EL display device 200 except that it has a planarization layer 202A instead of the planarization layer 202 of the organic EL display device 200.

The planarization layer 202A is the same as the planarization layer 202 except that a thickness t2 of the planarization layer 202A is smaller than t2 of the planarization layer 202.

Therefore, Conventional Example 2 is an example in which TA=t1+t2 is smaller than T in the fourth embodiment. Conventional Example 2 is an example that does not satisfy the relationship of formula (3) due to the planarization layer 202A having a small thickness.

In Conventional Example 2, although the height of each of the convex lens surface 201a and the upper surface 202a measured from the upper surface 203a is reduced, the light beam R1 is emitted in the same manner as in the fourth embodiment. Although the light beams R2 and R3 are emitted from the convex lens surface 201a at positions different from those in the fourth embodiment, they are emitted in the same direction as in the embodiment.

On the other hand, since the light beam R4 in Conventional Example 2 is emitted through the convex lens surface 201a2 due to the reduced height of the convex lens surface 201a2, the light beam R4 is emitted in the z direction similarly to the light beam R2.

Therefore, in observation from the front, the greenish light beam R4 is mixed with the display light, causing color mixing. This reduces color reproducibility.

As shown in FIG. 22, an organic EL display device 200B of Conventional Example 3 has the same configuration as that of the organic EL display device 200 except that it has lenses 201B instead of the lenses 201 of the organic EL display device 200.

The lenses 201B have a convex lens surface 201aB instead of the convex lens surface 201a of the lenses 201. The lenses 201B are the same as the lenses 201 except that the width in the x direction is LxB, which is equal to wx.

Therefore, Conventional Example 3 is an example in which a distance between the lenses 201B is 0 since L equal to w, when w is greater than T. Conventional Example 3 is an example that does not satisfy the relationships of formulas (3) and (4) due to the lenses 201B in the adjacent direction having a width that is too large.

In Conventional Example 3, at least in a cross-section in the adjacent direction (perpendicular to the y direction), convex lens surfaces 201a1B and 201a2B adjacent to each other, among the convex lens surfaces 201aB, are in contact with each other. Accordingly, the upper surface 202a is not exposed between the lenses 201B.

In Conventional Example 3, in addition to the light beams R1, R2 and R3 being emitted in the z direction, the light beam R4 is emitted in the z direction from the convex lens surface 201a2B similarly to the light beam R2.

Therefore, in observation from the front, the greenish light beam R4 is mixed with the display light, causing color mixing. This reduces color reproducibility.

As shown in FIG. 23, an organic EL display device 200C of Conventional Example 4 has the same configuration as that of the organic EL display device 200 except that it has a planarization layer 202A and lenses 201B instead of the planarization layer 202 and the lenses 201 of the organic EL display device 200. Conventional example 4 is a combination of Conventional Example 2 and Conventional Example 3.

Accordingly, Conventional Example 4 is an example that does not satisfy the relationships of formula (3) and (4) similarly to Conventional Examples 2 and 3.

In Conventional Example 4, in addition to the light beams R1, R2 and R3 being emitted in the z direction as in Conventional Example 3, the light beam R4 is emitted in the z direction from the convex lens surface 201a2B similarly to the light beam R2.

Therefore, in observation from the front, the greenish light beam R4 is mixed with the display light, causing color mixing. This reduces color reproducibility.

The above description is given using an example in which an oblique light beam is deviated toward the x direction as it travels in the z direction. For the description of an example in which an oblique light beam is deviated toward the direction opposite to the x direction as it travels in the z direction, the x direction in the above description should be replaced with the direction opposite to the x direction.

Although the above description is given using an example in which the first sub-pixel and the second sub-pixel are the first color layer 231 and the second color layer 232, respectively, other combinations may be applied to the first sub-pixel and the second sub-pixel.

As described above, according to the organic EL display device 200 of the fourth embodiment, in which the color filter 210 is provided which satisfies formulas (1) to (5) for the first sub-pixel and second sub-pixel and the first lens and second lens both adjacent to each other in the x direction, the front luminance and color reproducibility are improved.

For reducing color mixing, it is possible to provide light shielding walls between adjacent sub-pixels or adjacent lenses. However, providing such light shielding walls with high accuracy may cause an increase in the manufacturing cost. Further, light that reaches the light shielding walls is absorbed even if it does not cause color mixing, and this may cause a decrease in light extraction efficiency and front luminance.

On the other hand, according to the fourth embodiment, in which no light shielding wall is provided, the configuration of the color filter 210 is simplified. As a result, the manufacturing cost can be suppressed and the front luminance is likely to be improved.

Fifth Embodiment

A color filter and a display device according to a fifth embodiment of the present invention will be described.

Figure 24:
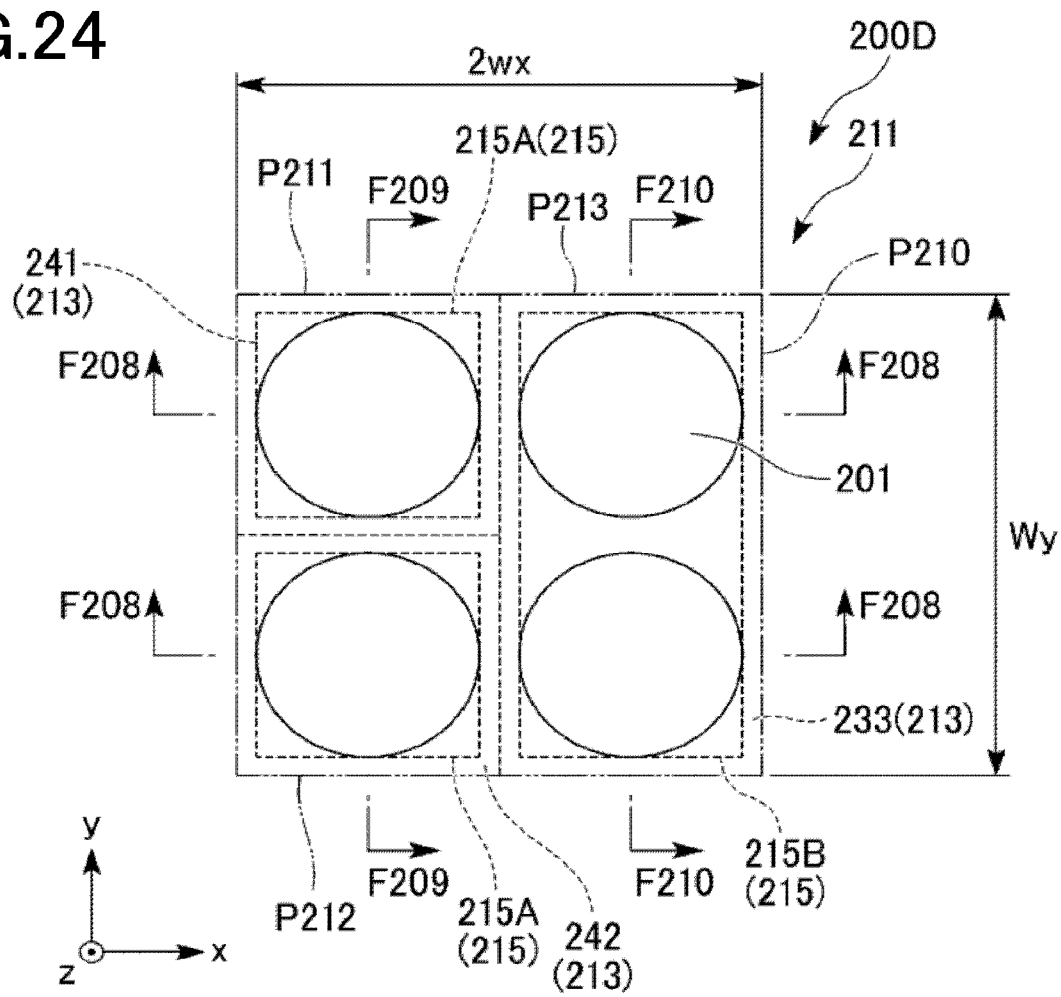
FIG. 24 is a schematic plan view illustrating an example of a display device according to a fifth embodiment of the present invention.

FIG. 24 is a schematic plan view illustrating an example of a display device according to the fifth embodiment of the present invention.

Figure 25:
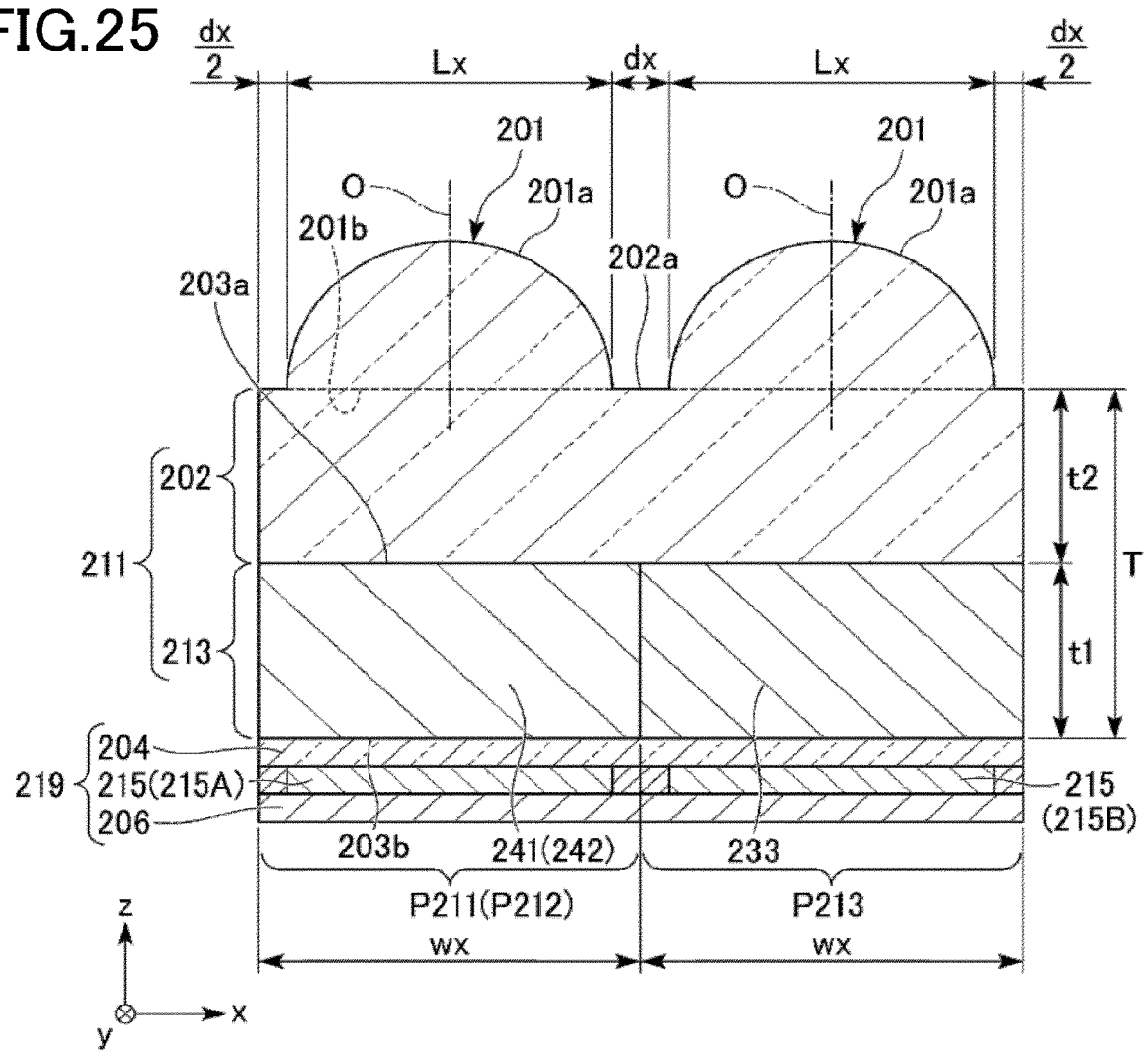
FIG. 25 is a cross-sectional view taken along the lines F208-F208 in FIG. 24.
Figure 26:
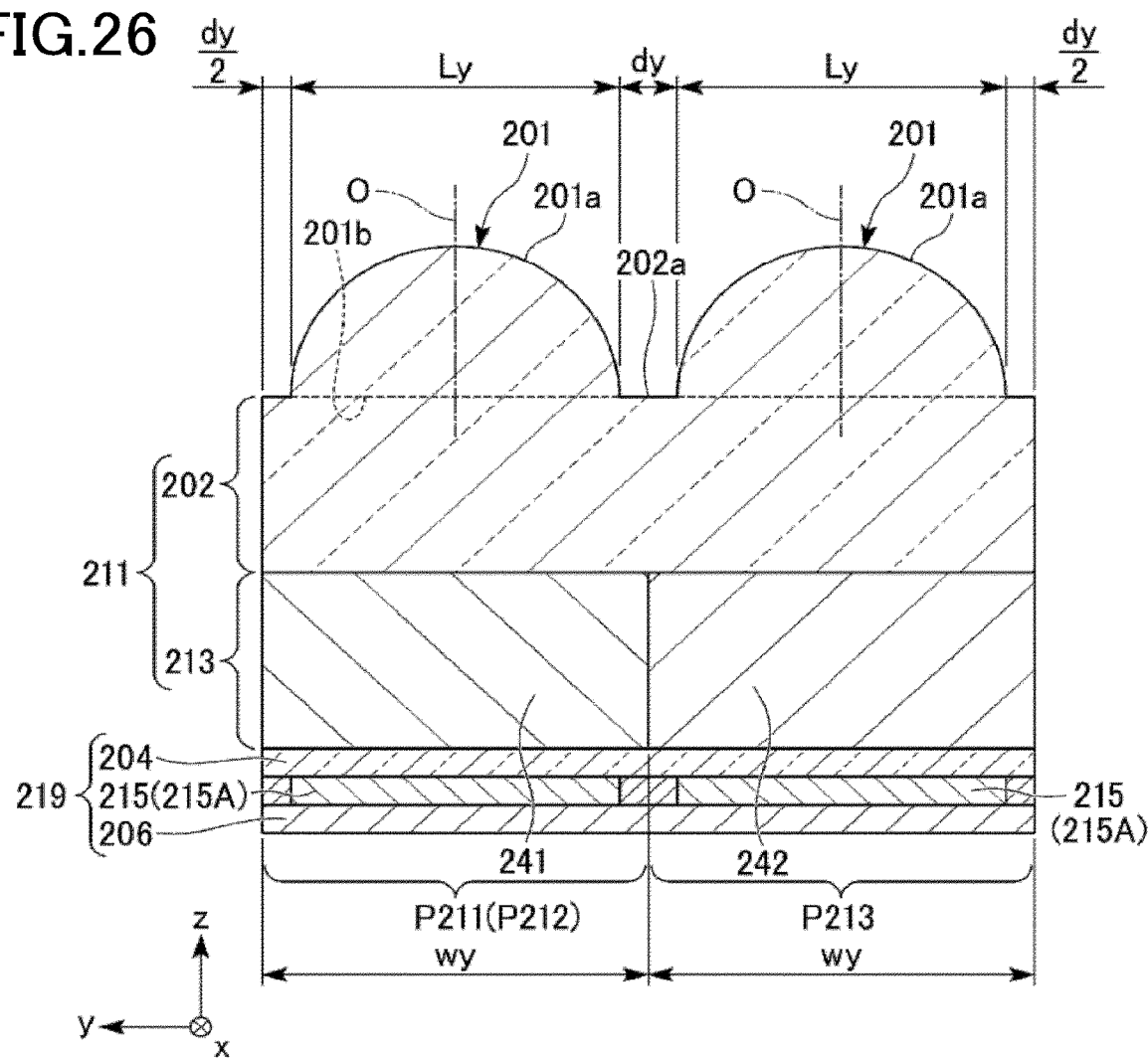
FIG. 26 is a cross-sectional view taken along the line F209-F209 in FIG. 24.

FIG. 25 is a cross-sectional view taken along the lines F208-F208 in FIG. 24. FIG. 26 is a cross-sectional view taken along the line F209-F209 in FIG. 24. FIG. 27 is a cross-sectional view taken along the line F210-F210 in FIG. 24.

As shown in FIG. 24, an organic EL display device 200D (display device) of the fifth embodiment includes unit pixels P210 having a rectangular shape in plan view instead of the respective unit pixels P of the organic EL display device 200 of the fourth embodiment. The application of the organic EL display device 200D is not specifically limited. For example, the organic EL display device 200D can be used as a display device for electronic devices such as smart glasses, head-mounted displays and electronic viewfinders, as with the organic EL display device 200.

The following description will be given focusing on the differences from the fourth embodiment.

Each unit pixel P210 has an x width of 2×wx and a y width of Wy. In particular, when 2×wx=Wy, the shape of the unit pixel P210 in plan view is a square.

The unit pixel P210 includes a first sub-pixel region P211, a second sub-pixel region P212 and a third sub-pixel region P213. The second sub-pixel region P212 and the first sub-pixel region P211 are arranged in this order in the y direction. The third sub-pixel region P213 is disposed adjacent to both the first sub-pixel region P211 and the second sub-pixel region P212 in the x direction.

The first sub-pixel region P211 has a rectangular shape in plan view with the x width of wx and they width of Wy/2. The first sub-pixel region P211 may display red, for example.

The second sub-pixel region P212 has a rectangular shape in plan view with the x width of wx and the y width of Wy/2. The second sub-pixel region P212 may display green, for example.

The third sub-pixel region P213 has an elongated rectangular shape in plan view with the x width of wx and the y width of Wy. The third sub-pixel region P213 may display blue, for example.

As shown in FIG. 25, the organic EL display device 200D includes a main body 219 and a color filter 211.

The main body 219 includes light emitting elements 215 instead of the light emitting elements 205 in the main body 209 of the fourth embodiment.

The light emitting elements 215 are the same as the light emitting elements 205 in the fourth embodiment except that the shape in plan view is different. Each light emitting element 215 includes light emitting elements 215A disposed in the first sub-pixel region P211 and the second sub-pixel region P212 and a light emitting element 215B disposed in the third sub-pixel region P213. For example, an organic EL element may be used as the light emitting element 215.

As shown in FIG. 24, each light emitting element 215A has a rectangular shape in plan view slightly smaller than the outer shape of each of the first sub-pixel region P211 and the second sub-pixel region P212 in which the light emitting element 215A is located.

The light emitting element 215B has a rectangular shape in plan view slightly smaller than the outer shape of the third sub-pixel region P213 in which the light emitting element 215B is located.

The color filter 211 includes a filter portion 213 instead of the filter portion 203 in the color filter 210 of the fourth embodiment.

The filter portion 213 includes a first color layer 241 (sub-pixel) and a second color layer 242 (sub-pixel) instead of the first color layer 231 and the second color layer 232 of the filter portion 203.

The first color layer 241 overlaps with the first sub-pixel region P211. The first color layer 241 may have, for example, a transmission wavelength range of red.

As shown in FIG. 26, the second color layer 242 is disposed adjacent to the first color layer 241 in the y direction. The second color layer 242 overlaps with the second sub-pixel region P212. The second color layer 242 may have, for example, a transmission wavelength range of green.

The first color layer 241 and the second color layer 242 have a rectangular shape in plan view with the x width of wx and the y width of wy (=Wy/2).

As shown in FIGS. 25 and 26, the third color layer 233 in the fifth embodiment is the same as that in the fourth embodiment except that it overlaps with the third sub-pixel region P213. The third color layer 233 has a rectangular shape elongated in the y direction in plan view having the x width of wx and the y width of 2×wy.

The filter portion 213 is manufactured in the same manner as the filter portion 203 except that the shape and arrangement of the sub-pixels in plan view are different.

The lenses 201 in the fifth embodiment are the same as the lenses 201 in the fourth embodiment except that four lenses are disposed in the unit pixel P210.

In the fifth embodiment, one lens 201 is disposed in each of the first sub-pixel region P211 and the second sub-pixel region P212, and two lenses 201 are disposed in the third sub-pixel region P213.

The lenses 201 are disposed facing the first color layer 241, the second color layer 242 and the third color layer 233 with the planarization layer 202 therebetween. Specifically, two lenses 201 facing the third color layer 233 are arranged side by side in the y direction, which is the longitudinal direction of the third color layer 233.

As shown in FIG. 25, a gap dx is formed between the lenses 201 adjacent to each other in the x direction as in the fourth embodiment.

As shown in FIGS. 26 and 27, a gap dy is formed between the lenses 201 adjacent to each other in the y direction as in the fourth embodiment.

In the fifth embodiment, the first color layer 241 and the third color layer 233 adjacent to each other in the x direction within the unit pixel P210, and the second color layer 242 and the third color layer 233 adjacent to each other in the x direction within the unit pixel P210 constitute a first sub-pixel and a second sub-pixel, respectively.

Since the first color layer 241 of the unit pixel P210 is adjacent to the third color layer 233 of another unit pixel P210 adjacent on a side opposite to the x direction, the first color layer 241 and the third color layer 233 adjacent thereto in another unit pixel P210 constitute a first sub-pixel and a second sub-pixel, respectively. Similarly, the second color layer 242 and the third color layer 233 adjacent thereto in another unit pixel P210 constitute a first sub-pixel and a second sub-pixel, respectively.

Similarly, the third color layer 233 of the unit pixel P210 and the first color layer 241 or the second color layer 242 of another unit pixel P210 adjacent on the x direction side constitute a first sub-pixel and a second sub-pixel, respectively.

In the fifth embodiment, the relationships of w=wx, d=dx, and L=Lx are satisfied in formulas (1) to (5) for any of the first sub-pixels and the second sub-pixels described above adjacent to each other in the x direction.

In the fifth embodiment, the first color layer 241 and the second color layer 242 adjacent to each other in the y direction within the unit pixel P210 constitute a first sub-pixel and a second sub-pixel, respectively.

Since the first color layer 241 of the unit pixel P210 is adjacent to the second color layer 242 of another unit pixel P210 adjacent on the y direction side, the first color layer 241 and the second color layer 242 adjacent thereto in another unit pixel P210 constitute a first sub-pixel and a second sub-pixel, respectively. Similarly, the second color layer 242 and the first color layer 241 adjacent thereto in another unit pixel P210 constitute a first sub-pixel and a second sub-pixel, respectively.

In the fifth embodiment, the relationships of w=wy, d=dy, and L=Ly are satisfied in formulas (1) to (5) for any of the first sub-pixels and the second sub-pixels described above adjacent to each other in the y direction.

The organic EL display device 200D of the fifth embodiment has the same configuration as that of the organic EL display device 200 except that the shape and arrangement of the sub-pixels in the color filter 211 are different.

According to the organic EL display device 200D, in which the color filter 211 is provided which satisfies formulas (1) to (5) for the first sub-pixel and second sub-pixel and the first lens and second lens both adjacent to each other in the x direction and the y direction, the front luminance and color reproducibility are improved as in the fourth embodiment.

In the examples described in the above embodiments, the light emitting elements are organic EL elements. However, the type of the light emitting elements is not limited to the organic EL element. For example, the light emitting elements may be inorganic LED elements, or the like.

In the examples described in the above embodiments, the red, green and blue sub-pixels are disposed in the first sub-pixel region, the second sub-pixel region and the third sub-pixel region, respectively. However, the colors and arrangement positions of the sub-pixels are not limited to the above as long as the unit pixels can perform color display.

EXAMPLES

Examples 1 and 2 and Comparative Examples 1 and 2 of the color filter and the display device according to the first and third embodiments will be described below. Table 1 below shows the configurations and evaluation results of Examples 1 and 2 and Comparative Examples 1 and 2.

TABLE 1

|  | Size of sub-pixel (μm) | | | Outer shape of lens (μm) | | | Number of lenses | | | Visibility evaluation | |
| --- | --- | --- | --- | --- | --- | --- | --- | --- | --- | --- | --- |
|  | R | G | B | R | G | B | R | G | B | Front | Oblique |
| Example 1 | 3 × 9 | 3 × 9 | 3 × 9 | 3 × 3 | 3 × 3 | 3 × 3 | 3 | 3 | 3 | A | A |
| Example 2 | 4.5 × 4.5 | 4.5 × 4.5 | 4.5 × 9 | 4.5 × 4.5 | 4.5 × 4.5 | 4.5 × 4.5 | 1 | 1 | 2 | A | A |
| Comparative Example 1 | 3 × 9 | 3 × 9 | 3 × 9 | 3 × 9 | 3 × 9 | 3 × 9 | 1 | 1 | 1 | B | B |
| Comparative Example 2 | 4.5 × 4.5 | 4.5 × 4.5 | 4.5 × 9 | 4.5 × 4.5 | 4.5 × 4.5 | 4.5 × 9 | 1 | 1 | 1 | B | B |

TABLE 2

|  |  | RR-1 | GR-1 | BR-1 |
| --- | --- | --- | --- | --- |
| Coloring material (colorant) | | R-1 | G-1 | B-1 |
| Colorant concentration (%) | | 45.0 | 45.0 | 40.0 |
| Solid content (%) | | 20 | 20 | 20 |
| Composition (pts. wt) | Coloring material | 64.29 | 64.29 | 57.14 |
|  | Resin | 5.54 | 5.54 | 8.92 |
|  | Monomer | 4.00 | 4.00 | 4.00 |
|  | Initiator | 0.60 | 0.60 | 0.60 |
|  | Chain transfer agent | 0.20 | 0.20 | 0.20 |
|  | Solvent | 25.37 | 25.37 | 29.14 |
| Total | | 100 | 100 | 100 |

In Table 2, the "resin" is a binder and the "monomer" is a curing agent. The initiator is an additive for causing a radical polymerization reaction of the curing agent. The chain transfer agent is an additive for promoting radical polymerization.

A red coloring material R-1 used in the photosensitive resin composition RR-1 was prepared as follows.

Example 1

Example 1 is an example corresponding to the first embodiment.

The unit pixel P in Example 1 had a size of Wx=Wy=9 (μm), and each of the first sub-pixel region P1, the second sub-pixel region P2 and the third sub-pixel region P3 had the x width×y width of 3 μm×9 μm.

As shown in Table 1, each of the first color layer 31 (sub-pixel R in Table 1), the second color layer 32 (sub-pixel G in Table 1) and the third color layer 33 (sub-pixel B in Table 1) had the x width×y width of 3 μm×9 μm.

Three lenses 1 were provided facing each sub-pixel. Each lens 1 had the x width×y width of 3 μm×3 μm.

For manufacturing an organic EL display device 100 of Example 1, a TFT layer was formed on a silicon substrate using a known method such as sputtering or etching. Further, a white organic EL element was formed on the TFT layer using a known method such as vapor deposition, and then silicon nitride was applied thereon by a CVD method. Thus, an organic EL element substrate was formed.

The silicon substrate and the white organic EL element correspond to the substrate 6 and the light emitting element 5, respectively.

For manufacturing a filter portion 3, red, green and blue photosensitive resin compositions of RR-1, GR-1 and BR-1 having the compositions shown in Table 2 below were prepared. The photosensitive resin compositions can also be referred to as photosensitive coloring compositions.

A mixture MR having the following composition was stirred and mixed homogeneously, and then dispersed for 5 hours with a sand mill using glass beads of 1 mm diameter. Subsequently, the mixture MR was filtered through a 5-μm filter to obtain a red coloring material R-1.

In the mixture MR, Irgaphor Red B-CF (trade name; manufactured by BASF Corporation) was used as C.I. Pigment Red 254. Paliotol (registered trademark) Yellow L 2146HD (trade name; manufactured by BASF Corporation) was used as C.I. Pigment Yellow 139.

| Red pigment: C.I. Pigment Red 254 | 78 pts. wt |
| Yellow pigment: C.I. Pigment Yellow 139 | 22 pts. wt |
| Acrylic varnish (solid content 20%) | 215 pts. wt |

A green coloring material G-1 used in the photosensitive resin composition GR-1 was prepared in the same manner as the coloring material R-1 except that a mixture MG having the following composition was used instead of the mixture MG.

In the mixture MG, FASTOGEN (registered trademark) GREEN A110 (trade name; manufactured by DIC Corporation) was used as C.I. Pigment Green 58.

Paliotol (registered trademark) Yellow L1 155 (trade name; manufactured by BASF Corporation) was used as C.I. Pigment Yellow 185.

| (Composition of Mixture MG) | |
| --- | --- |
| Green pigment: C.I. Pigment Green 58 | 65 pts. wt |
| Yellow pigment: C.I. Pigment Yellow 185 | 35 pts. wt |
| Acrylic varnish (solid content 20%) | 215 pts. wt |

A blue coloring material B-1 used in the photosensitive resin composition BR-1 was prepared in the same manner as the coloring material R-1 except that a mixture MB having the following composition was used instead of the mixture MG.

In the mixture MB, LIONOL (registered trademark) BLUE ES (trade name; manufactured by TOYOCOLOR CO., LTD.) was used as C.I. Pigment Blue 15:6. LIONOGEN (registered trademark) VIOLET RLUE ES (trade name; manufactured by TOYOCOLOR CO., LTD.) was used as C.I. Pigment Violet 23.

| (Composition of Mixture MB) | |
| --- | --- |
| Blue pigment: C.I. Pigment Blue 15:6 | 63 pts. wt |
| Violet pigment: C.I. Pigment Violet 23 | 37 pts. wt |
| Acrylic varnish (solid content 20%) | 215 pts. wt |

The lenses 1 and the planarization layer 2 can be formed using a transparent material prepared by removing coloring materials from the photosensitive resin compositions RR-1, GR-1 and BR-1. For example, instead of the coloring materials, inorganic components such as silica, titanium oxide or zirconium oxide dispersion can be added as a refractive index modifier to modify the refractive index. By adjusting the type and content of the refractive index modifier, a refractive index in the range of 1.5 to 1.65, for example, can be obtained.

In Example 1, as the materials for the lenses 1 and the planarization layer 2, titanium oxide for modifying the refractive index to 1.6 was added to a transparent material containing no coloring materials for the photosensitive resin compositions RR-1, GR-1 and BR-1.

The organic EL display device 100 of Example 1 was manufactured as follows.

A transparent resin composition for forming a planarization film 4 was applied to the organic EL element substrate at a cured film thickness of 0.1 µm using a spinner. Then, the transparent resin composition was cured by heating at 100° C. for 10 minutes in a heating oven to form a planarization film 4. Thus, a main body 9 was formed.

A green photosensitive resin composition GR-1 was applied to the main body 9 at a cured film thickness of 1.2 µm using a spinner. Then, through steps of UV light exposure via a pattern mask, alkali development, washing with water, and drying, a second color layer 32 as a green sub-pixel was preliminary formed in the respective second sub-pixel regions P2. Each second color layer 32 had an x width×y width of 3 µm×9 µm. Then, the second color layer 32 preliminary formed was heated at 80° C. for 10 minutes using a heating oven.

Subsequently, a first color layer 31 was formed in the first sub-pixel regions P1 in the same manner as the second color layer 32 except that a red photosensitive resin composition RR-1 was used.

Further, a third color layer 33 was formed in the third sub-pixel regions P3 in the same manner as the second color layer 32 except that a blue photosensitive resin composition BR-1 was used.

Thus, a filter portion 3 was formed on the main body 9 of Example 1.

After the filter portion 3 was formed, a material for forming lenses 1 and a planarization layer 2 was applied to the filter portion 3 at a cured film thickness of 3 µm using a spinner. Then, the entire coating film was exposed to UV light, followed by heating at 80° C. for 10 minutes in a heating oven for curing the coating film to form a transparent resin layer.

Then, the surface of the transparent resin layer was etched by an etch-back method to form convex lenses 1 having a height of 1.5 µm and the x and y widths of 3 µm. Three lenses 1 were formed above each of the first color layer 31, the second color layer 32 and the third color layer 33.

Subsequently, a cover glass was bonded to a surface of the lenses 1 using Struct Bond (registered trademark) XMF-T107 (trade name; manufactured by Mitsui Chemicals, Inc.) as a sealant. Thus, an organic EL display device 100 of Example 1 was manufactured.

Example 2

Example 2 is an example corresponding to the third embodiment.

The unit pixel P10 of Example 2 had the same size as that of the unit pixel P. Each of the first sub-pixel region P11 and the second sub-pixel region P12 had the x width×y width of 4.5 µm×4.5 µm. The third sub-pixel region P13 had the x width×y width of 4.5 µm×9 µm.

As shown in Table 1, each of the first color layer 41 (sub-pixel R in Table 1) and the second color layer 42 (sub-pixel Gin Table 1) had the x width×y width of 4.5 µm×4.5 µm.

The third color layer 43 (sub-pixel B in Table 1) had the x width×y width of 4.5 µm×9 µm.

One lens 1 was provided facing for each of the first color layer 41 and the second color layer 42. Two lenses 1 were provided facing the third color layer 43. Each lens 1 had the x width×y width of 4.5 µm×4.5 µm.

The organic EL display device 100F of Example 2 was manufactured in the same manner as in Example 1 except that the size and arrangement of the sub-pixels and the lenses 1 were different.

Comparative Example 1

Comparative example 1 is an example of the organic EL display device 110 shown in FIGS. 6 and 7.

As shown in Table 1, the organic EL display device 110 of Comparative Example 1 was the same as the organic EL display device in Example 1 except that the lens 111 in plan view had the x width×y width of 3 µm×9 µm.

Comparative Example 2

As shown in Table 1, the organic EL display device of Comparative Example 2 was the same as the organic EL display device in Example 2 except that one lens having the x width×y width of 3 µm×9 µm was provided facing the third color layer 43.

<Evaluation>

The visibility evaluation for Examples 1 and 2 and Comparative Examples 1 and 2 was performed.

In this evaluation, the organic EL display devices of Examples 1 and 2 and Comparative Examples 1 and 2 were lit in white, observed from the front (z direction) and at oblique angles, and the visibility evaluation was performed based on the brightness by visual inspection.

The visibility from the front was determined by whether the screen was bright and easy to see.

When the screen was easy to see, it was rated as good (represented by A in Table 1), and when the screen was dark and difficult to see, it was rated as poor (represented by B in Table 1).

The visibility at oblique angles was determined based on changes in brightness when the observation angle was changed from 0° to 45° in a plane perpendicular to the x direction, in which the front was taken as 0°.

When the changes in brightness were in an acceptable range, it was rated as good (represented by A in Table 1), and when the changes in brightness were unacceptable, it was rated as poor (represented by B in Table 1).

<Evaluation Results>

As shown in Table 1, in Examples 1 and 2, both the visibility from the front and the visibility at oblique angles were good. Therefore, the organic EL display devices of Examples 1 and 2 had good visibility.

In Comparative Examples 1 and 2, both the visibility from the front and the visibility at oblique angles were poor.

Comparative Examples 1 and 2 had low front luminance and were difficult to see compared with Examples 1 and 2.

Further, when observed at oblique angles, changes in brightness depending on the observation angle were large compared with Examples 1 and 2.

The reason for this seems to be that the light condensing performance in the y direction is reduced due to elongated lenses being arranged in the y direction in Comparative Examples 1 and 2.

Next, Examples 3 and 4 and Comparative Examples 3 and 4 of the color filter and the display device according to the fourth embodiment will be described below. Table 3 below shows the configurations and evaluation results of Examples 3 and 4 and Comparative Examples 3 and 4.

centers of the respective sub-pixels in the x direction. The lenses 201 were arranged with a gap of 0.4 μm in the y direction.

Therefore, as shown in Table 3, the width L of each lens 201 in the x direction, which is the adjacent direction, was 2.0 μm, and the distance d between the lenses 201 was 0.4 μm.

The color filter 210 of Example 3 satisfied all the formulas (1) to (5) in the x direction.

For manufacturing an organic EL display device 200 of Example 3, a TFT layer was formed on a silicon substrate using a known method such as sputtering or etching. Further, a white organic EL element was formed on the TFT layer using a known method such as vapor deposition, and then silicon nitride was applied thereon by a CVD method. Thus, an organic EL element substrate was formed.

The silicon substrate and the white organic EL element correspond to the substrate 206 and the light emitting element 205, respectively.

For manufacturing a filter portion 203, red, green and blue photosensitive resin compositions of RR-1, GR-1 and BR-1 having the compositions shown in the above Table 2 were prepared.

The lenses 201 and the planarization layer 202 can be formed using a transparent material prepared by removing coloring materials from the photosensitive resin compositions RR-1, GR-1 and BR-1. For example, instead of the coloring materials, inorganic components such as silica, titanium oxide or zirconium oxide dispersion can be added as a refractive index modifier to modify the refractive index. By adjusting the type and content of the refractive index modifier, a refractive index in the range of 1.5 to 1.65, for example, can be obtained.

In Example 3, as the materials for the lenses 201 and the planarization layer 202, titanium oxide for modifying the refractive index to 1.6 was added to a transparent material

TABLE 3

|  | Example 3 | Example 4 | Comparative Example 3 | Comparative Example 4 |
| --- | --- | --- | --- | --- |
| Width of sub-pixel w (μm) | 2.4 | 2.4 | 2.4 | 2.4 |
| Thickness of sub-pixel t1 (μm) | 1.0 | 1.2 | 1.2 | 1.2 |
| Thickness of planarization layer t2 (μm) | 1.2 | 1.0 | 1.2 | 1.4 |
| Width of lens L (μm) | 2.0 | 2.0 | 2.4 | 2.0 |
| Distance between lenses d (μm) | 0.4 | 0.4 | 0 | 0.4 |
| Color reproducibility evaluation | A | A | B | B |

Example 3

Example 3 is an example corresponding to the fourth embodiment.

The unit pixel P in the organic EL display device 200 of Example 3 had a size of Wx=Wy=7.2 (μm), and each of the first sub-pixel region P201, the second sub-pixel region P202 and the third sub-pixel region P203 had the x width×y width of 2.4 μm×7.2 μm.

Each of the first color layer 231, the second color layer 232 and the third color layer 233 (hereinafter, referred to as a sub-pixel) had the x width×y width of 2.4 μm×7.2 μm.

A shown in Table 3, each width w in the adjacent direction was 2.4 μm. Each sub-pixel had a thickness t1 of 1.0 μm. The planarization layer 202 had a thickness t2 of 1.2 μm.

Three lenses 201 were provided facing each sub-pixel. Each lens 201 had the x width×y width of 2.0 μm×2.0 μm.

The lenses 201 were arranged with a gap of 0.4 μm in the x direction, and the optical axes thereof coincided with the containing no coloring materials for the photosensitive resin compositions RR-1, GR-1 and BR-1.

The organic EL display device 200 of Example 3 was manufactured as follows.

A transparent resin composition for forming a planarization film 204 was applied to the organic EL element substrate at a cured film thickness of 0.1 μm using a spinner. Then, the transparent resin composition was cured by heating at 100° C. for 10 minutes in a heating oven to form a planarization film 204. Thus, a main body 209 was formed.

A green photosensitive resin composition GR-1 was applied to the main body 209 at a cured film thickness of 1.2 μm using a spinner. Then, through steps of UV light exposure via a pattern mask, alkali development, washing with water, and drying, a second color layer 232 as a green sub-pixel was preliminary formed in the respective second sub-pixel regions P202. Each second color layer 232 had an x width×y width of 2.4 μm×7.2 μm. Then, the second color layer 232 preliminary formed was heated at 80° C. for 10 minutes using a heating oven.

Subsequently, a first color layer 231 was formed in the first sub-pixel regions P201 in the same manner as the second color layer 232 except that a red photosensitive resin composition RR-1 was used.

Further, a third color layer 233 was formed in the third sub-pixel regions P203 in the same manner as the second color layer 232 except that a blue photosensitive resin composition BR-1 was used.

Thus, a filter portion 203 was formed on the main body 209 of Example 3.

After the filter portion 203 was formed, a material for forming lenses 201 and a planarization layer 202 was applied to the filter portion 203 at a cured film thickness of 2.4 μm using a spinner. Then, the entire coating film was exposed to UV light, followed by heating at 80° C. for 10 minutes in a heating oven for curing the coating film to form a transparent resin layer.

Then, the surface of the transparent resin layer was etched by an etch-back method to form convex lenses 201 having a height of 1.2 μm and the x and y widths of 2.0 μm. Three lenses 201 were formed above each of the first color layer 231, the second color layer 232 and the third color layer 233.

Subsequently, a cover glass was bonded to a surface of the lenses 201 using Struct Bond (registered trademark) XMF-T107 (trade name; manufactured by Mitsui Chemicals, Inc.) as a sealant. Thus, an organic EL display device 200 of Example 3 was manufactured.

Example 4

Example 4 was the same as Example 3 except that the sub-pixel had a thickness t1 of 1.2 μm and the planarization layer had a thickness t2 of 1.0 μm.

The color filter 210 of Example 4 satisfied all the formulas (1) to (5) in the x direction.

Comparative Example 3

Comparative Example 3 had the same configuration as that of Example 3 except that the sub-pixel had a thickness t1 of 1.2 μm and the lens had the x width×y width of 2.4 μm×2.4 μm. Accordingly, in Comparative Example 3, T=t1+t2=2.4 (μm), w=2.4 (μm), L=2.4 (μm) and d=0 (μm).

Comparative Example 3 did not satisfy formulas (2) and (4).

Comparative Example 4

Comparative Example 4 had the same configuration as that of Example 3 except that the sub-pixel had a thickness t1 of 1.2 μm and the planarization layer had the thickness t2 of 1.4 μm. Accordingly, in Comparative Example 4, T=t1+t2=2.6 (μm), w=2.4 (μm), L=2.4 (μm) and d=0 (μm).

Comparative Example 4 did not satisfy formula (2).
<Evaluation>

The color reproducibility evaluation for Examples 3 and 4 and Comparative Examples 3 and 4 was performed.

In this evaluation, the organic EL display devices of Examples 3 and 4 and Comparative Examples 3 and 4 were lit in monochromatic red, green and blue, and the display color was observed from the front (z direction).

Further, in the organic EL display devices of Examples 3 and 4 and Comparative Examples 3 and 4, three types of monochromatic organic EL display devices (hereinafter, referred to as monochromatic devices) in which all the sub-pixels are red, green or blue were manufactured, and the display of each color was observed from the front. The monochromatic devices, in which all the light emitted from the light emitting elements passes through the sub-pixels of the same color, do not cause color mixing.

Then, the colors of monochromatic display in the organic EL display devices of Examples 3 and 4 and Comparative Examples 3 and 4 were compared with the display of the same color in the monochromatic devices.

When the color of monochromatic display appeared the same as the display color of the monochromatic device for the same color, it was determined that the color reproducibility was good (represented by A in Table 3).

When the color of monochromatic display appeared different from the display color of the monochromatic device for the same color, it was determined that the color reproducibility was poor (represented by B in Table 3).
<Evaluation Results>

As shown in Table 3, the color reproducibility was good in Examples 3 and 4. The reason for this seems to be that, in Examples 3 and 4, in which the color filter 210 satisfied all the formulas (1) to (5), most of light passing through the adjacent sub-pixel was externally emitted through the upper surface 202a, reducing the intensity of light directed to the front.

On the other hand, the color reproducibility was poor in Comparative Examples 3 and 4. The reason for this seems to be that, in Comparative Examples 3 and 4, in which some of formulas (1) to (5) were not satisfied, the intensity of light directed to the front increases since the light passing through the adjacent sub-pixel is directed to the front due to the light condensing effect of the lens that faces the adjacent sub-pixel.

Some preferred embodiments and modified examples of the present invention have been described with the examples. However, the present invention is not limited to these embodiments, modified examples and examples. Additions, omissions, substitutions, or any other changes in configurations may be made without departing from the spirit of the present invention.

Further, the present invention is not limited by the foregoing description, but is limited only by the accompanying claims.

For example, the light shielding wall in the second embodiment and the modified examples thereof may be provided in the color filter of the third embodiment.

The present application addresses the following. The conventional techniques described in the background section have problems as described below.

The lenses in PTLs 1 and 2 are provided in order to improve the front luminance of light from the light emitting elements.

In PTL 1, the front luminance is improved by condensing light that has been emitted from square organic EL elements and passed through the color filters. In PTL 1, three organic EL elements having a light emitting region of the same shape are arranged in a triangular pattern in each pixel region, and the color filters are also arranged in the same pattern. In addition, the lenses have a circular shape in plan view. Accordingly, in each pixel, gaps between the sub-pixels that form display light having the wavelength components of R, G and B increase in size. In this configuration, increasing the resolution makes the sub-pixels too small, and this makes it difficult to manufacture color filters and may hinder achievement of high resolution.

Further, in PTL 1, microlenses are disposed on the color filters composed of sub-pixels respectively producing display light having the wavelength components of red, green and blue, the color filters being provided on the unit pixel with a size of 12 μm×12 μm. Large gaps are provided between the sub-pixels to prevent color mixing from occurring. This decreases the aperture ratio of the color filters and hinders improvement in resolution.

In PTL 2, light emitted from a concave-shaped organic layer is condensed by an internal lens, transmitted through a color filter, and externally emitted through an on-chip microlens located at the outermost position.

In this configuration, increasing the resolution does not make the color filters too small, but makes the organic layers too small, which may hinder achievement of high luminance.

Further, a black matrix formed between the color filters also prevents light from the light emitting elements from being emitted from adjacent color filters.

In this case, although the front luminance can be improved and color mixing can be suppressed, manufacturing steps of forming the organic layer into a concave shape and forming a black matrix are required, which results in an increase in the manufacturing cost.

For example, one pixel region may be divided in one direction into three sub-pixels. For example, the organic EL elements, the color filters and the lenses may be respectively arranged in rectangular shapes that divide a pixel into three equal parts in one direction. In this case, the sub-pixels in plan view have an elongated rectangular shape whose length in the longitudinal direction is three times the width in the lateral direction.

Such a configuration is suitable for achieving high resolution since the sub-pixels can be arranged in the pixel region without a gap.

However, lenses elongated in one direction increase the anisotropy in refractive power required in the longitudinal direction and the lateral direction, and therefore microlenses having high light extraction efficiency cannot be produced. For example, since the radius of curvature in the longitudinal direction becomes too large compared with the radius of curvature in the lateral direction, the lens performance becomes similar to that of a cylindrical lens, resulting in a decrease in light condensing performance in the longitudinal direction. As a result, the front luminance is reduced and the visibility when viewed obliquely in the longitudinal direction tends to be reduced.

The present invention has an aspect to provide a color filter and a display device having improved front luminance and visibility even when the sub-pixels in the unit pixel region have a shape elongated in one direction, and having improved front luminance and color reproducibility even with a simple configuration.

A color filter according to a first aspect of the present invention includes: a plurality of sub-pixels having transmission wavelength ranges different from each other in a region constituting a unit pixel for color display; and a plurality of lenses facing respective ones of the plurality of sub-pixels, the plurality of lenses being configured to condense light passing through the plurality of sub-pixels, wherein at least one of the plurality of sub-pixels is an elongated pixel whose ratio of a length in a longitudinal direction to a length in a lateral direction is larger than 1 when viewed in a thickness direction in which the light passes through the sub-pixels, and at least two lenses configured to condense the light passing through the elongated pixel, among the plurality of lenses, are arranged in the longitudinal direction.

In the above color filter, the ratio may be 1.5 or more, and the number of the lenses facing the elongated pixel may be equal to the ratio rounded to a nearest whole number.

In the above color filter, the plurality of lenses may be densely arranged in the longitudinal direction.

In the above color filter, the plurality of sub-pixels may include three sub-pixels having different transmission wavelength ranges of red, green and blue, and all the three sub-pixels may be the elongated pixels, the three sub-pixels being arranged in parallel in the lateral direction and having the same length in the longitudinal direction.

In the above color filter, the plurality of sub-pixels may include: a first sub-pixel having a rectangular shape and having a first transmission wavelength range of one of red, green and blue; a second sub-pixel having a rectangular shape and having a second transmission wavelength range different from the first transmission wavelength range among the red, the green and the blue; and a third sub-pixel which is the elongated pixel having the ratio larger than a ratio of a length in a longitudinal direction to a length in a lateral direction of each of the first sub-pixel and the second sub-pixel, the third sub-pixel having a third transmission wavelength range different from each of the first transmission wavelength range and the second transmission wavelength range among the red, the green and the blue, wherein the first sub-pixel and the second sub-pixel may be both adjacent to the third sub-pixel in the lateral direction of the third sub-pixel, and may be arranged adjacent to each other in the longitudinal direction of the third sub-pixel.

The above color filter may further include a light shielding wall disposed at least one of between adjacent sub-pixels among the plurality of sub-pixels and on a boundary between the adjacent sub-pixels.

A display device according to a second aspect of the present invention includes: the above color filter; and a plurality of light emitting elements facing respective ones of the plurality of sub-pixels.

In the above display device, the light emitting element may be an organic EL element.

In order to solve the above problems, a color filter according to a third aspect of the present invention includes: a first sub-pixel included in a plurality of sub-pixels constituting a first unit pixel in a color display, the first sub-pixel having a first transmission wavelength range; a first lens facing the first sub-pixel in a thickness direction of the first sub-pixel; a second sub-pixel included in a plurality of sub-pixels constituting the first unit pixel or a second unit pixel adjacent to the first unit pixel, the second sub-pixel having a thickness which is the same as that of the first sub-pixel and a second transmission wavelength range different from the first transmission wavelength range, and being disposed adjacent to the first sub-pixel; a second lens facing the second sub-pixel in a thickness direction of the second sub-pixel, the second lens being disposed adjacent to the first lens in an adjacent direction in which the second sub-pixel is adjacent to the first sub-pixel; and a planarization layer disposed between the first and second sub-pixels and the first and second lenses, wherein the following formulas (1) to (5) are satisfied:

<Math. 1>

$$T = t1 + t2 \tag{1}$$

$$w > T \tag{2}$$

$$d = 2 \times (w - T) \tag{3}$$

$$0.8 \times w \leq L < w \tag{4}$$

$$L = w - d \tag{5}$$

where t1 is a thickness of each of the first sub-pixel and the second sub-pixel, t2 is a thickness of the planarization layer, w is a width of each of the first sub-pixel and the second sub-pixel in the adjacent direction, L is a width of each of the first lens and the second lens in the adjacent direction, and d is a distance between the first lens and the second lens in the adjacent direction.

In the above color filter, the first unit pixel and the second unit pixel may respectively have transmission wavelength ranges of red, green and blue, which are different from each other, and may include three sub-pixels arranged in the same adjacent direction, the three sub-pixels may have the same length in a direction perpendicular to the adjacent direction, and, among the three sub-pixels, at least one set of the sub-pixels adjacent to each other may satisfy the formulas (1) to (5).

In the above color filter, the first unit pixel and the second unit pixel may include: a first color sub-pixel having a transmission wavelength range of a first color which is one of red, green and blue; a second color sub-pixel having a transmission wavelength range of a second color different from the first color among the red, the green and the blue; and a third color sub-pixel having a transmission wavelength range of a third color different from the first color and the second color among the red, the green and the blue, the third color sub-pixel having a shape elongated in one direction, and the first color sub-pixel and the second color sub-pixel may be adjacent to each other in a longitudinal direction of the third color sub-pixel, and may be both adjacent to the third color sub-pixel in a lateral direction perpendicular to the longitudinal direction of the third color sub-pixel, and, among the first color sub-pixel, the second color sub-pixel and the third color sub-pixel, at least one set of the sub-pixels adjacent to each other may satisfy the formulas (1) to (5).

A display device according to a fourth aspect of the present invention includes: the above color filter; and a plurality of light emitting elements facing respective ones of the plurality of sub-pixels constituting the first and/or second unit pixel.

In the above display device, the light emitting element may be an organic EL element.

According to the color filter and the display device as an embodiment of the present invention, even when the sub-pixels in the unit pixel region have a shape elongated in one direction, the front luminance and visibility are improved. Further, even with a simple configuration, the front luminance and color reproducibility are improved.

REFERENCE SIGNS LIST 1, 201, 201B . . . Lens
1a, 201a, 201a1, 201a1B, 201a2, 201a2B . . . Convex lens surface
2, 2C, 2E, 202, 202A . . . Planarization layer
202a . . . Upper surface
3, 3A, 3B, 3C, 3D, 13, 203, 213 . . . Filter portion
4, 204 . . . Planarization film
5, 15, 15A, 15B, 205, 215, 215A, 215B . . . Light emitting element
6, 206 . . . Substrate
7A, 7B, 7C, 7D, 7E . . . Light shielding wall
9, 19, 209, 219 . . . Main body
10, 10A, 10B, 10C, 10D, 10E, 10F, 210, 211 . . . Color filter
31, 231, 241 . . . First color layer (Sub-pixel, Elongated pixel)
32, 232, 242 . . . Second color layer (Sub-pixel, Elongated pixel)
33, 233 . . . Third color layer (Sub-pixel, Elongated pixel)
41 . . . First color layer (Sub-pixel, First sub-pixel)
42 . . . Second color layer (Sub-pixel, Second sub-pixel)
43 . . . Third color layer (Sub-pixel, Elongated pixel, Third sub-pixel)
100, 100A, 100B, 100C, 100D, 100E, 100F, 200, 200D . . . Organic EL display device (Display device)
F . . . Flat portion
O . . . Optical axis
P, P10, P210 . . . Unit pixel
P1, P11, P201, P211 . . . First sub-pixel region
P2, P12, P202, P212 . . . Second sub-pixel region
P3, P13, P203, P213 . . . Third sub-pixel region Obviously, numerous modifications and variations of the present invention are possible in light of the above teachings. It is therefore to be understood that within the scope of the appended claims, the invention may be practiced otherwise than as specifically described herein.

What is claimed is:

1. A color filter, comprising:
 a plurality of sub-pixels having transmission wavelength ranges different from each other in a region forming a unit pixel for color display; and
 a plurality of lenses, each facing a sub-pixel and configured to condense light passing through the sub-pixel,
 wherein at least one of the sub-pixels is an elongated pixel whose ratio of a length in a longitudinal direction to a length in a lateral direction is larger than 1 when viewed in a thickness direction in which the light passes through the sub-pixels,
 the plurality of lenses includes a sub-group of lenses comprising at least two lenses each facing the elongated pixel and configured to condense the light passing through the elongated pixel, and
 the sub-group of lenses includes at least two lenses arranged along the longitudinal direction of the elongated pixel.

2. The color filter according to claim 1, wherein the ratio is 1.5 or more, and
 a number of the lenses arranged along the longitudinal direction of the elongated pixel is equal to the ratio rounded to a nearest whole number.

3. The color filter according to claim 1, wherein the lenses are positioned in contact with each other in the longitudinal direction.

4. The color filter according to claim 1, wherein the sub-pixels include three sub-pixels having different transmission wavelength ranges of red, green and blue, and
 the three sub-pixels are the elongated pixels positioned in parallel in the lateral direction and have the same length in the longitudinal direction.

5. The color filter according to claim 1, wherein the sub-pixels include
 a first sub-pixel having a rectangular shape and having a first transmission wavelength range of one of red, green and blue,
 a second sub-pixel having a rectangular shape and having a second transmission wavelength range different from the first transmission wavelength range among the red, the green and the blue, and
 a third sub-pixel which is the elongated pixel having the ratio larger than a ratio of a length in a longitudinal direction to a length in a lateral direction of each of the first sub-pixel and the second sub-pixel, the third sub-pixel having a third transmission wavelength range different from each of the first transmission wavelength range and the second transmission wavelength range among the red, the green and the blue, and the first sub-pixel and the second sub-pixel are both adjacent to the third sub-pixel in the lateral direction of the third sub-pixel, and are positioned adjacent to each other in the longitudinal direction of the third sub-pixel.

6. The color filter according to claim 1, further comprising:

a light shielding wall positioned at least one of between adjacent sub-pixels among the sub-pixels and on a boundary between the adjacent sub-pixels.

7. A display device, comprising:
the color filter of claim 1; and
a plurality of light emitting elements facing respective ones of the sub-pixels.

8. The display device according to claim 7, wherein the light emitting element is an organic EL element.

9. A color filter, comprising:
a first sub-pixel included in a plurality of sub-pixels forming a first unit pixel in a color display, the first sub-pixel having a first transmission wavelength range;
a first lens facing the first sub-pixel in a thickness direction of the first sub-pixel;
a second sub-pixel included in a plurality of sub-pixels forming the first unit pixel or a second unit pixel adjacent to the first unit pixel, the second sub-pixel having a thickness which is the same as a thickness of the first sub-pixel and a second transmission wavelength range different from the first transmission wavelength range, and being positioned adjacent to the first sub-pixel;
a second lens facing the second sub-pixel in a thickness direction of the second sub-pixel, the second lens being positioned adjacent to the first lens in an adjacent direction in which the second sub-pixel is adjacent to the first sub-pixel; and
a planarization layer formed between the first and second sub-pixels and the first and second lenses,
wherein formulas (1) to (5) are satisfied:

$$T = t1 + t2 \quad (1)$$

$$w > T \quad (2)$$

$$d = 2 \times (w - T) \quad (3)$$

$$0.8 \times w \leq L < w \quad (4)$$

$$L = w - d \quad (5)$$

where t1 is a thickness of each of the first sub-pixel and the second sub-pixel, t2 is a thickness of the planarization layer, w is a width of each of the first sub-pixel and the second sub-pixel in the adjacent direction, L is a width of each of the first lens and the second lens in the adjacent direction, and d is a distance between the first lens and the second lens in the adjacent direction.

10. The color filter according to claim 9, wherein the first unit pixel and the second unit pixel respectively have transmission wavelength ranges of red, green and blue, which are different from each other, and include three sub-pixels formed in the same adjacent direction, the three sub-pixels have the same length in a direction perpendicular to the adjacent direction, and among the three sub-pixels, at least one set of the sub-pixels adjacent to each other satisfies the formulas (1) to (5).

11. The color filter according to claim 9, wherein the first unit pixel and the second unit pixel include a first color sub-pixel having a transmission wavelength range of a first color which is one of red, green and blue, a second color sub-pixel having a transmission wavelength range of a second color different from the first color among the red, the green and the blue, and a third color sub-pixel having a transmission wavelength range of a third color different from the first color and the second color among the red, the green and the blue, the third color sub-pixel having a shape elongated in one direction, the first color sub-pixel and the second color sub-pixel are adjacent to each other in a longitudinal direction of the third color sub-pixel, and are both adjacent to the third color sub-pixel in a lateral direction perpendicular to the longitudinal direction of the third color sub-pixel, and among the first color sub-pixel, the second color sub-pixel and the third color sub-pixel, at least one set of the sub-pixels adjacent to each other satisfies the formulas (1) to (5).

12. A display device, comprising:
the color filter of claim 9; and
a plurality of light emitting elements facing respective ones of the sub-pixels forming at least one of the first unit pixel and the second unit pixel.

13. The display device according to claim 12, wherein the light emitting element is an organic EL element.

* * * * *